United States Patent
Yamazaki et al.

(10) Patent No.: US 7,504,327 B2
(45) Date of Patent: Mar. 17, 2009

(54) METHOD OF MANUFACTURING THIN FILM SEMICONDUCTOR DEVICE

(75) Inventors: Shunpei Yamazaki, Tokyo (JP); Atsuo Isobe, Kanagawa (JP); Tetsuji Yamaguchi, Kanagawa (JP); Hiromichi Godo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 336 days.

(21) Appl. No.: 11/148,426

(22) Filed: Jun. 9, 2005

(65) Prior Publication Data

US 2005/0274952 A1 Dec. 15, 2005

(30) Foreign Application Priority Data

Jun. 14, 2004 (JP) ............................. 2004-176231

(51) Int. Cl.
- H01L 21/425 (2006.01)
- H01L 21/00 (2006.01)
- H01L 21/84 (2006.01)
- H01L 21/8238 (2006.01)
- H01L 21/336 (2006.01)

(52) U.S. Cl. .................... 438/525; 438/163; 438/217; 438/289

(58) Field of Classification Search ................ 438/525, 438/217, 289, 163
See application file for complete search history.

(56) References Cited

U.S. PATENT DOCUMENTS

| | | | |
|---|---|---|---|
| 4,769,686 A | 9/1988 | Horiuchi et al. | |
| 5,258,319 A * | 11/1993 | Inuishi et al. | 438/286 |
| 5,424,244 A | 6/1995 | Zhang et al. | |
| 5,459,090 A | 10/1995 | Yamazaki et al. | |
| 5,510,279 A * | 4/1996 | Chien et al. | 438/302 |
| 5,576,556 A | 11/1996 | Takemura et al. | |
| 5,592,008 A | 1/1997 | Yamazaki et al. | |
| 5,650,340 A | 7/1997 | Burr et al. | |
| 5,767,930 A | 6/1998 | Kobayashi et al. | |
| 5,811,338 A | 9/1998 | Kao et al. | |
| 5,849,043 A | 12/1998 | Zhang et al. | |
| 5,892,235 A | 4/1999 | Yamazaki et al. | |
| 5,926,712 A * | 7/1999 | Chen et al. | 438/291 |
| 5,985,701 A | 11/1999 | Takei et al. | |
| 6,011,607 A | 1/2000 | Yamazaki et al. | |
| 6,017,783 A | 1/2000 | Yamazaki et al. | |
| 6,083,794 A | 7/2000 | Hook et al. | |

(Continued)

FOREIGN PATENT DOCUMENTS

JP 09-27624 1/1997

(Continued)

*Primary Examiner*—Shouxiang Hu
(74) *Attorney, Agent, or Firm*—Eric J. Robinson; Robinson Intellectual Property Law Office, P.C.

(57) ABSTRACT

In the invention, a low concentration impurity region is formed between a channel formation region and a source region or a drain region in a semiconductor layer and covered with a gate electrode layer in a thin film transistor The semiconductor layer is doped obliquely to the surface thereof using the gate electrode layer as a mask to form the low concentration impurity region. The semiconductor layer is formed to have an impurity region including an impurity element for imparting one conductivity which is different from conductivity of the thin film transistor, thereby being able to minutely control the properties of the thin film transistor.

22 Claims, 32 Drawing Sheets

U.S. PATENT DOCUMENTS

| | | |
|---|---|---|
| 6,180,982 B1 | 1/2001 | Zhang et al. |
| 6,251,712 B1 | 6/2001 | Tanaka et al. |
| 6,291,325 B1 | 9/2001 | Hsu |
| 6,355,942 B1 | 3/2002 | Yamazaki et al. |
| 6,358,784 B1 | 3/2002 | Zhang et al. |
| 6,384,427 B1 | 5/2002 | Yamazaki et al. |
| 6,479,838 B2 * | 11/2002 | Morosawa .................. 257/72 |
| 6,486,014 B1 | 11/2002 | Miyanaga et al. |
| 6,489,952 B1 | 12/2002 | Tanaka et al. |
| 6,498,060 B2 | 12/2002 | Zhang et al. |
| 6,507,069 B1 | 1/2003 | Zhang et al. |
| 6,518,102 B1 | 2/2003 | Tanaka et al. |
| 6,534,373 B1 | 3/2003 | Yu |
| 6,555,843 B1 | 4/2003 | Yamazaki et al. |
| 6,608,324 B1 | 8/2003 | Yamazaki et al. |
| 6,624,013 B2 | 9/2003 | Kawasaki et al. |
| 6,624,455 B2 | 9/2003 | Miyanaga et al. |
| 6,635,505 B2 | 10/2003 | Tanaka et al. |
| 6,655,767 B2 | 12/2003 | Zhang et al. |
| 6,667,512 B1 * | 12/2003 | Huster et al. ................ 257/328 |
| 6,703,643 B2 | 3/2004 | Yamazaki et al. |
| 6,734,446 B1 | 5/2004 | Yamazaki et al. |
| 6,747,325 B2 | 6/2004 | Shih |
| 6,773,971 B1 | 8/2004 | Zhang et al. |
| 6,831,333 B2 | 12/2004 | Zhang et al. |
| 6,855,580 B2 | 2/2005 | Tanaka et al. |
| 6,897,526 B1 | 5/2005 | Miyanaga et al. |
| 2003/0010980 A1 * | 1/2003 | Yamazaki et al. ............. 257/65 |
| 2003/0122131 A1 | 7/2003 | Zhang et al. |
| 2003/0235971 A1 * | 12/2003 | Yamazaki et al. .......... 438/487 |
| 2004/0115940 A1 | 6/2004 | Zhang et al. |
| 2005/0017246 A1 | 1/2005 | Sekiguchi et al. |
| 2006/0071210 A1 | 4/2006 | Yamazaki et al. |
| 2007/0063147 A1 | 3/2007 | Yamazaki et al. |

FOREIGN PATENT DOCUMENTS

| | | |
|---|---|---|
| JP | 10-162770 | 6/1998 |
| JP | 2001-210605 | 8/2001 |

* cited by examiner

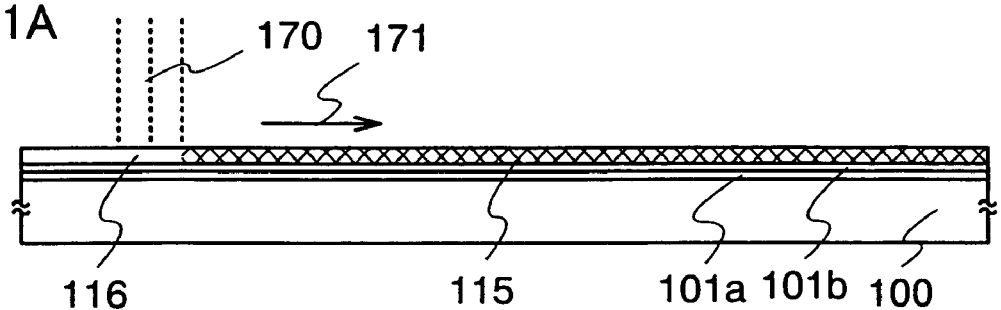
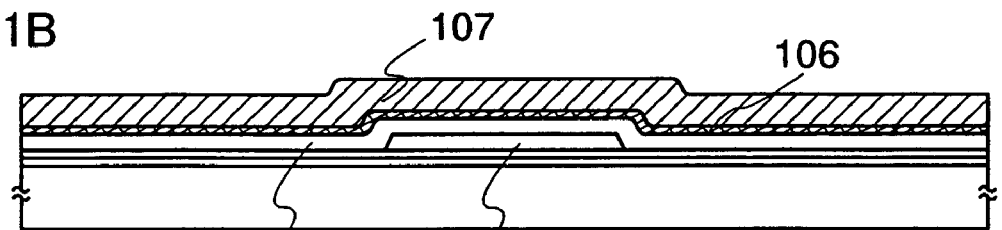
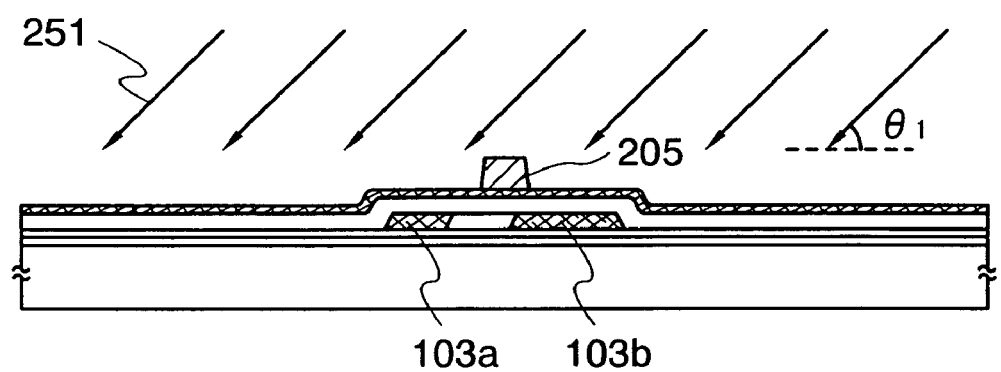
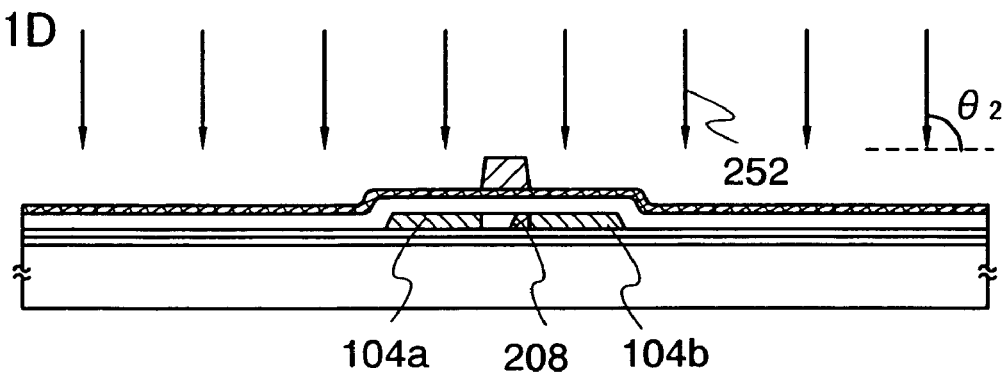
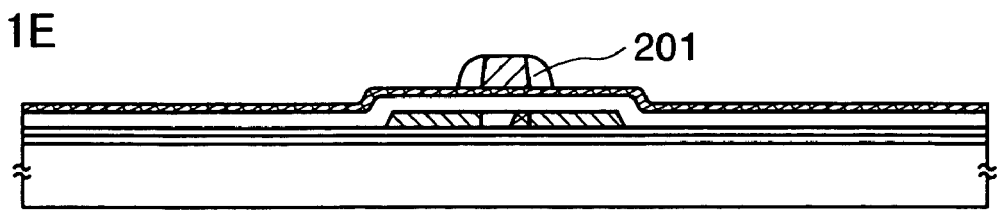

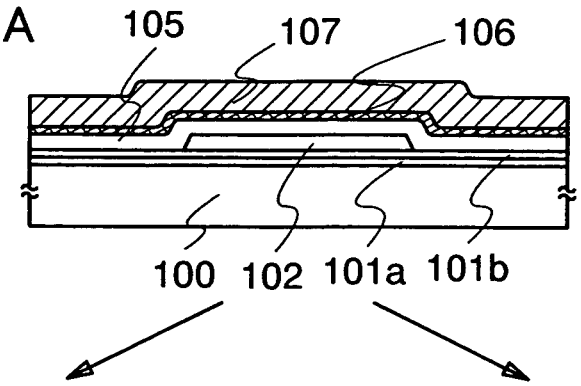
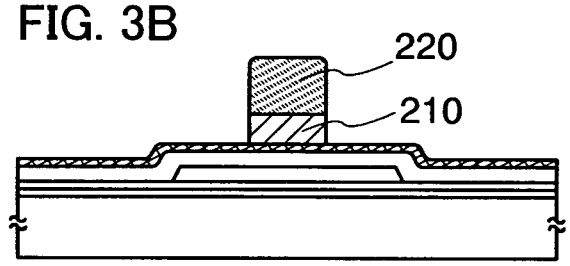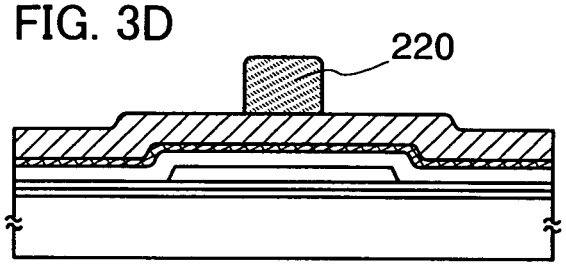
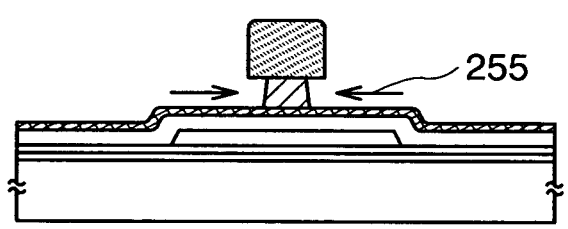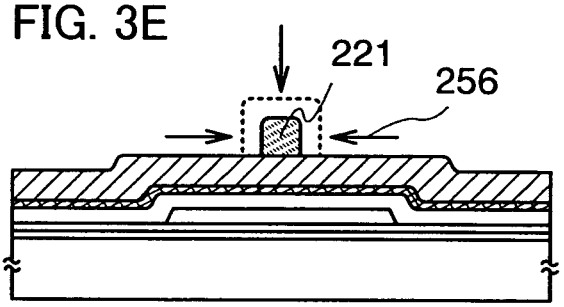
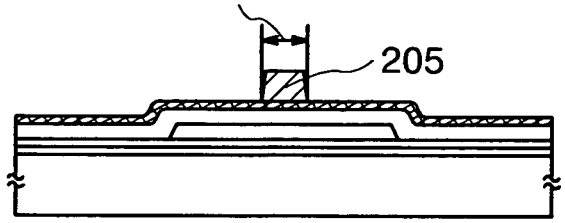

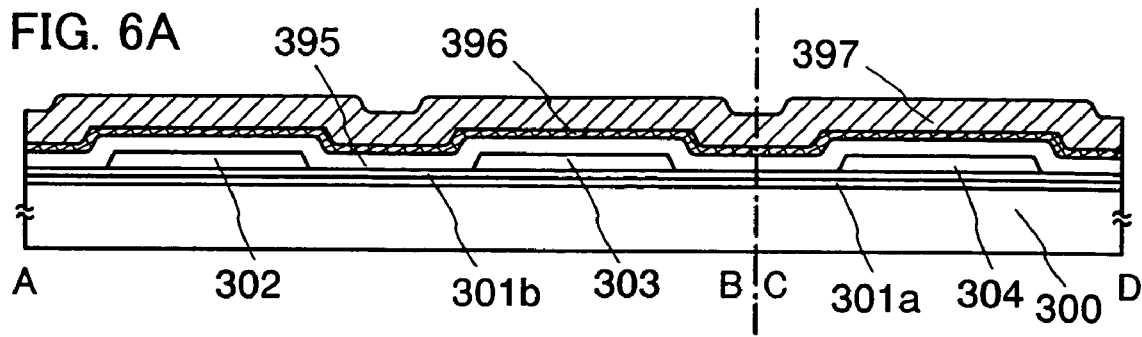
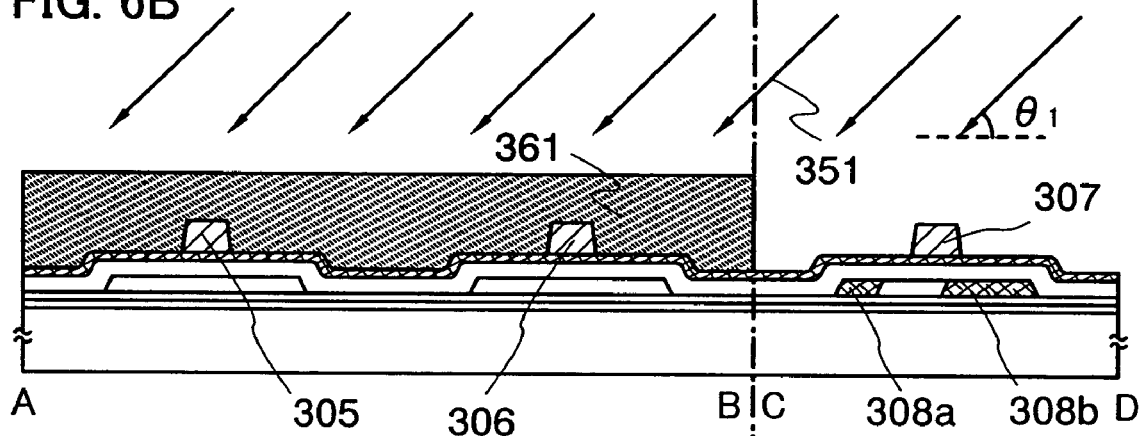
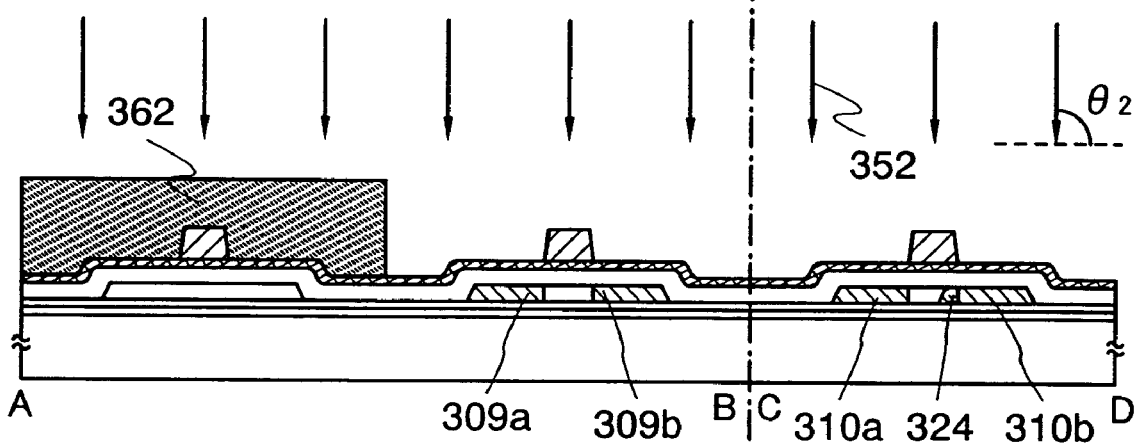
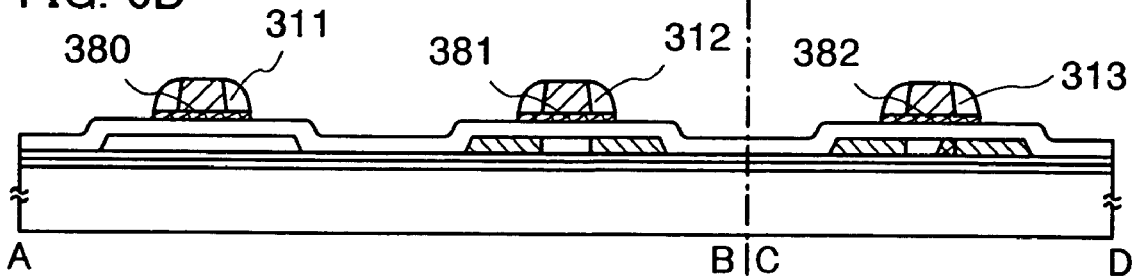

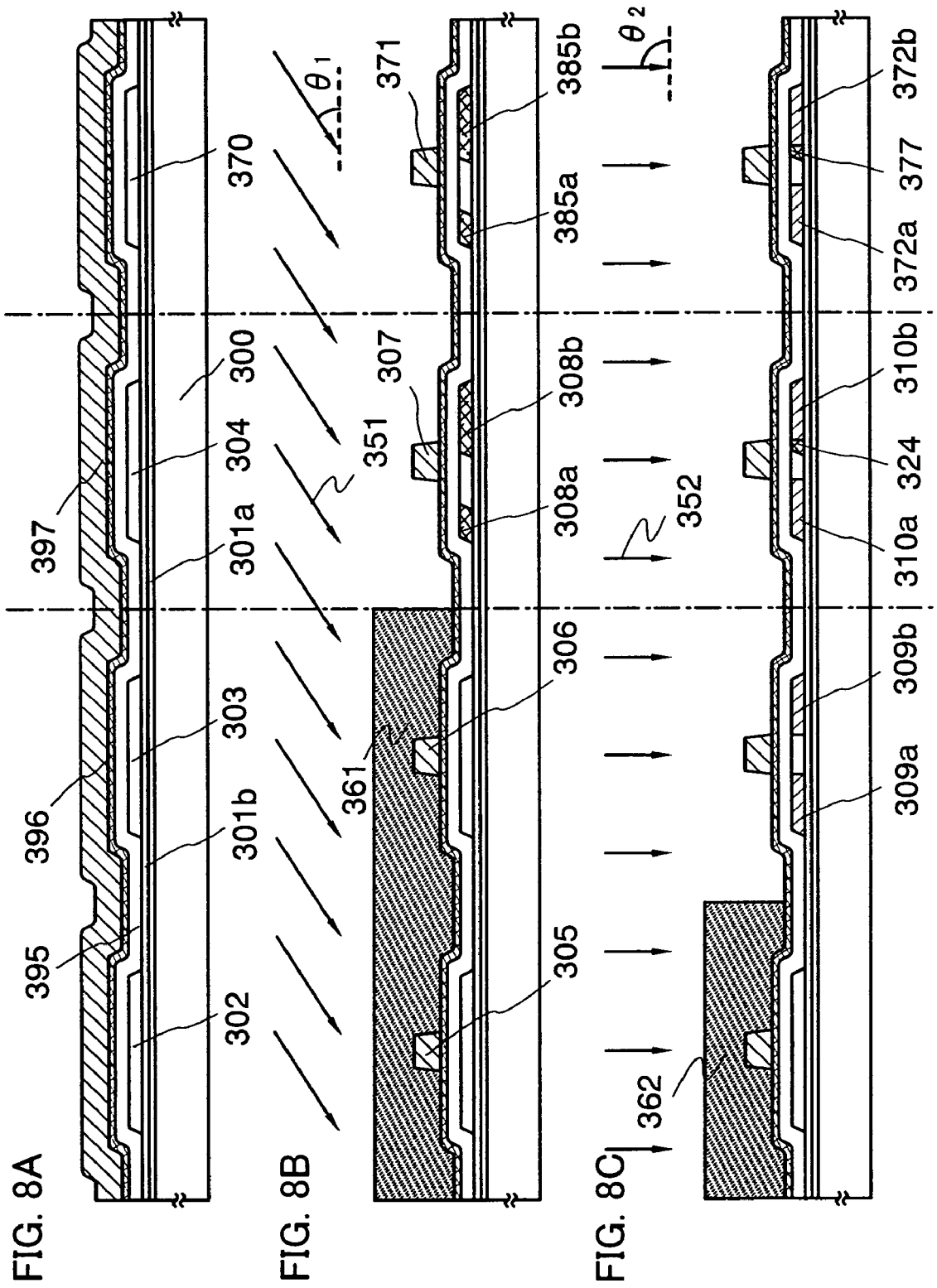

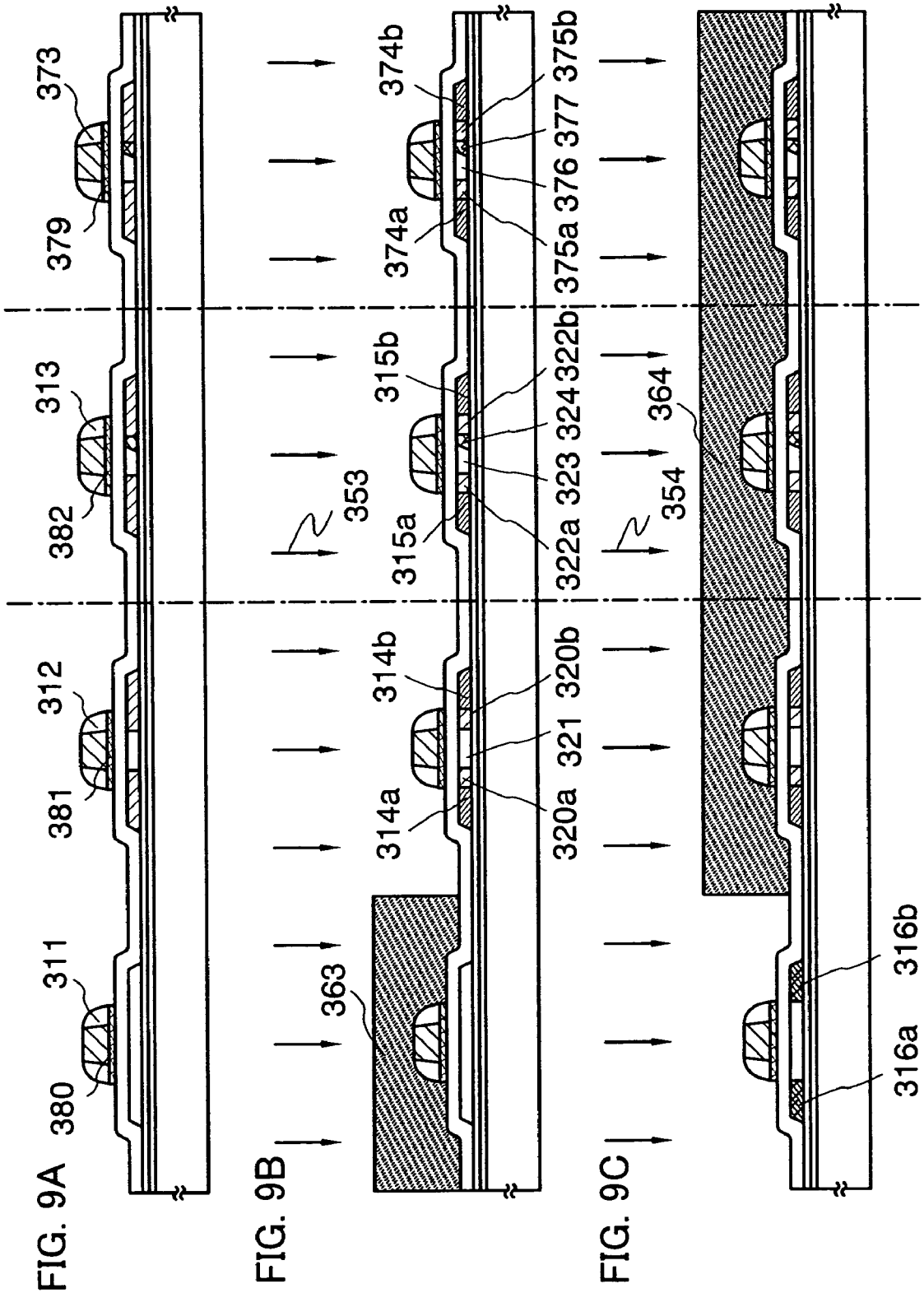

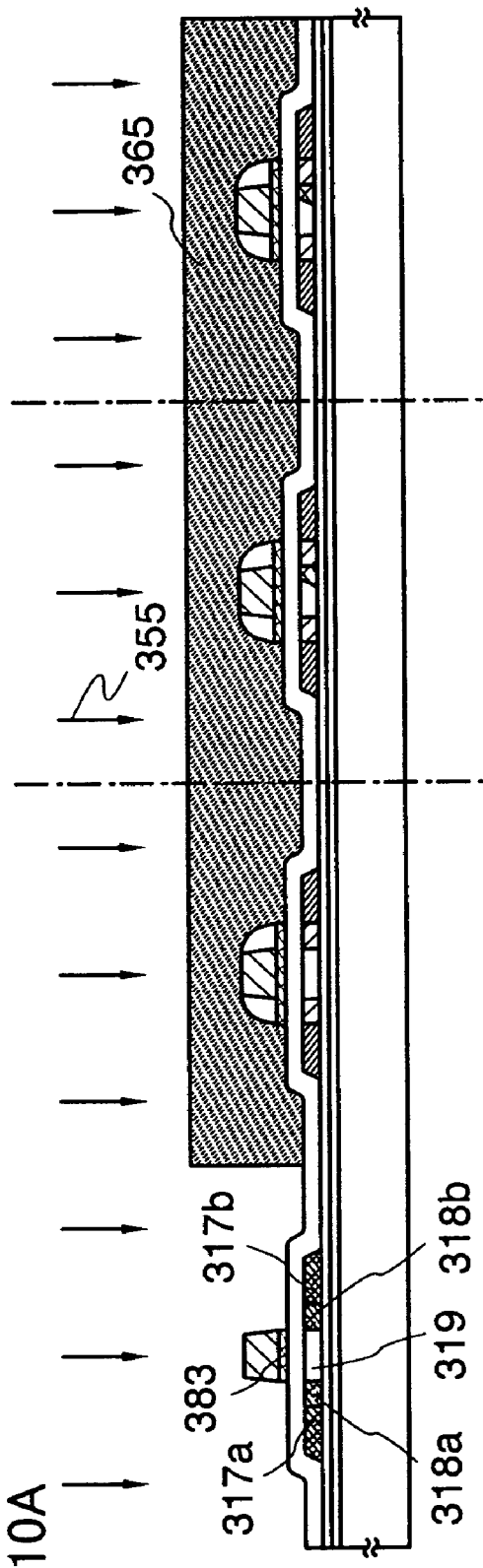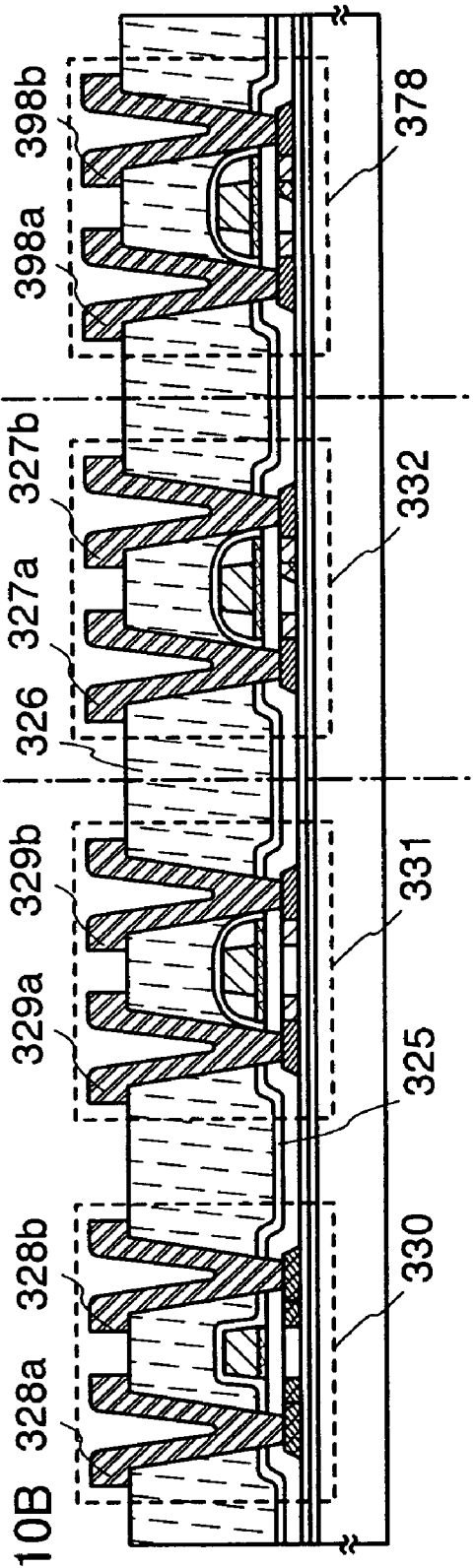

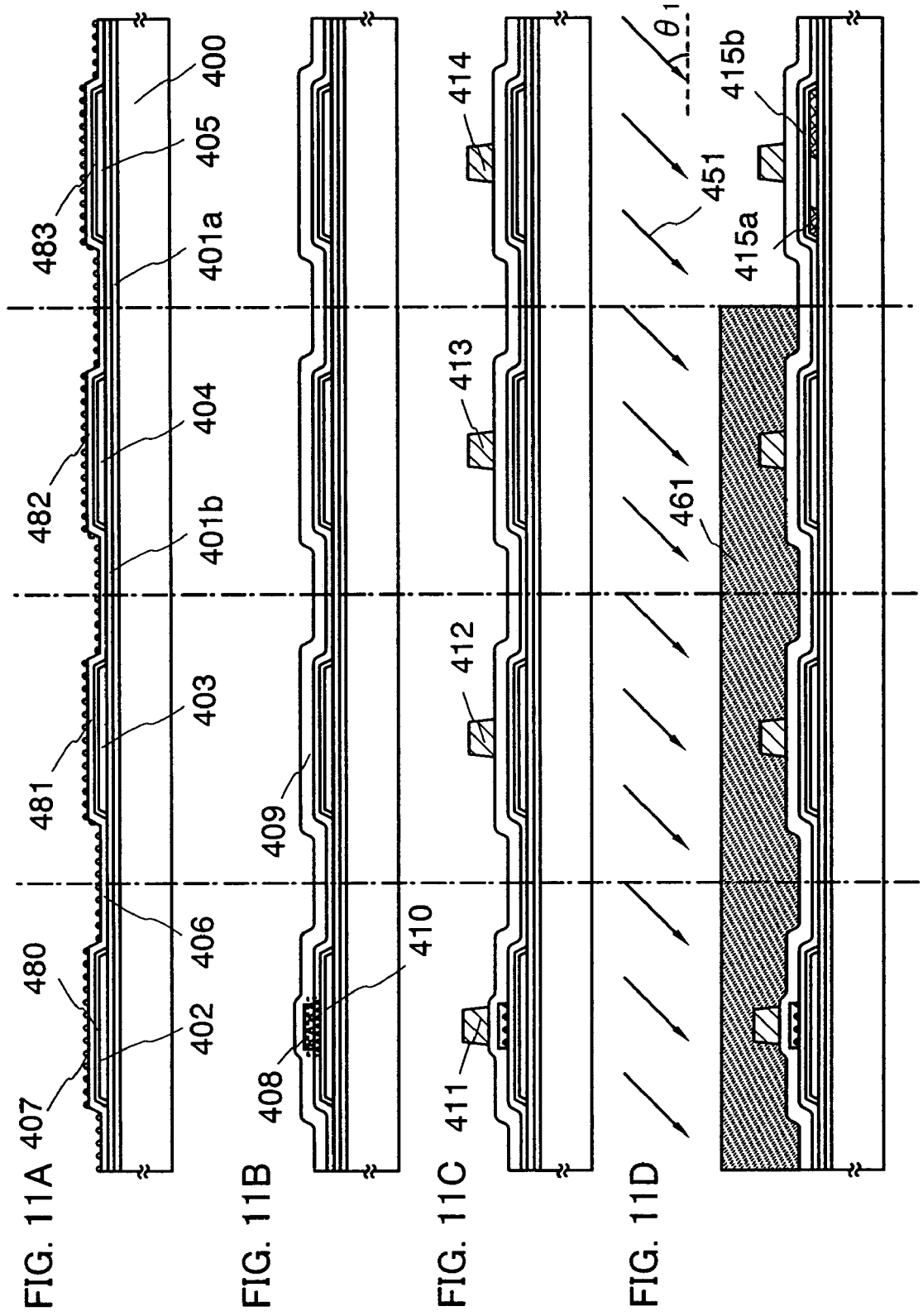

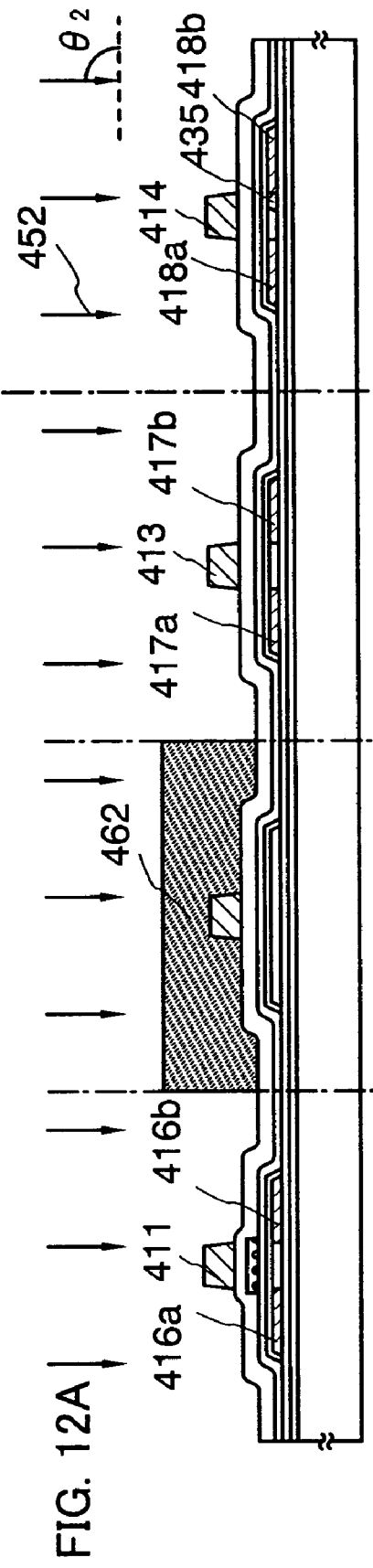
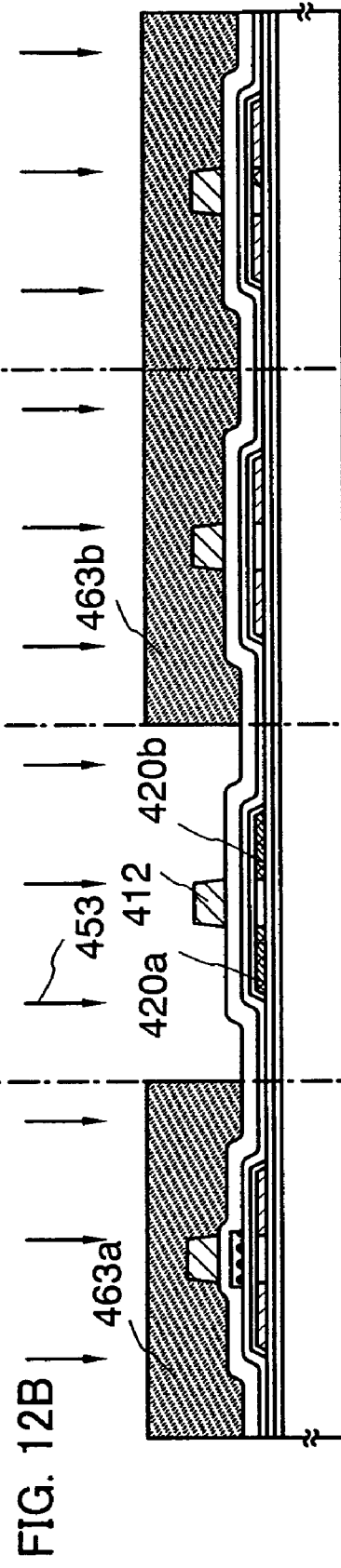
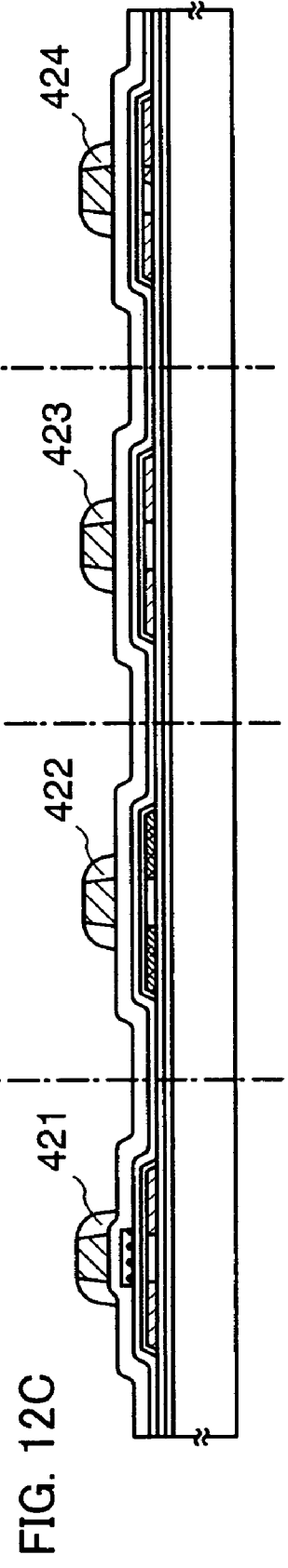

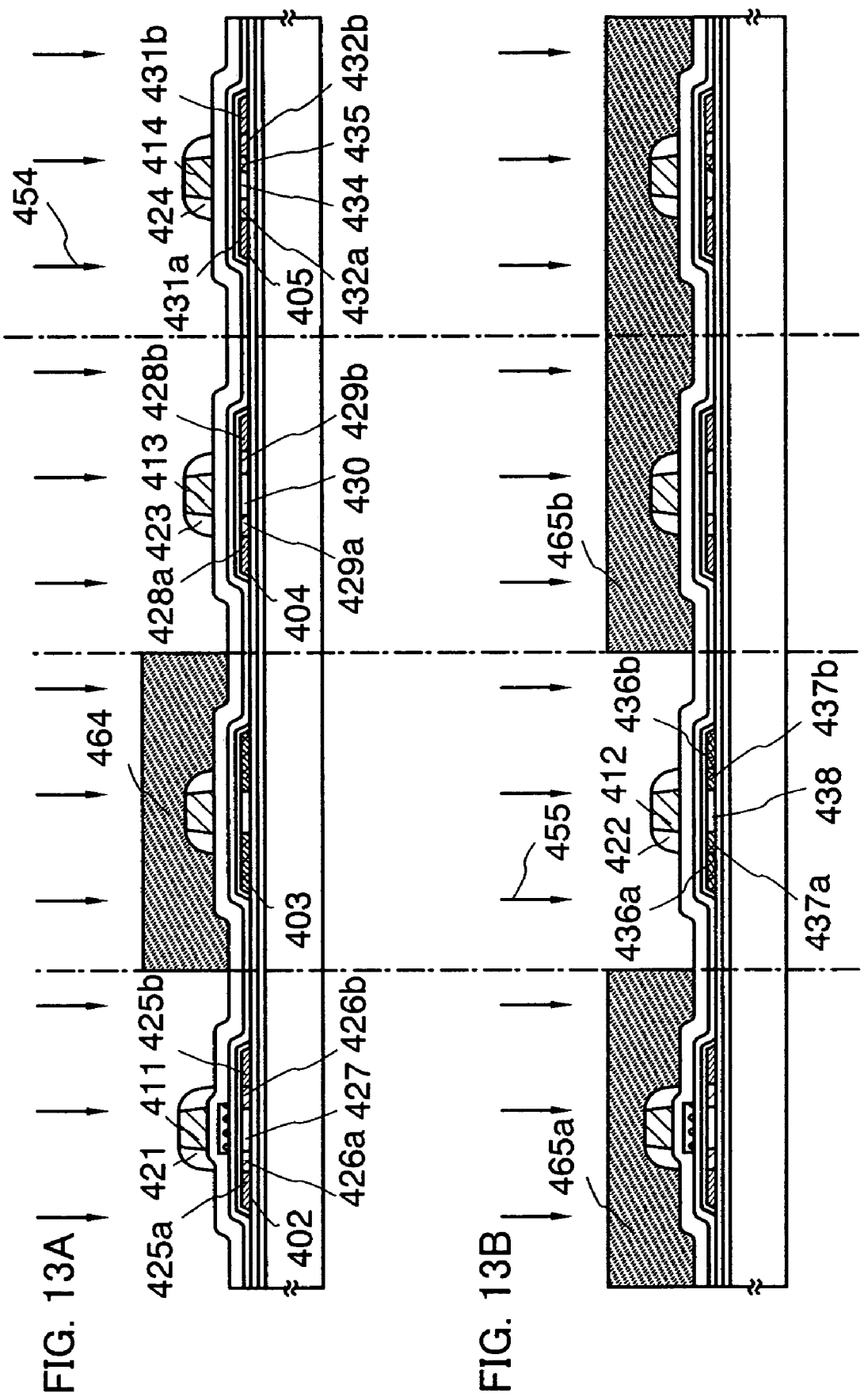

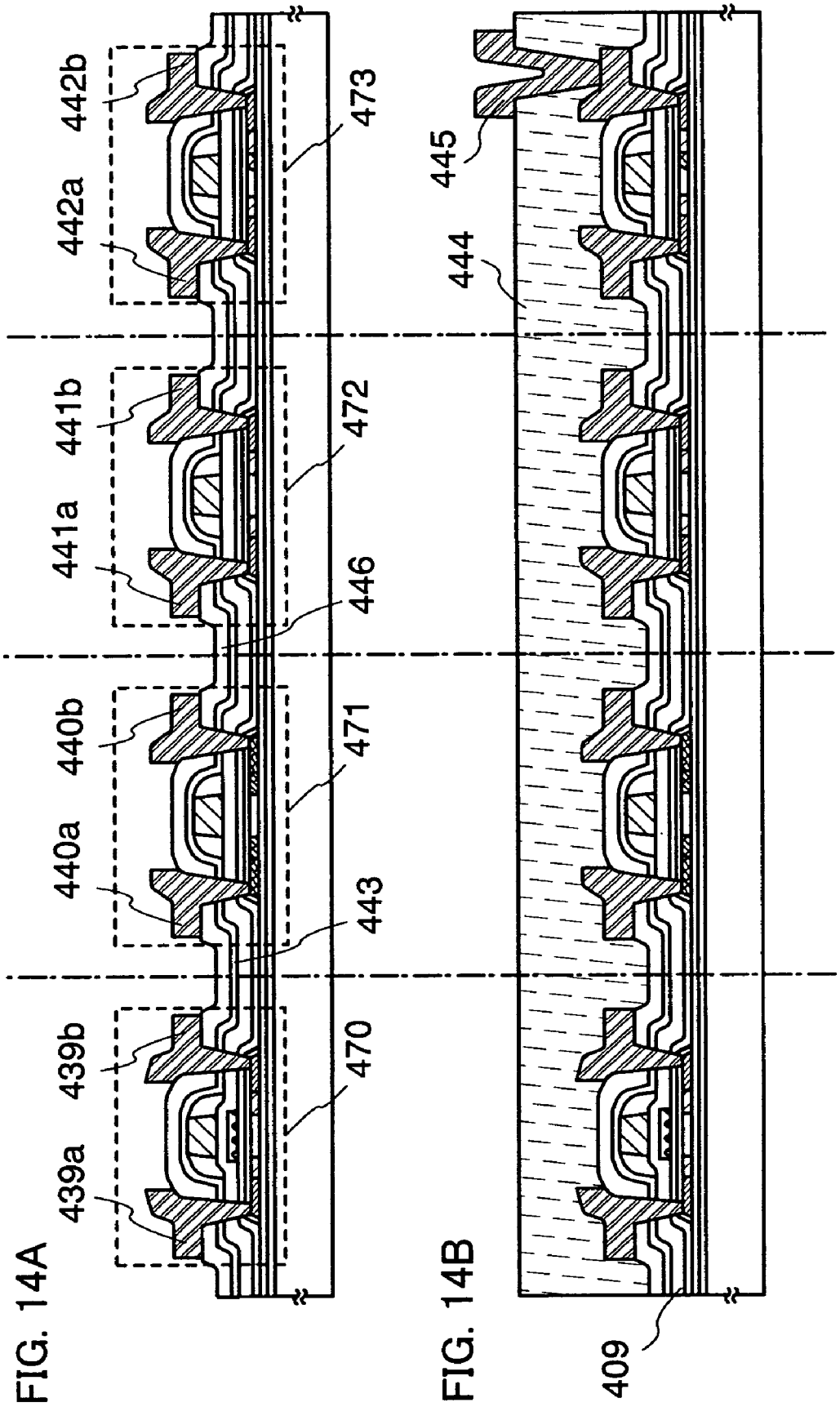

FIG. 21A
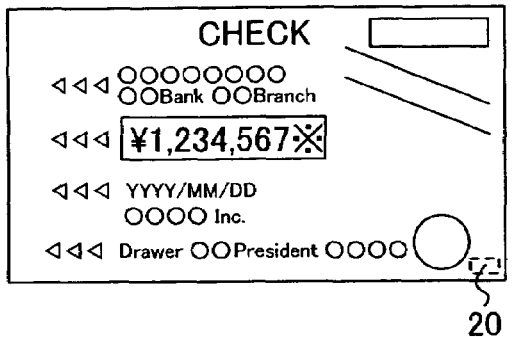
FIG. 21B
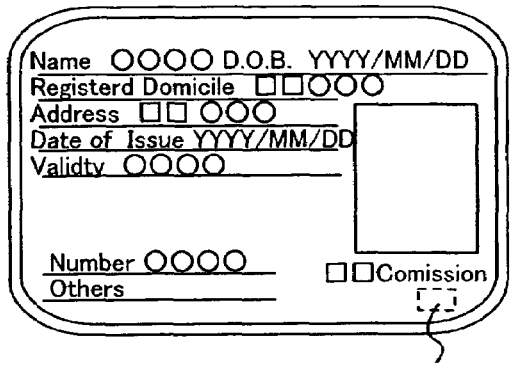
FIG. 21C
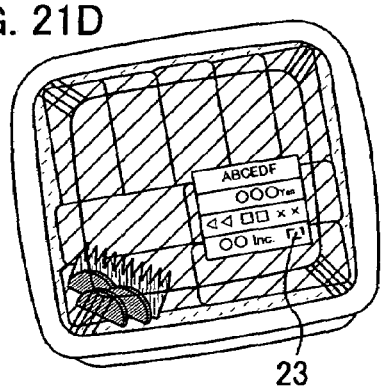
FIG. 21D
FIG. 21E
FIG. 21F
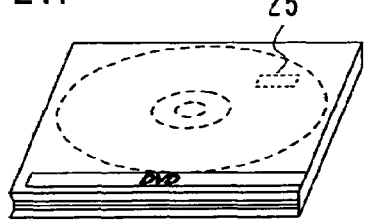
FIG. 21G
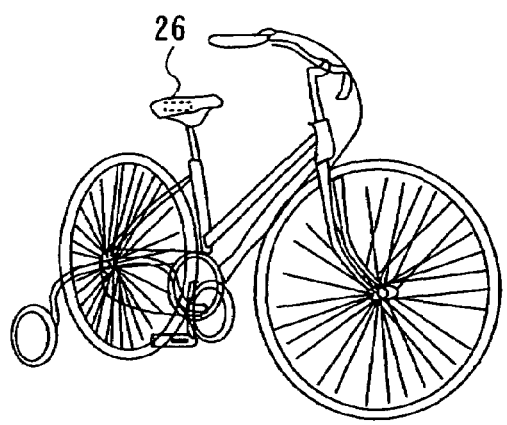
FIG. 21H
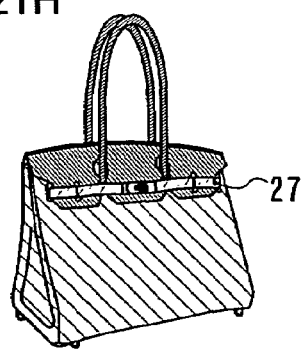

FIG. 24A
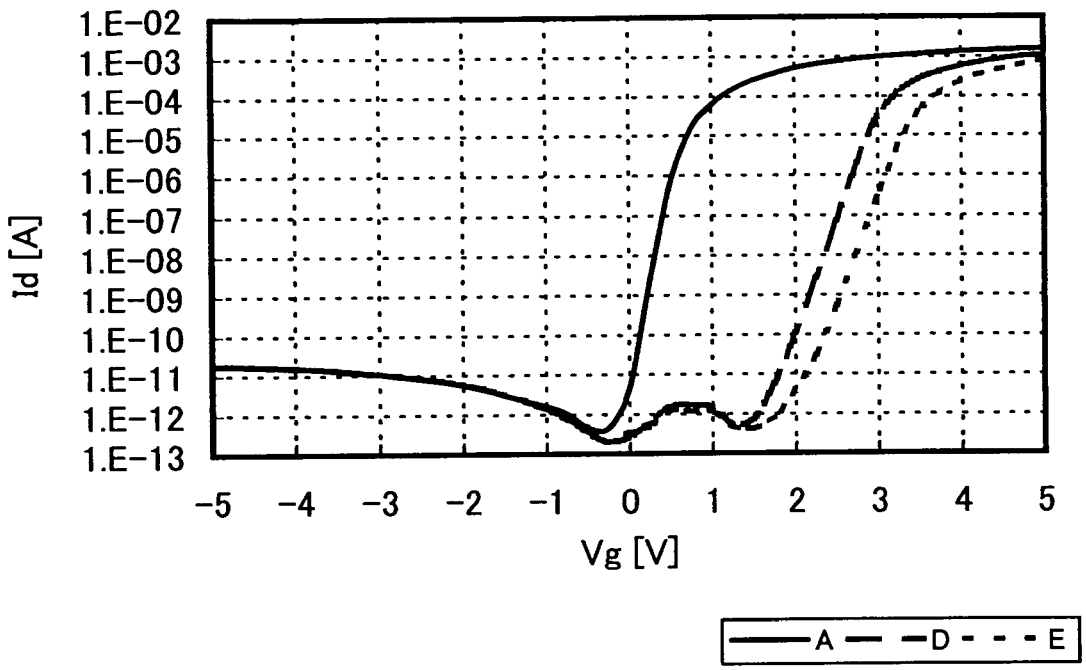
FIG. 24B
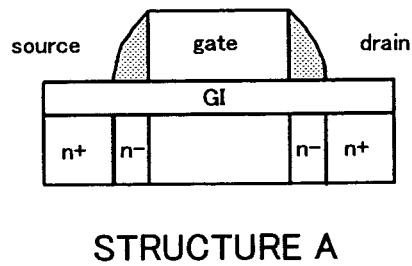
STRUCTURE A
L/W = 1000/20000 nm
Width of Loff = 300 nm
Thickness of GI = 20 nm
n+  $1E+20$ $[1/cm^3]$
n−  $1E+18$ $[1/cm^3]$
p−  $1E+18$ $[1/cm^3]$
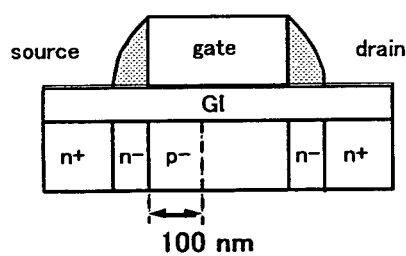
100 nm
STRUCTURE D
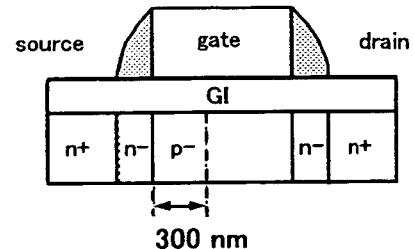
300 nm
STRUCTURE E

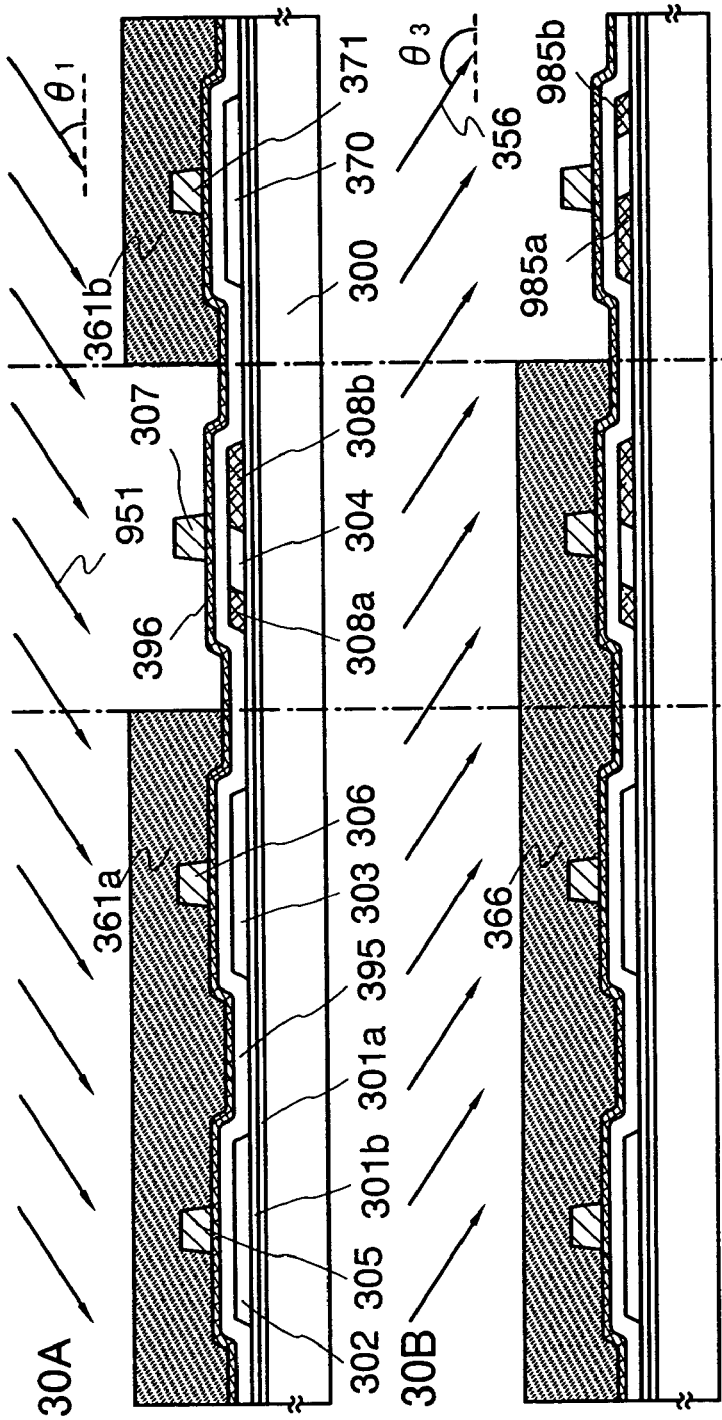

CHANNEL LENGTH DIRECTION

CHANNEL LENGTH DIRECTION

METHOD OF MANUFACTURING THIN FILM SEMICONDUCTOR DEVICE

BACKGROUND OF THE INVENTION

1. Field of the Invention

The present invention relates to a semiconductor device and the manufacturing method thereof.

2. Description of the Related Art

A thin film transistor used for a semiconductor device is required to have different properties according to the object and the function of the semiconductor device. It is important to control the properties of the thin film transistor to satisfy the requirement, and the technique for manufacturing the thin film transistor to have a property appropriate for the intended use has been researched (for example, refer to the patent document 1: Japanese Patent Laid-Open No. H9-27624).

In the patent document 1, a thin film transistor containing an impurity region having a lightly doped drain (LDD) structure is formed using a side wall, thereby making leak current small in OFF-state of a thin film transistor.

SUMMARY OF THE INVENTION

It is an object of the present invention to manufacture a thin film transistor having a required property without complicating steps and devices. It is another object of the invention to provide a technique for manufacturing a semiconductor device having high reliability and better electrical characteristics with a higher yield at lower cost.

In the invention, a low concentration impurity region is formed between a channel formation region and one of a source region and a drain region in a semiconductor layer and covered with a gate electrode layer in a thin film transistor. The semiconductor layer is doped obliquely to the surface thereof using the gate electrode layer as a mask to form the low concentration impurity region. The semiconductor layer is formed to have an impurity region including an impurity element for imparting a conductivity which is different from a conductivity of the thin film transistor, thereby making it possible to minutely control the properties of the thin film transistor. In addition, a semiconductor film is crystallized by laser irradiation and a crystal grain of a single crystal which is long extended along a scanning direction of laser light, thereby becoming it possible to form a semiconductor film at least having little crystal boundary which prevents carriers in the thin film transistor from moving.

Note that a semiconductor device in this specification means devices which can function by using properties of a semiconductor. The invention enables a semiconductor device of a multilayer wiring layer, an ID chip, or the like to be manufactured.

In addition, a display device can be manufactured using the invention. The display device which can adopt the invention includes a light emitting display device in which a light emitting element having a medium including an organic matter referred to as electroluminescence (hereinafter, also referred to as EL) for producing luminescence or a mixture of an organic matter and an inorganic matter, interposed between electrodes is connected to a TFT, a liquid crystal display device in which a liquid crystal element having a liquid crystal material is used as a display element, or the like.

One of semiconductor devices of the invention has a gate insulating layer over a semiconductor layer; the semiconductor layer has a channel formation region, a source region, a drain region formed in contact with the channel formation region, and an impurity region formed between the channel formation region and the source region; and a gate electrode layer is formed over the channel formation region and the impurity region with the gate insulating layer interposed therebetween.

One of semiconductor devices of the invention has a gate insulating layer over a semiconductor layer; the semiconductor layer has a channel formation region, a source region, a drain region formed in contact with the channel formation region, and an impurity region formed between the channel formation region and the drain region; and a gate electrode layer is formed over the channel formation region and the impurity region with the gate insulating layer interposed therebetween.

One of semiconductor devices of the invention has a gate insulating layer over a semiconductor layer; the semiconductor layer has a channel formation region, a source region, a drain region, a first impurity region formed between the channel formation region and the source region, a second impurity region formed between the source region and the first impurity region, and a third impurity region formed between the drain region and the channel formation region to be in contact with the channel formation region; and a gate electrode layer over the channel formation region and the first impurity region with the gate insulating layer interposed therebetween, wherein the second impurity region, the third impurity region, the source region, and the drain region have impurity elements for imparting one conductive type, and the concentration of the impurity elements for imparting one conductive type in the second impurity region and the third impurity region is lower than that of the impurity element for imparting one conductive type in the source region and the drain region.

One of semiconductor devices of the invention has a gate insulating layer over a semiconductor layer; the semiconductor layer has a channel formation region, a source region, a drain region, a first impurity region formed between the channel formation region and the drain region, a second impurity region formed between the source region and the channel formation region to be in contact with the channel formation region, and a third impurity region formed between the drain region and the first impurity region; and a gate electrode layer over the channel formation region and the first impurity region with the gate insulating layer interposed therebetween. The second impurity region, the third impurity region, the source region, and the drain region have an impurity element for imparting one conductive type, and the concentration of the impurity element for imparting one conductive type in the second impurity region and the third impurity region is lower than that of the impurity element for imparting one conductive type in the source region and the drain region.

One of semiconductor devices of the invention has a-gate insulating layer over a first semiconductor layer and a second semiconductor layer. The first semiconductor layer has a first channel formation region, a first source region, a first drain region formed in contact with the first channel formation region, and a first impurity region formed between the first channel formation region and the first source region, and the second semiconductor layer has a second channel formation region, a second source region formed in contact with the second channel formation region, a second drain region, and a second impurity region formed between the second channel formation region and the second drain region. The semiconductor device has a first gate electrode layer over the first channel formation region and the first impurity region with the gate insulating layer interposed therebetween and a second gate electrode layer over the second channel formation region and the second impurity region with the gate insulating layer interposed therebetween.

One of methods for manufacturing a semiconductor device of the invention includes steps of forming an amorphous semiconductor film over an insulating surface; forming a crystalline semiconductor film by irradiating the amorphous semiconductor film with laser light; forming a semiconductor layer by patterning the crystalline semiconductor film; forming a gate insulating layer over the semiconductor layer; forming a gate electrode layer over the gate insulating layer; forming a first impurity region by doping the semiconductor layer from one direction obliquely to the surface thereof with an impurity element for imparting a first one conductive type, using the gate electrode layer as a mask; and forming a second impurity region, a source region, a drain region, and a channel formation region by doping the semiconductor layer perpendicularly to the surface thereof with an impurity element for imparting a second one conductive type, using the gate electrode layer as a mask. The second impurity region is formed between the channel formation region and the source region and covered with the gate electrode layer, and the drain region is formed in contact with the channel formation region.

One of methods for manufacturing a semiconductor device of the invention includes steps of forming an amorphous semiconductor film over an insulating surface; forming a crystalline semiconductor film by irradiating the amorphous semiconductor film with laser light; forming a semiconductor layer by patterning the crystalline semiconductor film; forming a gate insulating layer over the semiconductor layer; forming a gate electrode layer over the gate insulating layer; forming a first impurity region by doping the semiconductor layer from one direction obliquely to the surface thereof with an impurity element for imparting a first one conductive type, using the gate electrode layer as a mask; and forming a second impurity region, a source region, a drain region, and a channel formation region by doping the semiconductor layer perpendicularly to the surface thereof with an impurity element for imparting a second one conductive type, using the gate electrode layer as a mask. The second impurity region is formed between the channel formation region and the drain region and covered with the gate electrode layer, and the source region is formed in contact with the channel formation region.

One of methods for manufacturing a semiconductor device of the invention includes steps of forming an amorphous semiconductor film over an insulating surface; forming a crystalline semiconductor film by irradiating the amorphous semiconductor film with laser light; forming a semiconductor layer by patterning the crystalline semiconductor film; forming a gate insulating layer over the semiconductor layer; forming a gate electrode layer over the gate insulating layer; forming a first impurity region by doping the semiconductor layer from one direction obliquely to the surface thereof with an impurity element for imparting a first one conductive type, using the gate electrode layer as a mask; and forming a second impurity region, a third impurity region, a fourth impurity region, and a channel formation region by doping the semiconductor layer perpendicularly to the surface thereof with an impurity element for imparting a second one conductive type, using the gate electrode layer as a mask; forming an insulating layer on a side surface of the gate electrode layer; and forming a source region, a fifth impurity region to be in contact with the source region, a drain region, and a sixth impurity region to be in contact with the drain region by doping the semiconductor layer perpendicularly to the surface thereof with an impurity element for imparting a third one conductive type, using the gate electrode layer and the insulating layer as a mask. Each concentration of the impurity element for imparting the second one conductive type and the impurity element for imparting the third one conductive type in the fifth impurity region and the sixth impurity region is lower than that of the impurity element for imparting the second one conductive type and the impurity element for imparting the third one conductive type in the source region and the drain region. The second impurity region is formed between the channel formation region and the fifth impurity region and covered with the gate electrode layer, and the sixth impurity region is formed in contact with the channel formation region.

One of methods for manufacturing a semiconductor device of the invention includes steps of forming an amorphous semiconductor film over an insulating surface; forming a crystalline semiconductor film by irradiating the amorphous semiconductor film with laser light; forming a semiconductor layer by patterning the crystalline semiconductor film; forming a gate insulating layer over the semiconductor layer; forming a gate electrode layer over the gate insulating layer; forming a first impurity region by doping the semiconductor layer from one direction obliquely to the surface thereof with an impurity element for imparting a first one conductive type, using the gate electrode layer as a mask; and forming a second impurity region, a third impurity region, a fourth impurity region, and a channel formation region by doping the semiconductor layer perpendicularly to the surface thereof with an impurity element for imparting a second one conductive type, using the gate electrode layer as a mask; forming an insulating layer on a side surface of the gate electrode layer; and forming a source region, a fifth impurity region to be in contact with the source region, a drain region, and a sixth impurity region to be in contact with the drain region by doping the semiconductor layer perpendicularly to the surface thereof with an impurity element for imparting a third one conductive type, using the gate electrode layer and the insulating layer as a mask. Each concentration of the impurity element for imparting the second one conductive type and the impurity element for imparting the third one conductive type in the fifth impurity region and the sixth impurity region is lower than that of the impurity element for imparting the second one conductive type and the impurity element for imparting the third one conductive type in the source region and the drain region. The second impurity region is formed between the channel formation region and the sixth impurity region and covered with the gate electrode layer, and the fifth impurity region is formed in contact with the channel formation region.

One of methods for manufacturing a semiconductor device of the invention includes steps of forming an amorphous semiconductor film over an insulating surface; forming a crystalline semiconductor film by irradiating the amorphous semiconductor film with laser light; forming a first semiconductor layer and a second semiconductor layer by patterning the crystalline semiconductor film; forming a gate insulating layer over the first semiconductor layer and the second semiconductor layer; forming a first gate electrode layer and a second gate electrode layer over the gate insulating layer; forming a first impurity region in the first semiconductor layer and a second impurity region in the second semiconductor layer by doping the first semiconductor layer and the second semiconductor layer with an impurity element for imparting a first one conductive type from one direction obliquely to the surfaces thereof, using the first gate electrode layer and the second gate electrode layer as masks; and forming a third impurity region, a first source region, a first drain region, and a first channel formation region in the first semiconductor layer and forming a fourth impurity region, a second source region, a second drain region, and a second channel formation region in the second semiconductor layer by doping the first semiconductor layer and the second semiconductor layer perpendicularly to the surfaces thereof with an impurity element for imparting a second one conductive type, using the first gate electrode layer and the second gate electrode layer as masks. The third impurity region is formed between the first channel formation region and the first source region and covered with the first gate electrode layer; the fourth impurity region is formed between the second channel formation region and the second drain region and covered with the second gate electrode layer; the first drain region is formed in contact with the first channel formation region; and the second source region is formed in contact with the second channel formation region.

The present invention enables a thin film transistor having a required property to be manufactured without complicating steps and devices. In addition, a semiconductor device having high reliability and better electrical characteristics can be manufactured with a higher yield at lower cost.

BRIEF DESCRIPTION OF THE DRAWING

FIGS. 1A to 1E are diagrams for describing the invention.
FIGS. 3A to 3F are diagrams for describing the invention.
FIGS. 6A to 6D are diagrams for describing a manufacturing method of a semiconductor device of the invention.
FIGS. 8A to 8C are diagrams for describing a manufacturing method of a semiconductor device of the invention.
FIGS. 9A to 9C are diagrams for describing a manufacturing method of a semiconductor device of the invention.
FIGS. 10A and 10B are diagrams for describing a manufacturing method of a semiconductor device of the invention.
FIGS. 11A to 11D are diagrams for describing a manufacturing method of a semiconductor device of the invention.
FIGS. 12A to 12C are diagrams for describing a manufacturing method of a semiconductor device of the invention.
FIGS. 13A and 13B are diagrams for describing a manufacturing method of a semiconductor device of the invention.
FIGS. 14A and 14B are diagrams for describing a manufacturing method of a semiconductor device of the invention.
FIGS. 21A to 21H are diagrams showing applications using a semiconductor device of the invention.
FIGS. 24A and 24B are model diagrams used for simulation and the result thereof.
FIGS. 30A to 30C are diagrams for describing a manufacturing method of a semiconductor device of the invention.

DETAILED DESCRIPTION OF THE INVENTION

BEST MODE FOR CARRYING OUT THE INVENTION

Figure 2A:
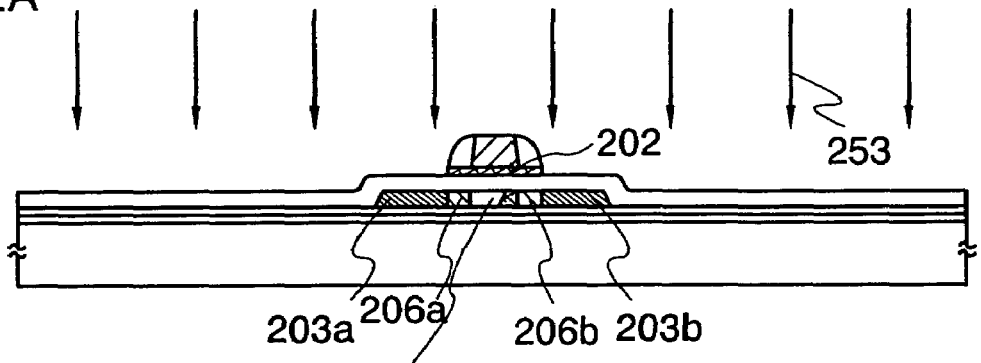
FIGS. 2A to 2D are diagrams for describing the invention.

Embodiment Modes of the invention will be described in detail with reference to the accompanying drawings. However, it is to be understood that the invention is not limited to the description below and various changes and modifications will be apparent to those skilled in the art, unless such changes and modifications depart from the content and scope of the invention. Therefore, the invention is not interpreted with limiting to the description in the embodiment modes. Note that the same reference numerals denote the same parts or parts having the same function in different drawings and the explanation will not be repeated in a constitution of the invention hereinafter explained.

Embodiment Mode 1

A method for manufacturing a thin film transistor in this embodiment mode is described with reference to FIGS. 1A to 1E, 2A to 2D, and 3A to 3F.

A base film 101a is formed to have a film thickness of 10 nm to 200 nm (preferably, from 50 nm to 100 nm) using a silicon nitride oxide (SiNO) film by a sputtering method, a physical vapor deposition (PVD) method, a low-pressure CVD (LPCVD) method, a chemical vapor deposition (CVD) method such as a plasma CVD method, or the like, and a base film 101b is stacked thereon to have a film thickness of 50 nm to 200 nm (preferably, from 100 nm to 150 nm) using a silicon oxynitride (SiON) film, over a substrate 100 having an insulating surface as a base film. In this embodiment mode, a plasmai CVD method is used to form the base film 101a and the base film 101b. As the substrate 100, a glass substrate, a quartz substrate, a silicon substrate, a metal substrate, or a stainless substrate over which an insulating film is formed may be used. Additionally, a plastic substrate having heat-resistance which can withstand a process temperature of this embodiment mode, or a flexible substrate like a film may be also used. Alternatively, a two-layer structure may be used for the base film, or a single-layer film structure of the base (insulating) film or a structure in which the base (insulating) films are stacked to have two layers or more may be also used.

Subsequently, a semiconductor film is formed over the base film. The semiconductor film may be formed to have a thickness of 25 nm to 200 nm (preferably, from 30 nm to 150 nm) by a known method (a sputtering method, an LPCVD method, a plasma CVD method, or the like). In this embodiment mode, an amorphous semiconductor film is crystallized with a laser to be a crystalline semiconductor film.

An amorphous semiconductor (hereinafter, also referred to as an "AS") manufactured using a semiconductor material gas typified by silane or germane by a vapor phase growth method or a sputtering method; a polycrystalline semiconductor that is formed by crystallizing the amorphous semiconductor, utilizing light energy or thermal energy; a semi-amorphous semiconductor (also referred to as microcrystalline, and hereinafter, also referred to as an "SAS"); or the like can be used for a material which forms a semiconductor film.

The SAS is a semiconductor having an intermediate structure between an amorphous structure and a crystalline structure (including a single crystal and a poly-crystal) and having a third state which is stable in terms of free energy, and includes a crystalline region having short-range order and lattice distortion. A crystalline region of from 0.5 nm to 20 nm can be observed in at least a part of a region in the film. When silicon is contained as the main component, a Raman spectrum is shifted to a lower frequency side than 520 cm$^{-1}$. A diffraction peak of (111) or (220) to be caused by a crystal lattice of silicon is observed in X-ray diffraction. Hydrogen or halogen of at least 1 atomic % or more is contained to terminate a dangling bond. The SAS is formed by glow discharge decomposition (plasma CVD) of a silicide gas. $SiH_4$, $Si_2H_6$, $SiH_2Cl_2$, $SiHCl_3$, $SiCl_4$, $SiF_4$, or the like can be used as the silicide gas. Further, $F_2$ or $GeF_4$ may be mixed to the silicide gas. This silicide gas may be diluted with $H_2$ or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature is preferably 300° C. or less, and the film can also be formed at substrate heating temperatures of 100° C. to 200° C. It is desirable that an impurity element formed of an atmospheric component such as oxygen, nitrogen, or carbon is $1\times10^{20}$ cm$^{-3}$ or less as an impurity element taken when the film is formed; specifically, an oxygen concentration is $5\times10^{19}$ cm$^{-3}$ or less, preferably $1\times10^{19}$ cm$^{-3}$ or less. A preferable SAS can be obtained by further promoting lattice distortion by adding a rare gas element such as helium, argon, krypton or neon to enhance stability. Additionally, a SAS layer formed using a hydrogen-based silicide gas may be stacked over a SAS layer formed using a fluorine-based silicide gas.

An amorphous semiconductor is typified by hydrogenated amorphous silicon, and a crystalline semiconductor is typified by polysilicon. Polysilicon (polycrystalline silicon) includes a so-called high temperature polysilicon using polysilicon which is formed at a temperature of 800° C. or more as a main material, a so-called low temperature polysilicon using polysilicon which is formed at a temperatures of 600° C. or less as a main material, polysilicon crystallized by being added with an element or the like which promotes crystallization, or the like. As described above, of course, a semiamorphous semiconductor or a semiconductor which contains a crystal phase in a part of the semiconductor layer can also be used.

When a crystalline semiconductor layer is used as the semiconductor film, a known method (a laser crystallization method, a heat crystallization method, a heat crystallization method using an element promoting crystallization such as nickel, or the like) may be employed as a method for manufacturing the crystalline semiconductor layer. A microcrystalline semiconductor which is a SAS can be crystallized by being irradiated with laser light to enhance the crystallinity. In the case where an element promoting crystallization is not used, the hydrogen is released until hydrogen concentration contained in an amorphous silicon film becomes $1\times10^{20}$ atoms/cm$^3$ or less by heating the amorphous silicon film for one hour at a temperature of 500° C. in a nitrogen atmosphere before irradiating the amorphous silicon film with laser light. This is because an amorphous silicon film is damaged when the amorphous silicon film containing much hydrogen is irradiated with laser light.

Any method can be used for introducing a metal element into the amorphous semiconductor film without limitation as long as the method is capable of making the metal element exist on the surface or inside the amorphous semiconductor film. For example, a sputtering method, a CVD method, a plasma treatment method (including a plasma CVD method), an adsorption method, or a method for applying a metal salt solution can be employed. Among them, the method using a solution is simple and easy and is advantageous in terms of easy concentration adjustment of the metal element. It is preferable to form an oxide film by UV light irradiation in oxygen atmosphere, a thermal oxidation method, treatment with ozone water or hydrogen peroxide including a hydroxyl radical, or the like in order to improve wettability of the surface of the amorphous semiconductor layer and to spread the aqueous solution over the entire surface of the amorphous semiconductor layer.

The semiconductor film is irradiated with the laser light having any one of second to fourth harmonics of the fundamental wave from a continuous wave solid-state laser. Thus, a crystal having a large grain size can be obtained. For example, typically, it is preferable to use the second harmonic (532 nm) or the third harmonic (355 nm) of an Nd:YVO$_4$ laser (fundamental wave 1064 nm). Specifically, the laser light emitted from the continuous wave YVO$_4$ laser is converted into the harmonic by a non-linear optical element to obtain laser light having the output or more. It is preferable to shape the laser light into rectangular or elliptical on an irradiated surface through an optical system to irradiate a semiconductor film. The laser light needs to have the energy density of approximately 0.001 to 100 MW/cm$^2$ (preferably, from 0.1 to 10 MW/cm$^2$). The scanning speed is set in the range of approximately 0.5 to 2000 cm/sec (preferably, 10 to 200 cm/sec) for the irradiation.

The laser may be a known continuous wave gas laser or solid-state laser. As the gas laser, there are an Ar laser, a Kr laser, and the like. As the solid-state laser, there are a YAG laser, a YVO$_4$ laser, a YLF laser, a YAlO$_3$ laser, a Y$_2$O$_3$ laser, a glass laser, a ruby laser, an alexandrite laser, or a Ti: Sapphire laser, and the like.

Moreover, a pulsed laser may be employed to conduct laser crystallization. In this case, the pulse repetition rate is set to 0.5 MHz or more. This frequency band is extremely higher than the frequency band of several ten Hz to several hundred Hz, which is used usually. It is said that it takes several ten to several hundred nanoseconds to completely solidify the semiconductor film after the semiconductor film is irradiated with the pulsed laser light. When the pulsed laser light has the above described frequency band, it is possible to irradiate it with next pulsed laser light after the semiconductor film is melted by the previous pulsed laser light and before the semiconductor film is solidified. Therefore, the interface between the solid phase and the liquid phase can be continuously moved in the semiconductor film, and the semiconductor film having a crystal grain continuously grown toward the scanning direction is formed. Specifically, it is possible to form an aggregation of crystal grains each of which has a width of 10 to 30 μm in the scanning direction and a width of approximately 1 to 5 μm in a direction perpendicular to the scanning direction. It is also possible to form a semiconductor film having almost no crystal grain boundaries at least in the channel direction of the thin film transistor by forming a crystal grain long extended along the scanning direction.

The irradiation with the laser light may be conducted in inert gas atmosphere such as a rare gas or nitrogen. This enables the roughness of a semiconductor surface to be controlled by the irradiation with the laser light and variations in threshold value generated by variations in interface state density to be controlled.

The amorphous semiconductor film may be crystallized by combining thermal treatment and laser light irradiation, or thermal treatment or laser light irradiation may be separately performed plural times.

A semiconductor can be formed from an organic semiconductor material by a printing method, a spray method, spin coating, a droplet discharge method, or the like. In this case, since the above etching step is not required, the number of steps can be reduced. A low molecular weight material, a high molecular weight material, or the like is used for the organic semiconductor, and in addition, a material such as an organic pigment, a conductive high molecular weight material can be used. A π-electron conjugated high molecular weight material having a skeleton constituted by a conjugated double bonds is preferably used as an organic semiconductor material used in the invention. Typically, a soluble high molecular weight material such as polythiophene, polyfluoren, poly (3-alkylthiophene), a polythiophene derivative, or pentacene can be used.

A material with which a semiconductor layer can be formed by performing a process after depositing a soluble precursor is given as an example of an organic semiconductor material which can be used in the invention. Note that polythienylenevinylene, poly(2,5-thienylenevinylene), polyacetyrene, polyacetyrene derivative, polyallylenevinylene or the like is given as an example of such an organic semiconductor material.

In converting the precursor to an organic semiconductor, a reaction catalyst such as a hydrogen chloride gas is added additionally to a heat treatment. The following can be applied as a typical solvent which dissolves the organic semiconductor material having solubility: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

In this embodiment mode, an amorphous semiconductor film 115 is formed over the base film 101b using amorphous silicon. The amorphous semiconductor film 115 is irradiated with laser light 170 scanned to a direction of an arrow 171 to be crystallized, thereby forming a crystalline semiconductor film 116 (FIG. 1A).

Such obtained semiconductor film may be doped with a minute amount of impurity element (boron or phosphorous) in order to control a threshold value of a thin film transistor; however, in this embodiment mode, the threshold value of the thin film transistor is controlled by manufacturing an n-channel thin film transistor having a low concentration p-channel impurity region. Thus, according to the invention, it is not necessarily to need a doping step for controlling the threshold value; therefore, the steps are simplified.

The crystalline semiconductor film 116 is patterned using a mask. In this embodiment mode, a photo mask is formed and a patterning process is conducted by a photolithography method to form a semiconductor layer 102.

Either plasma etching (dry etching) or wet etching may be adopted for the etching in patterning. However, plasma etching is suitable to treat a large substrate. A fluorine-based gas such as $CF_4$ or $NF_3$ or chlorine-based gas such as $Cl_2$ or $BCl_3$ is used as the etching gas, and an inert gas such as He or Ar may be appropriately added. In addition, a local discharge process can be performed when an atmospheric pressure discharge etching process is applied, and a mask layer need not be entirely formed over the substrate.

In this embodiment mode, a conductive layer for forming a wiring layer or an electrode layer, a mask layer for forming a predetermined pattern, or the like may be formed by a method where a pattern can be selectively formed, such as a drop discharging method. In the drop discharging method (also referred to as an inkjet method according to the system thereof), a predetermined pattern (a conductive layer, an insulating layer, and the like) can be formed by selectively discharging (ejecting) liquid of a composition prepared for a specific purpose. In this case, a process for controlling wettability and adhesion-may be performed in a region to be formed thereon. Additionally, a method for transferring or describing a pattern, for example, a printing method (a method for forming a pattern of a screen print, a offset print, or the like) or the like can be used.

In this embodiment mode, a resin material such as an epoxy resin, an acrylic resin, a phenol resin, a novolac resin, a melamine resin, or an urethane resin is used as a mask. Alternatively, the mask may also be made of an organic material such as benzocyclobutene, parylene, flare and polyimide having a light transmitting property; a compound material formed by polymerization of a siloxane polymer or the like; a composition material containing a water-soluble homopolymer and a water-soluble copolymer; and the like. In addition, a commercially available resist material containing a photosensitive agent may be also used. For example, it is possible to use a typical positive resist including a novolac resin and a naphthoquinonediazide compound that is a photosensitive agent; a base resin that is a negative resist, diphenylsilanediol, an acid generating material, and the like. The surface tension and the viscosity of any material are appropriately adjusted by controlling the solvent concentration, adding a surfactant, or the like, when a droplet discharging method is used.

A gate insulating layer 105 covering a semiconductor layer 102 is formed. The gate insulating layer 105 comprises an insulating film containing silicon to have a thickness of from 10 nm to 150 nm by a plasma CVD method or a sputtering method. The gate insulating layer 105 may be formed of a known material such as an oxide material or nitride material of silicon, and may be a laminated layer or a single layer. In this embodiment mode, a laminated structure is used for the gate insulating layer. A thin silicon oxide film is formed over the semiconductor layer 102 at a film thickness of 1 nm to 100 nm, preferably 1 nm to 10 nm, and further preferably 2 nm to 5 nm, as a first insulating film. The semiconductor surface is oxidized by a GRTA (gas rapid thermal anneal) method, a LRTA (lamp rapid thermal anneal) method, or the like and a thermal oxide film is formed, thereby forming the first insulating film to be a thin film. In this embodiment mode, a laminated layer of three-layer: a silicon nitride film, a silicon oxide film, and a silicon nitride film is used over the first insulating film. Alternatively, a single layer of a silicon oxynitride film or a laminated layer of two layers thereof may be also used. Preferably, a precise silicon nitride film may be used. Note that a rare gas element such as argon may be added to a reactive gas and be mixed into an insulating film to be formed in order to form a precise insulating film having little gate leak current at low film formation temperature.

A first conductive film 106 having a film thickness of 20 nm to 100 nm and a second conductive film 107 having a film thickness of 100 nm to 400 nm, each of which serves as a gate electrode are laminated over the gate insulating layer 105 (FIG. 1B). The first conductive film 106 and the second conductive film 107 can be formed by a known method such as a sputtering method, a vapor deposition method, or a CVD method. The first conductive film 106 and the second conductive film 107 may be formed of an element of tantalum (Ta), tungsten (W), titanium (Ti), molybdenum (Mo), aluminum (Al), copper (Cu), chromium (Cr), and neodymium (Nd), or an alloy material or compound material having the foregoing element as a main component. A semiconductor film typified by a polycrystalline silicon film that is doped with an impurity element such as phosphorus or an AgPdCu alloy may be used as the first conductive film and the second conductive film. The conductive film is not limited to the two-layer structure, and, for example, may have a three-layer structure in which a 50 nm thick tungsten film, a 500 nm thick alloy film of aluminum and silicon (Al—Si), and a 30 nm thick titanium nitride film are sequentially laminated. In the case of the three-layer structure, tungsten nitride may be used in stead of tungsten of the first conductive film; an alloy film of aluminum and titanium (Al—Ti) may be used in stead of an alloy film of aluminum and silicon (Al—Si) of the second conductive film; or a titanium film may be used in stead of a titanium nitride film of a third conductive film. Further, a single layer structure may be also used. In this embodiment mode, tantalum nitride (TaN) is used for the first conductive film 106 and tungsten (W) is used for the second conductive film 107.

Then, a mask using a resist is formed by a photolithography method and the second conductive film 107 is patterned to form a first gate electrode layer 205. The second conductive film can be etched to have a desired tapered shape by appropriately adjusting an etching condition (electric power applied to a coil-shaped electrode layer, electric power applied to an electrode layer on a substrate side, electrode temperature on a substrate side, or the like) by an ICP (Inductively Coupled Plasma) etching method. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used.

A thin film transistor capable of high speed operation can be formed by narrowing the width D1 of the gate electrode layer. Two methods for forming the first gate electrode layer 205 to narrow the width in the channel direction are shown in FIGS. 3A to 3F. FIG. 3A corresponds to FIG. 1B and shows up to a step for forming the second conductive film 107 over the substrate 100.

First, a first method is described with reference to FIGS. 3B, 3C, and 3F. A mask 220 comprising a resist is formed over the second conductive film 107 by a photolithography method or a droplet discharging method. As shown in FIG. 3B, the second conductive film 107 is etched using the mask 220 to form a first gate electrode layer 210. Then, the first gate electrode layer 210 is etched in the direction of an arrow 225 without removing the mask 220. The first gate electrode layer 210 is narrowed to have the width of the first gate electrode layer 205 to form the first gate electrode layer 205 (FIG. 3C). After the mask 220 is removed, the first gate electrode layer 205 can be completed to have the width D1 of the gate electrode of 10 nm to 1000 nm, preferably 200 nm to 700 nm.

A second method is described with reference to FIGS. 3D, 3E, and 3F. A mask 220 comprising a resist is formed over the second conductive film 107 by a photolithography method or a droplet discharging method. The mask 220 is made further slim by etching, ashing, or the like in a direction of an arrow 256 to form a mask 221 having a narrower width (FIG. 3E). The second conductive film 107 is patterned using the mask 221 formed to have an elongated shape and the mask 221 is removed. Thereby, a first gate electrode layer 205 can be similarly formed to narrow the width D1 of the gate electrode layer. Setting the width D1 of the gate electrode layer within the aforesaid limits enables a thin film transistor which has a short channel length to be subsequently formed and a semiconductor device capable of high speed operation to be formed.

Figure 31A:
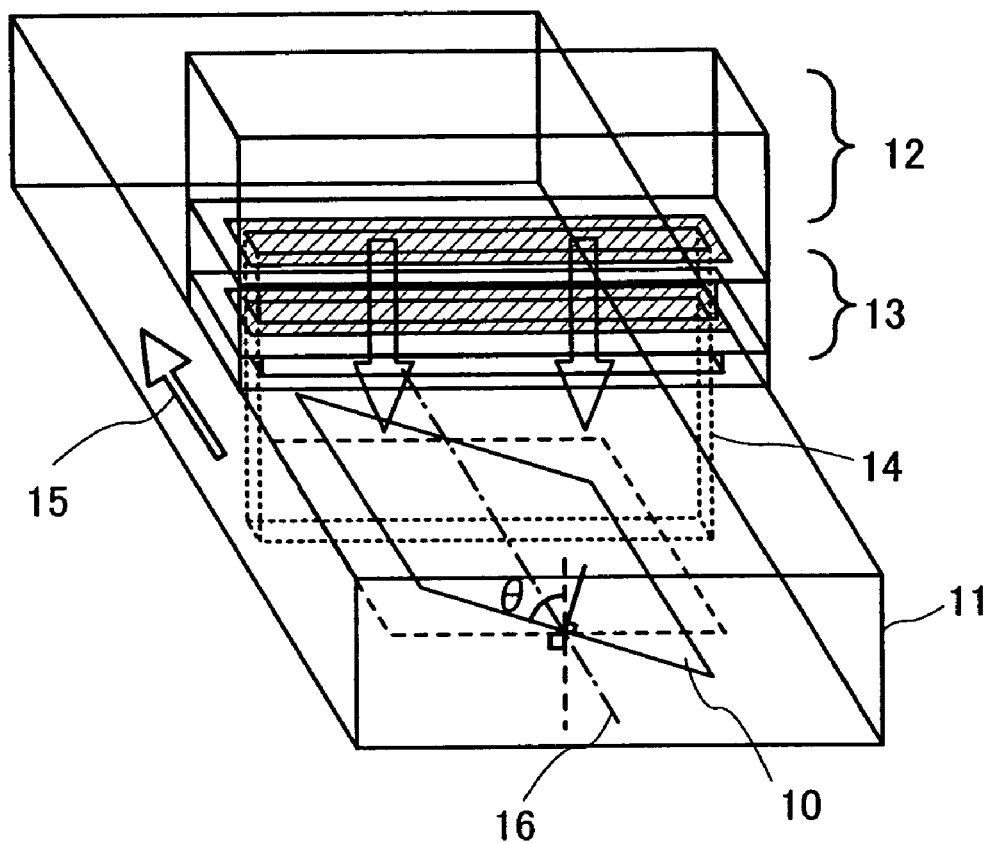
FIGS. 31A and 31B are schematic views of a doping device which can be used in the invention.

FIG. 31A is a perspective view showing a doping device of the invention.

An ion source 12 includes a thermoelectronic emission filament provided for a chamber in which plasma is generated and a plurality of ring-shaped permanent magnets disposed with alternating polarity around the chamber.

An accelerating electrode portion 13 includes an ion containment electrode which keeps the same electric potential as the chamber which is an anode, an extraction electrode which keeps the lower electric potential than the ion containment electrode by several ten kV, and an acceleration electrode which keeps the lower electric potential than the extraction electrode by several ten kV, in an opening portion at the bottom of the chamber. The ion containment electrode, the extraction electrode, and the acceleration electrode are grid electrodes.

The on-state or off-state of the irradiation may be controlled by switching operation with a shutter provided to block an ion beam.

An electron emitted from the filament reacts to an operation gas (hydrogen, phosphine, diborane, or the like) which is introduced into the chamber from a gas introduction opening to generate plasma. The plasma is shut in the chamber by a magnetic field of the permanent magnetic and simultaneously an electric field is impressed by the extraction electrode, thereby extracting the ion in the plasma through the ion containment electrode. The ion is accelerated by an electric field of the acceleration electrode, and then an ion beam 14 is generated.

The ion beam 14 is irradiated in a doping chamber 11, and the ion is introduced into a slanted substrate 10. The substrate 10 is slanted using an axis of tilt 16 as a center and is kept. The cross sectional view of the ion beam is made to be a linear shape or a rectangle and the substrate is moved in a direction 15 perpendicular to a longer side of the ion beam 14 to conduct a doping process to the entire surface of the substrate.

Figure 31B:
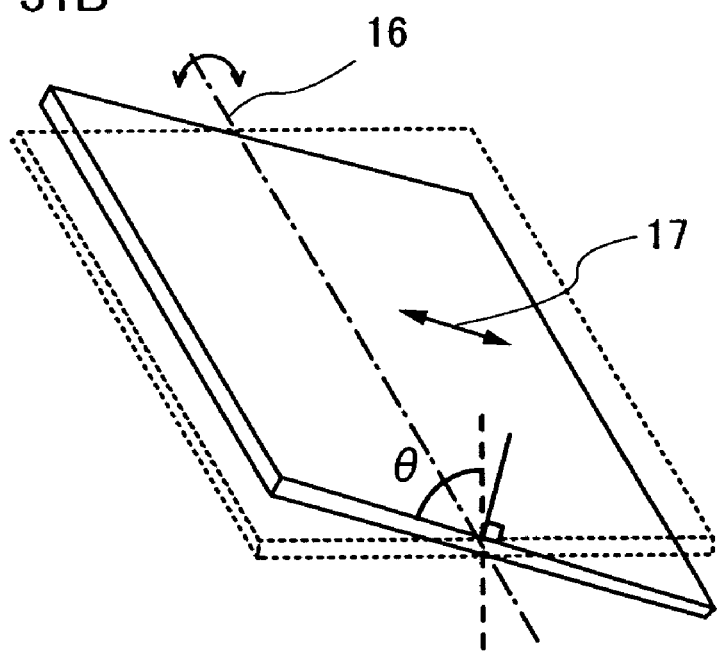

The gradient angle of the substrate is changed into a horizontal position or a slanted position by a substrate stage or a transfer robot. A rail or a driving geared motor may be used to move the substrate in the scanning direction, without limiting to a robot. The angle of the stage is adjusted by an angular adjustor such as a goniometer. A stage provided with the goniometer is also referred to as a goniostage. The goniostage has a center of a slant at the top of the stage and is slanted using the center of the slant as a supporting point. An angle θ is an angle between the longer side of the ion beam 14 and the main surface of the substrate 10. The substrate is slanted using the axis of tilt 16 as an axis. In FIGS. 31A and 31B, the axis of tilt 16 may be provided for any position of the substrate. The axis of tilt 16 is provided for the substrate surface parallel to one side of the substrate; however, it may be provided for the substrate surface diagonally. In this case, the substrate 10 is slanted using a diagonal line as an axis of tilt.

The doping device of the invention can process a large sized substrate, since the substrate is moved while keeping the substrate stage slanted when conducting the doping by the doping device. Further, since a shape of cross section of the ion beam is quadrangular, the substrate can be irradiated with every ion beam and thus, ion irradiation can be efficiently conducted. Additionally, the width of the longer side of the ion beam can be narrowed, since the substrate is not related.

In addition, the invention is not limited to the above described structure of a device. The substrate may be irradiated with the ion beam in a horizontal position while keeping the substrate in a slanted position that is almost vertical, since it is a problem with a particle.

Figure 33A:
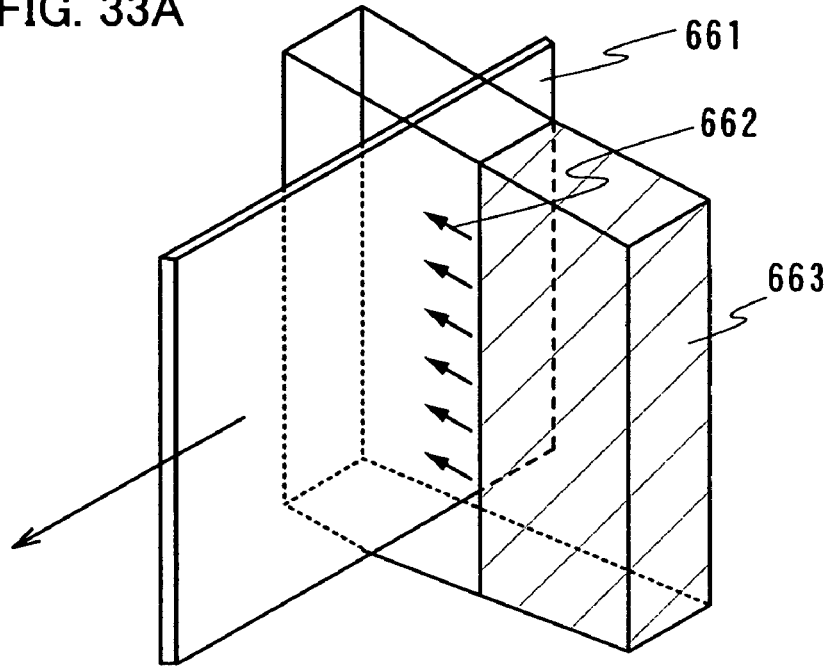
FIGS. 33A to 33C are schematic views of a doping device which can be used in the invention.
Figure 33B:
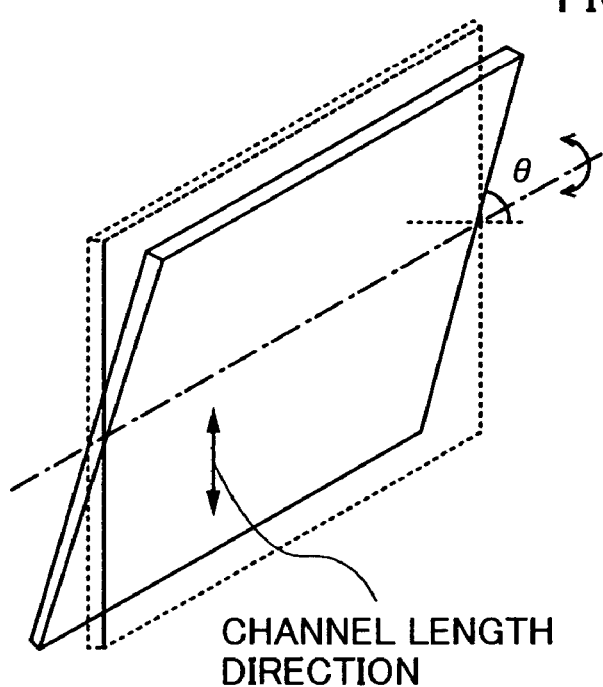
Figure 33C:
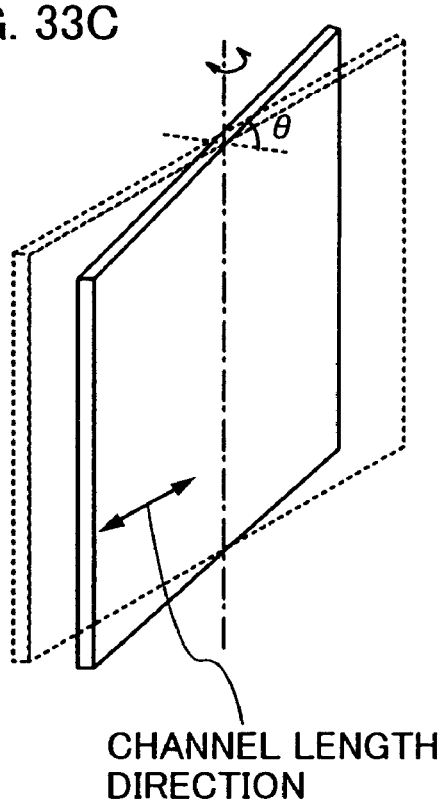

FIGS. 33A to 33C shows an example of doping with a substrate kept in a vertical position. A doping device shown in FIG. 33A has a structure where a substrate 661 kept in a vertical is irradiated with an ion beam 662 in a horizontal position by an ion beam irradiation unit 663. A substrate stage for keeping a substrate is connected to a robot and provided with an axis of tilt for slanting the substrate stage while conveying the substrate to make two kinds of operations possible. One kind of the operation is a method where doping is conducted conveying the substrate while slanting the substrate 661 to have an angle θ between the substrate surface and the ion beam irradiation direction, as shown in FIG. 33B. Another kind of the operation is a method where the substrate slanted as shown in FIG. 33C and conveyed is irradiated with an ion beam at an angle θ. Additionally, while being irradiated with an ion beam, an substrate stage may be holed at a certain angle and may ever vary its angle in a certain rang.

The invention is not limited to the above described structure of the device. A substrate conveying roller may be used to hold and convey the slanted substrate. In this case, a bottom of the substrate is held by a holding member such as a conveying roller and a bottom portion of tilt is held by a side guide. The side guide prevents the substrate from moving below by holding what a bottom supported roller is in contact with the bottom of the substrate from the side.

Further, the doping device of the invention may include an ion convergent device or an ion mass separator which is known in the conventional ion doping technique.

It is required to consider arrangement of a TFT in order to form an impurity region below a gate electrode by doping while keeping a substrate in an obliqued position. FIG. 31B shows a substrate in a doping chamber 11 simply. As shown in FIG. 31B, a circuit including the TFT is preferably configured so that the substrate stage for slanting the substrate is moved according to a channel length direction 17. Therefore, the arrangement of the circuit including the TFT is required to be decided in accordance with the position of an axis of tilt 16 for deciding the movement of the substrate stage.

Figure 32A:
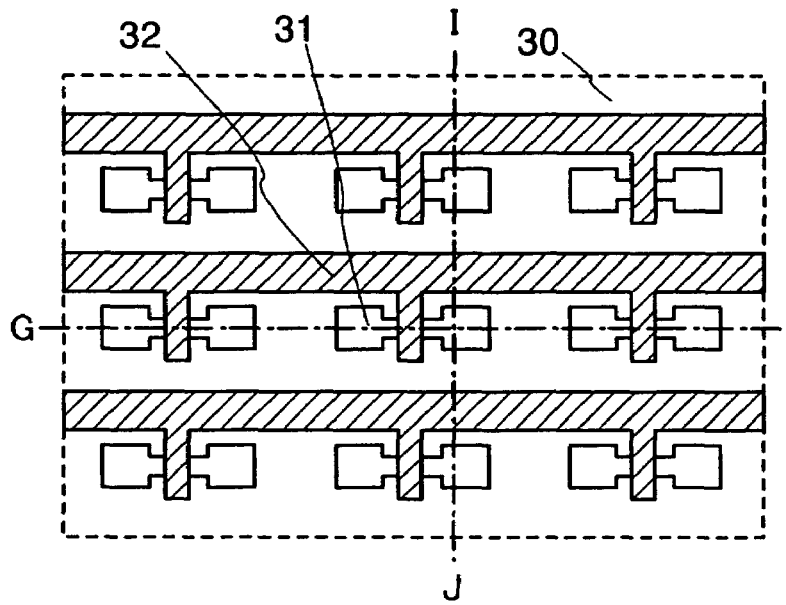
FIGS. 32A to 32D are diagrams for describing a brief summary of the invention.
Figure 32B:
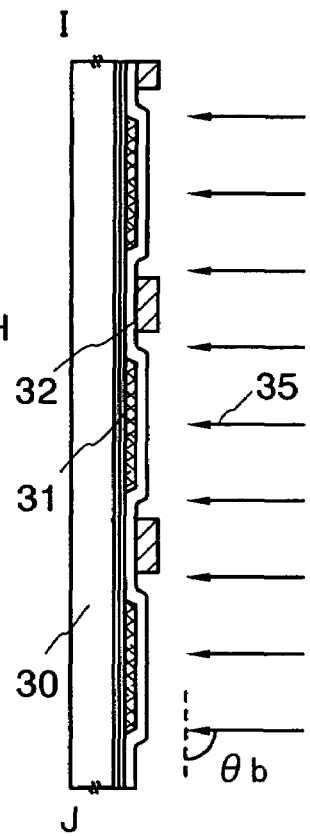
Figure 32C:
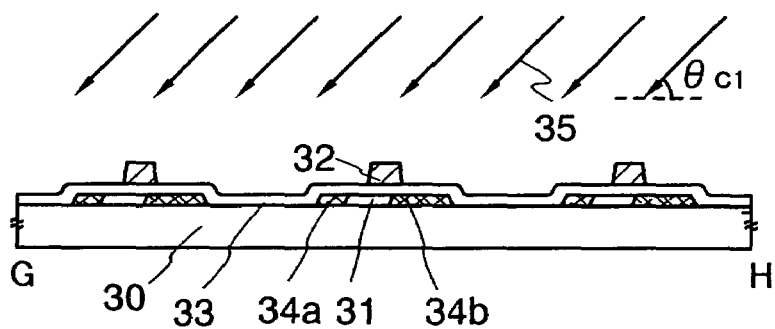
Figure 32D:
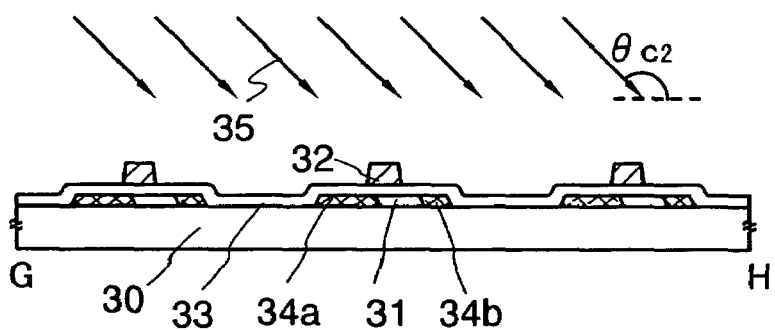

FIG. 32A is a top view for describing a doping step of a semiconductor device in this embodiment mode; FIG. 32B is a cross sectional view of a line I-J of the top view 32A; and FIGS. 32C and 32D are cross sectional views of a line G-H of the top view 32A. As shown in FIGS. 32A to 32D, a plurality of semiconductor layers 31, a gate electrode layer 32, and a gate insulating layer 33 are formed over a substrate 30. In the invention, the semiconductor layer 31 is doped with an impurity element obliquely so that an incidence angle of the impurity element to the surface thereof has an angle θ. The substrate 30 shown in FIG. 32A is slanted using an axis of tilt which is parallel to the line I-J. The slanted substrate 30 is doped with impurity element 35 obliquely as shown in FIGS. 32C and 32D. However, the cross sectional view 32B of the line I-J which is parallel to the axis of tilt shows that the semiconductor layer 31 is doped with impurity element 35 so that an incidence angle of the impurity element to the surface thereof always has a right angle θb. FIGS. 32C and 32D which are the cross sectional views of the line G-H which is vertical to the axis of tilt shows that the semiconductor layer 31 are doped with the impurity element 35 obliquely to have an angle θc1 or an angle θc2 according to a slope angle of the substrate 30. An impurity region 34a and an impurity region 34b can be formed to be different in a structure as shown in FIGS. 32C and 32D by changing the angle θc1 and the angle θc2.

An incidence angle θ of the impurity element 35 to the surface of the semiconductor layer which is doped is preferably 30° to 90° or 90° to 150°. Additionally, it is preferable to set angular difference between the angle θc1 and the angle θc2 at 5° or more.

As shown in FIG. 1C, semiconductor layer is doped with an impurity element 251 for imparting p-type, using the first gate electrode layer 205 as a mask. Here, the semiconductor layer 102 is doped with the impurity element 251 for imparting p-type at the incident angle θ1, which is set at 30° to 90° or 90° to 150°, to the surface thereof, thereby forming a first p-type impurity region 103a and a first p-type impurity region 103b. In this embodiment mode, the angle θ1 is set at the range of 30° to 90°. The semiconductor layer is doped with the impurity element for imparting p-type, obliquely to the surface thereof. Therefore, a region covered with the first gate electrode layer 205 in the semiconductor layer 102 is also doped, thereby forming a first p-type impurity region 103b. However, some impurity elements for imparting p-type are blocked by the first gate electrode layer 205; therefore, the first p-type impurity region 103a is not formed in the region covered with the first gate electrode layer 205 in the semiconductor layer. Accordingly, the semiconductor layer 102 is selectively doped with the impurity elements for imparting p-type, thereby forming the first p-type impurity region 103a and the first p-type impurity region 103b (FIG. 1C). The doping is conducted so that the first p-type impurity region 103a and the first p-type impurity region 103b include the impurity elements for imparting p-type to be a concentration of approximately $5 \times 10^{17}$ to $5 \times 10^{18}/\text{cm}^3$. In addition, the concentration thereof may be set at approximately $5 \times 10^{16}$ to $5 \times 10^{17}$ cm$^3$. In this embodiment mode, boron (B) is used as the impurity elements for imparting p-type.

Figure 27A:
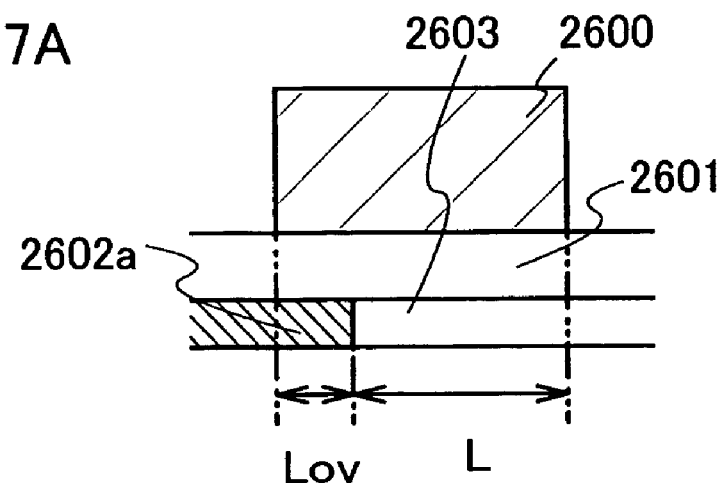
FIGS. 27A to 27C are diagrams showing Lov definitions.
Figure 27B:
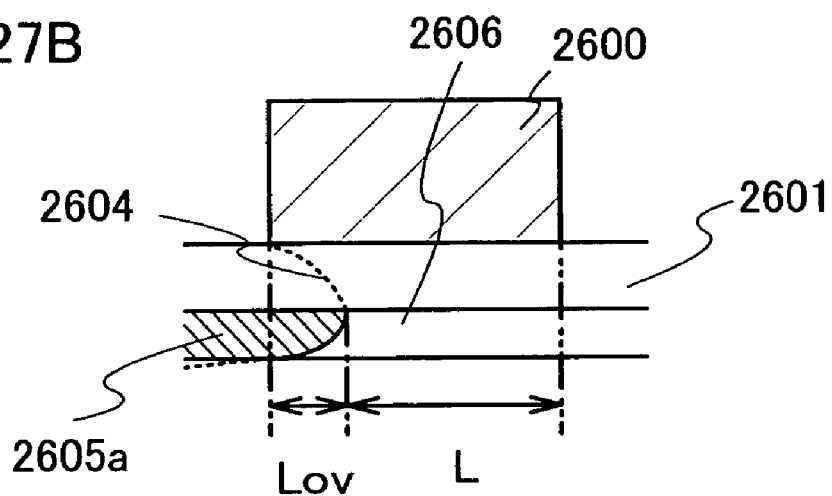
Figure 27C:
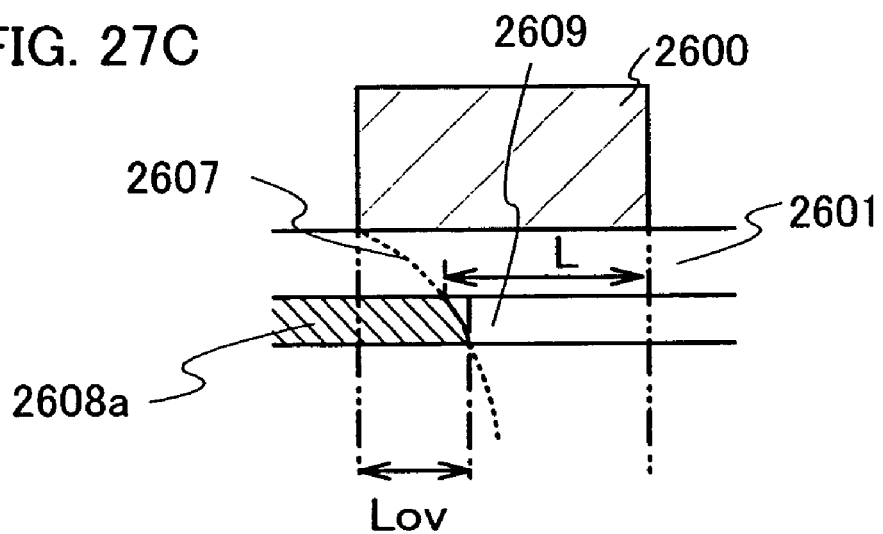

In this embodiment mode, a region where the impurity region is overlapped with the gate electrode layer with the gate insulating layer interposed therebetween is called an Lov region and a region where the impurity region is not overlapped with the gate electrode layer with the gate insulating layer interposed therebetween is called an Loff region. A channel length L of the thin film transistor and a length $L_{ov}$ of an Lov region 2602a in a channel length direction are explained with reference to FIGS. 27A to 27C and 28A to 28C. In this embodiment mode, the channel length L of the thin film transistor and the length $L_{ov}$ of the Lov region 2602a are defined as those in FIG. 27A. Basically, these lengths and a width of a gate electrode layer 2600 have the equality, that is, width=L+$L_{ov}$, as shown in FIG. 27A. In the case that doped impurity elements are dispersed by a heating process at comparable high temperature after doping the substrate with the impurity elements, boundaries of the channel formation region 2603 become vague. FIG. 27A shows a simple structural diagram of the channel formation region 2603 to distinguish the boundaries. FIGS. 27A to 27C is shown using a hatching and a blank; however, this does not mean that the blank portion has not been doped with the impurity element. This shows that the concentration distribution of the impurity element in this region reflects the doping condition. Note that this is the same as in other diagrams of this description. Accordingly, shapes of the first p-type impurity region 103a and the first impurity region 103b are described as shown in FIG. 1C in order to reflect the incident angle θ1.

Depending on a doping condition, as indicated by a dotted line in FIG. 27B, a peak of a concentration profile may be positioned in a gate insulating film 2601 or an upper portion of the channel formation region 2606 in the semiconductor layer. In FIG. 27B, a length $L_{ov}$ of an Lov region 2605a that is overlapped with the gate electrode 2600 and a channel length L of the channel formation region 2606 are the same as those in FIG. 27A.

Depending on the doping condition, as indicated by a dotted line in FIG. 27C, a peak of a concentration profile 2607 may be positioned in a base insulating film under the semiconductor layer or in the substrate. In this case, the width of the gate electrode 2600 cannot satisfy the equality, width of the gate electrode=L+Lov. Since the channel is formed at an interface between a channel formation region 2609 and a gate insulating layer 2601, the channel length L has a length as illustrated in FIG. 27C and an Lov region 2068a overlapped with the gate electrode layer 2600 indicates the longest portion of the length $L_{ov}$. In the case of using a semiconductor substrate, the structure shown in FIG. 27C is manufactured by only a thin film transistor having a long channel length since concentration profiles of the semiconductor substrates are overlapped with each other or too close to each other at the bottom portion of the gate.

Figure 28A:
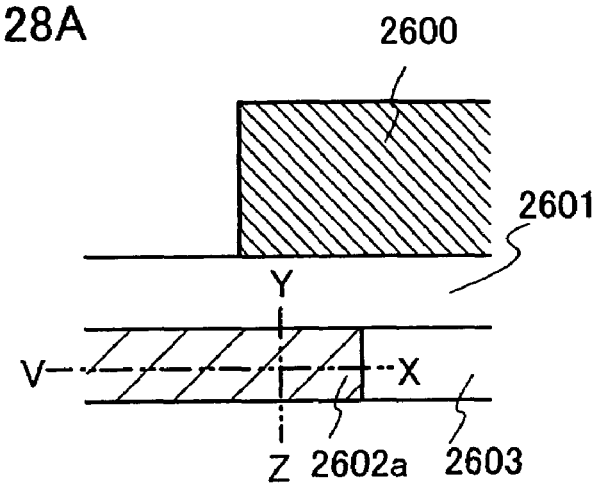
FIGS. 28A to 28C are diagram showing concentration distribution of an impurity element in a crosswise direction and a lengthwise direction of a semiconductor layer.
Figure 28B:
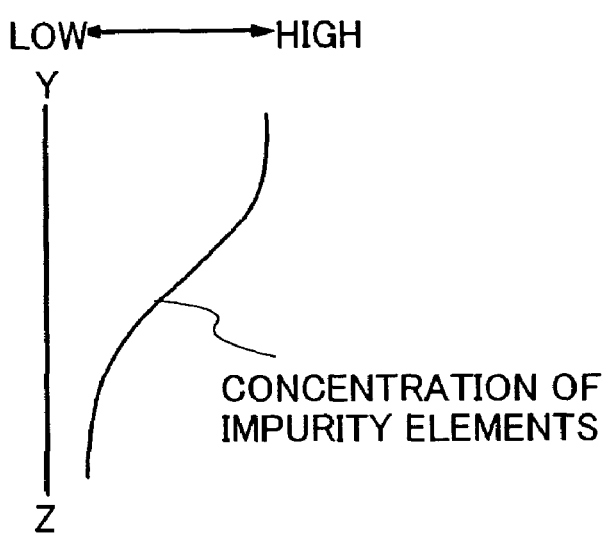
Figure 28C:
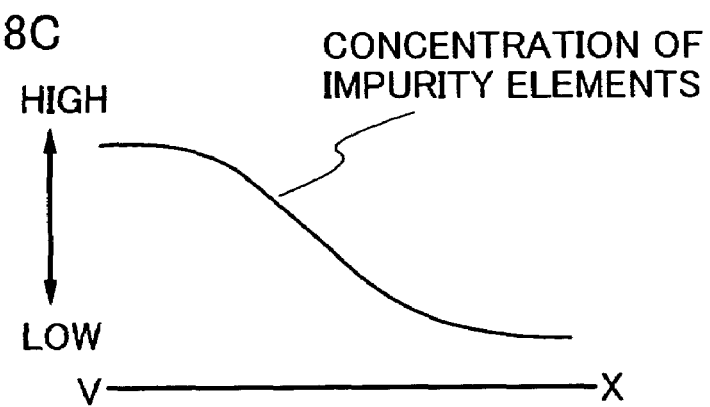

In FIG. 27A, concentration distribution of impurity elements in a crosswise direction and a lengthwise direction of the Lov region 2602a is explained with reference to FIGS. 28A to 28C. FIG. 28A is an enlarged view of another Lov region 2602a illustrated in FIG. 27A. FIG. 28B shows concentration distribution of impurity elements in a depth direction (Y-Z) of the Lov region. FIG. 28C shows concentration distribution of impurity elements in a crosswise direction (V-X: a vertical direction to the depth direction) of the Lov region.

As shown in FIG. 28B, there is generated concentration gradient at the substrate side and the gate electrode side in the Lov region. As shown in FIG. 28C, there is generated concentration gradient in the Lov region.

As shown in FIGS. 27B and 27C, the concentration gradient in a depth direction and a crosswise direction shows various distributions.

As shown in FIG. 1D, the semiconductor layer is doped with an impurity element 252 for imparting n-type, using the first gate electrode layer 205 again as a mask. The semiconductor layer 102 is doped with the impurity element 251 for imparting n-type at the incident angle θ2, almost vertically to the surface, thereby forming a first n-type impurity region 104a and a first n-type impurity region 104b. The angular difference between the angle θ2 and the angle θ1 is set at 5° or more. The first n-type impurity region 104a and the first n-type impurity region 104b have been doped with the impurity element for imparting p-type; therefore, they are required to be doped with an impurity element for imparting n-type which has a higher concentration than the impurity element for imparting p-type of the first p-type impurity region 103a and the first p-type impurity region 103b in order to change p-type to n-type. The first n-type impurity region 104a and the first n-type impurity region 104b include the impurity elements for imparting n-type at a concentration of $1 \times 10^{17}$ to $5 \times 10^{18}/cm^3$ typically. In this embodiment mode, phosphorous (P) is used as the impurity elements for imparting n-type.

Here, the semiconductor layer 102 is doped in a self-alignment manner with the impurity element 252 for imparting n-type, using the first gate electrode layer 205. A region which is overlapped with the first gate electrode layer 205 in the first p-type impurity region 103b remains the p-type impurity region, without being doped with the impurity element 252 for imparting n-type. Therefore, a second p-type impurity region 208 is formed in the semiconductor layer 102 and the second p-type impurity region 208 is an Lov region. On the other hand, the first n-type impurity region 104a and the first n-type impurity region 104b are Loff regions since they are not covered with the gate electrode layer 205.

Next, after forming an insulating layer covering the first conductive film 106, the gate electrode layer 205, and the like, this insulating layer is processed by anisotropic etching of an RIE (reactive ion etching) method to form a sidewall (side wall spacer) 201 on a side wall of the gate electrode layer 205 in a self-alignment manner (FIG. 1E). Here, the insulating layer is not particularly limited. However, it is preferable that the insulating layer includes silicon oxide formed to have a good step coverage by reacting TEOS (Tetra-Ethyl-Orso-Silicate), silane, or the like with oxygen, nitrous oxide, or the like. The insulating layer can be formed by a thermal CVD method, a plasma CVD method, an atmospheric pressure CVD method, a bias ECR CVD method, a sputtering method, or the like.

In this embodiment mode, the first conductive film 106 functions as an etching stopper so that the gate electrode layer is formed to have a lamination structure. Next, the first conductive film 106 is etched using the first gate electrode layer 205 and the side wall 201 as a mask to form a second gate electrode layer 202. In this embodiment mode, a material which has a high etching selectivity between the first conductive film 106 and the second conductive film 107 is used; therefore, the first gate electrode layer 205 can be used as a mask when the first conductive film 106 is etched. In the case of using a material which does not have a high etching selectivity between the first conductive film 106 and the second conductive film 107, it is preferable that the insulating layer is left when the sidewall 201 is formed, a mask comprising a resist is formed over the first gate electrode layer 205, or the like. Protecting the first gate electrode layer 205 can prevent the first gate electrode layer 205 from being reduced when the first conductive film 106 is etched. An etching method may include a known dry-etching and wet-etching method. In this embodiment mode, a dry etching method is used. Note that a chlorine-based gas typified $Cl_2$, $BCl_3$, $SiCl_4$, and $CCl_4$; a fluorine-based gas typified by $CF_4$, $SF_6$, and $NF_3$; or $O_2$ can be appropriately used for the etching gas.

The semiconductor layer 102 is doped with an impurity element 253 for imparting n-type to have a vertical incident angle to the surface thereof, using the sidewall 201 and the first gate electrode layer 205 as a mask, thereby forming a second n-type impurity region 203a and a second n-type impurity region 203b (FIG. 2A). Here, the second n-type impurity region 203a and the second n-type impurity region 203b are formed to include the impurity elements for imparting n-type in a concentration of approximately $5 \times 10^{19}$ to $5 \times 10^{20}/cm^3$. In this embodiment mode, phosphorous (P) is used as the impurity elements for imparting n-type. Regions which are not doped with the impurity elements for imparting n-type, using the sidewall 201 as a mask become a third n-type impurity region 206a and a third n-type impurity region 206b. The third n-type impurity region 206a and the third n-type impurity region 206b are Lov regions, since they are covered with a second gate electrode 202. Note that a channel formation region 207 is formed over the semiconductor layer 102 (FIG. 2A).

The second n-type impurity region 203a and the second n-type impurity region 203b are high concentration impurity regions each which has a high concentration of the impurity elements for imparting n-type, and they function as a source region or a drain region. On the other hand, the third n-type impurity region 206a and the third n-type impurity region 206b are low concentration impurity regions. Then, an electrical field adjacent to a drain can be alleviated and deterioration of on-state current due to hot carriers can be controlled, since the third n-type impurity region 206a and the third n-type impurity region 206b are covered with the second gate electrode layer 202. Hereby, a semiconductor device capable of high speed operation can be formed.

Heat treatment, irradiation of intense light, or irradiation of laser light may be carried out in order to activate the impurity elements. Plasma damage to the gate insulating film or plasma damage to the interface between the gate insulating film and the semiconductor layers can be recovered simultaneously with the activation.

Next, an insulating film 108 containing hydrogen is formed as a passivation film. The insulating film 108 is formed with an insulating film containing silicon to a thickness from 100 nm to 200 nm by plasma CVD or sputtering. The insulating film 108 is not limited to a silicon nitride film, and a silicon nitride oxide (SiNO) film by plasma CVD, or a single layer or a stack of other insulating films containing silicon may be used.

Moreover, the step for hydrogenating the semiconductor layers is performed by heat treatment at a temperature of 300° C. to 550° C. for 1 hour to 12 hours under a nitrogen atmosphere. The step is preferably performed at a temperature of 400° C. to 500° C. The step is a step for terminating dangling bonds of the semiconductor layer due to hydrogen contained in the insulating film 108.

The insulating film 108 comprises a material selected from silicon nitride, silicon oxide, silicon oxynitride (SiON), silicon nitride oxide (SiNO), aluminum nitride (AlN), aluminum oxynitride (AlON), aluminum nitride oxide having more nitrogen content than oxygen content (AlNO), aluminum oxide, diamond like carbon (DLC), and a nitrogen-containing carbon film (CN) film. Alternatively, a material in which a skeletal structure is constructed by allowing silicon (Si) and oxygen (O) to bond with each other, and a substituent contains at least hydrogen, or at least one of fluorine, an alkyl group, and aromatic hydrocarbon (typically, a siloxane polymer) may be used.

Figure 2B:
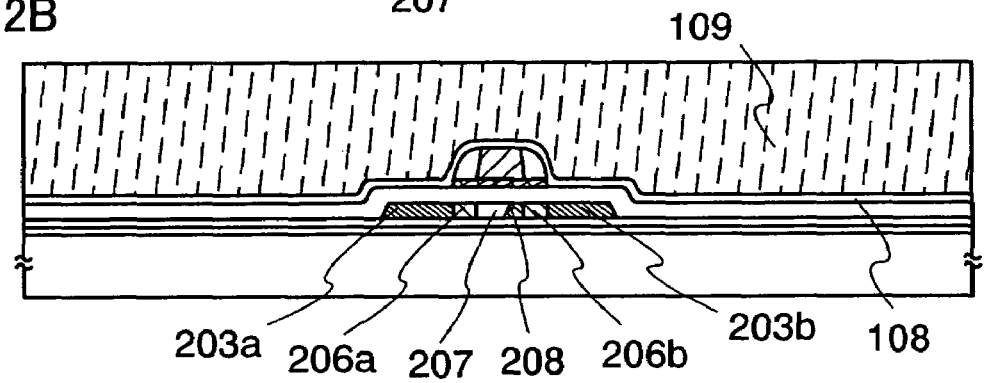
Figure 2C:
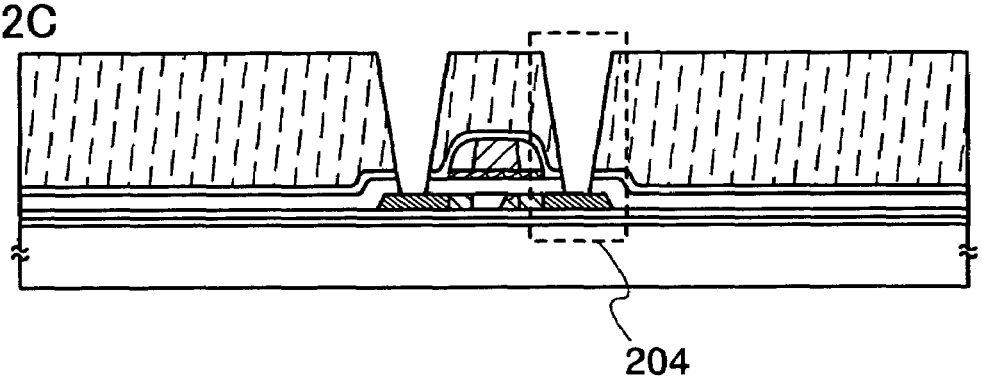

Then, an insulating layer 109 to be an interlayer insulating film is formed (FIG. 2B). According to the invention, an interlayer insulating film for planarization is required to be highly heat resistant and electrically insulative, and having high planarization coefficient. Such an interlayer insulating film is preferably formed by a coating method using a liquid typified by a spin coating method.

In this embodiment mode, a siloxane resin is used as a material of the insulating layer 109. The siloxane rein corresponds to a resin containing a Si—O—Si bond. Siloxane comprises a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. The film after bake can be referred to as a silicon oxide film containing alkyl (SiOx). This silicon oxide film containing alkyl (SiOx) can withstand heat treatment of 300° C. or more.

Dip lotion, spraying application, doctor knife, a roll coating machine, a curtain coating machine, a knife coating machine, a CVD method, a spin coating method, a vapor deposition method can be used for the insulating layer 109. In addition, the insulating layer 109 may be formed by a droplet discharge method. A material solution can be saved when a droplet discharge method is applied. A method capable of lithography or delineation of a pattern like a droplet discharge method, for example, a printing method (a method in which a pattern is formed such as screen printing or offset printing), or the like can also be used. An inorganic material may be used, and in this case, silicon oxide, silicon nitride, and silicon oxynitride may be used.

In addition to an insulating film in which a frame structure is constituted by bonding silicon (Si) and oxygen (O), the insulating layer 109 can also be formed using a film formed of a kind or a plural kinds of an inorganic material (silicon oxide, silicon nitride, silicon oxynitride, silicon nitride oxide, a PSG (phosphorous glass), a BPSG (boron phosphorous glass), an alumina film, or the like); a photosensitive or non-photosensitive organic material (organic resin material), such as (polyimide, acryl, polyamide, polyimide amide, benzocyclobutene, or the like); a resist; or a Low k material having low dielectric constant, or using a lamination of these materials.

A contact hole (opening portion) reaching the semiconductor layer 102 is formed using a mask of a resist in the insulating layer 109, the insulating film 108, and the gate insulating layer 105. Etching may be conducted once or multiple times according to the selectivity of used materials. A first etching is conducted on condition which is the high selectivity between the insulating layer 109/the insulating layer 108 and the gate insulating layer 105, thereby removing portions of the insulating layer 109 and the insulating layer 108. A second etching removes portions of the gate insulating layer 105, thereby forming an opening portion 204 reaching the second n-type impurity region 203a and the second n-type impurity region 203b which are a source region or a drain region.

In the first etching for removing the portions of the insulating layer 109 and the insulating film 108, a wet etching or a dry etching is conducted. An inert gas may be added into an used etching gas. An element or plural elements of He, Ne, Ar, Kr, and Xe can be used for an inert element to be used. Specifically, it is preferable to use argon having a comparatively large atomic radius and which is inexpensive. In this embodiment mode, $CF_4$, $O_2$, He, and Ar are used. An etching condition during dry etching is set in a flow rate of $CF_4$ to be 380 sccm; a flow rate of $O_2$, 290 sccm; a flow rate of He, 500 sccm; a flow rate of Ar, 500 sccm; a RF power, 3000 W; and a pressure, 25 Pa. According to the above condition, an etching residue can be decreased;

By increasing the etching time at a rate of approximately 10% to 20%, over-etching may be conducted in order to conducting the etching without leaving a residue on the gate insulating layer 105. A taper shape may be formed by etching the insulating layer 109 just once or by etching it for several times. A taper shape may be formed by carrying out the second dry etching, further using $CF_4$, $O_2$, and He in a flow rate of $CF_4$ to be 550 sccm; a flow rate of $O_2$, 450 sccm; a flow rate of He, 350 sccm; a RF power, 3000 W; and a pressure, 25 Pa.

The gate insulating layer 105 is etched by the second etching to form an opening portion reaching the source region and the drain region. The opening portion may be formed by forming a mask after etching the insulating layer 109 or by etching the insulating film 108 and the gate insulating layer 105, using the etched insulating layer 109 as a mask. The gate insulating layer 105 is etched using $CHF_3$ and Ar as an etching gas. Through the etching according to the above conditions, an etching residue is reduced, and a flat contact hole with few depressions can be formed. Note that the etching time is preferably increased at a rate of approximately 10% to 20% in order to conducting etching without leaving a residue over the semiconductor layer.

A conductive film is formed and then etched to form a source or drain electrode layer 112 electrically connected to a part of each source or drain region. This source or drain electrode layer 112 is in contact with a later formed wiring or the like, and connects the thin film transistor to the wiring. The source or drain electrode layer 112 can be formed by forming a conductive film by a PVD method, a CVD method, a vapor deposition method, or the like, and etching the conductive film into a desired shape. The conductive layer can be formed at a predetermined position by a droplet discharging method, a printing method, an electroplating method, or the like. Moreover, a reflow method or a damascene method can be used. As a material for the source or drain region layer 112, metal such as Ag, Au, Cu, Ni, Pt, Pd, Ir, Rh, W, Al, Ta, Mo, Cd, Zn, Fe, Ti, Si, Ge, Zr, or Ba; alloys of the foregoing metal; or metal nitride of the foregoing metal is used. In addition, a lamination structure of these materials may be adopted. In this embodiment mode, Ti, Al, and Ti are stacked and the lamination is patterned into a desired shape to formed the source or drain electrode layer 112.

Figure 2D:
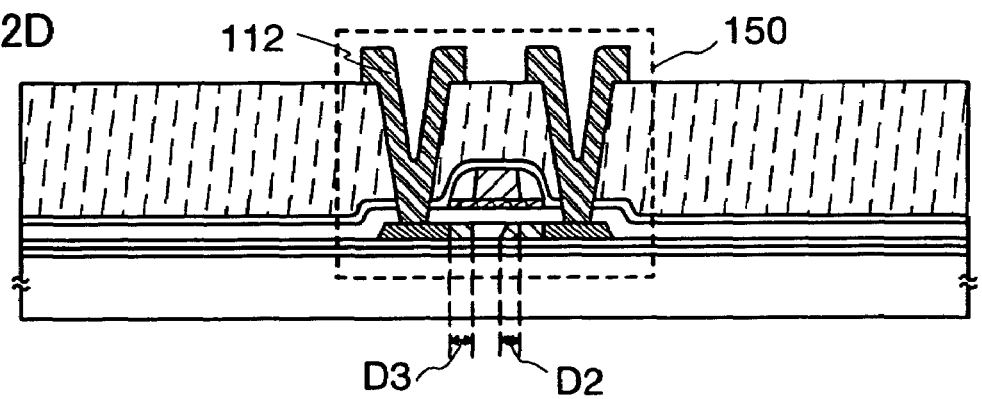

By the above-mentioned steps, the second layer can be provided with a thin film transistor 150 having the second n-type impurity region 203a and the second n-type impurity region 203b which are high concentration impurity regions, the third n-type impurity region 206a and the third n-type impurity region 206b which are low concentration impurity regions, the second p-type impurity region 208, and the channel formation region 207 (FIG. 2D). In FIG. 2D, a width D2 of the second p-type impurity region 208 is preferably 5 nm to 200 nm, and a width of the third n-type impurity region 206a and the third n-type impurity region 206b is preferably 10 nm to 200 nm. Threshold value is shifted by setting the width D2 of the second p-type impurity region and the width D3 of the third n-type impurity region 206a in the above described range and an n-channel thin film transistor capable of cutoff current can be manufactured.

In this embodiment mode, a low concentration p-type impurity region is formed in a p-channel thin film transistor; however, a low concentration n-type impurity region may be formed in a p-channel thin film transistor in a similarly way. Additionally, a second p-type impurity region 208 in an n-channel thin film transistor 150 manufactured in this embodiment mode may be doped with an impurity element for imparting n-type to form an n-type impurity region. In this case, an n-channel thin film transistor having an n-type impurity region can be formed in either Lov region of a source side or a drain side. Similarly, a p-channel thin film transistor is obliquely doped to form a p-type impurity region, as enables a thin film transistor providing a p-type impurity region with either Lov region of a source side or a drain side.

The following method can separate the thin film transistor 150 from the substrate 100 illustrated in FIGS. 1A to 1E and 2A and 2D. As a method for separating, 1) a method that uses a substrate having heat resistance at approximately 300 to 500° C. as a substrate 100, provides a metal oxide film between the substrate 100 and the thin film transistor 150, and makes the metal oxide film be fragile to separate the thin film transistor 150; 2) a method that provides an amorphous silicon film containing hydrogen between the substrate 100 and the thin film transistor 148, and removes the amorphous silicon film to separate the thin film transistor 150; 3) a method that removes mechanically the substrate 100 provided with the thin film transistor 150, or remove the thin film transistor 150 by etching with solution or gas such as $CF_3$ to separate the thin film transistor 150; or the like can be nominated. In addition, the separated thin film transistor 150 can be pasted to various materials for several purposes. The thin film transistor 150 may be pasted onto a flexible substrate, using a commercially available adhesive agent, for example, an adhesive agent such as epoxy resin based adhesive agent or resin additive.

As noted above, by pasting the separate thin film transistor 150 onto the flexible substrate, a semiconductor device that is thin, lightweight, and hard to break when falling can be manufactured. Additionally, the flexible substrate has flexible property; therefore, the flexible substrate can be pasted to a curved surface and depressions, thereby realizing a wide variety of uses. In addition, the thin film transistor manufactured in this embodiment mode has a sidewall structure; therefore, a LDD region can be also formed in a thin film transistor having a submicron structure.

In this embodiment mode, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. In this embodiment mode, a thin film transistor is an n-channel thin film transistor having a low concentration p-type impurity region; therefore, a semiconductor device capable of high speed operation and reducing power consumption can be formed.

Additionally, the semiconductor device manufactured in this embodiment mode can be formed using a crystalline semiconductor film; therefore, the semiconductor device can be formed without using an expensive single crystal semiconductor substrate. Thus, cost can be reduced. In addition, the thin film transistor 150 manufactured in this embodiment mode is peeled and then adhered to a flexible substrate, thereby enabling a thin semiconductor device to be manufactured.

Embodiment Mode 2

An embodiment mode of the invention is described with reference to FIGS. 1A to 1E, 2A to 2D, 29A, and 29B. This embodiment mode describes a case where a different incident angle θ1 of an impurity element added to a semiconductor layer is used in the semiconductor device manufactured in Embodiment Mode 1. Then, repeated descriptions of the same portion and the portion having the same function are omitted.

As described in Embodiment Mode 1, a semiconductor layer 102, a gate insulating layer 105, a conductive film 106, and a first gate electrode layer 205 are formed over a substrate 100.

Figure 29A:
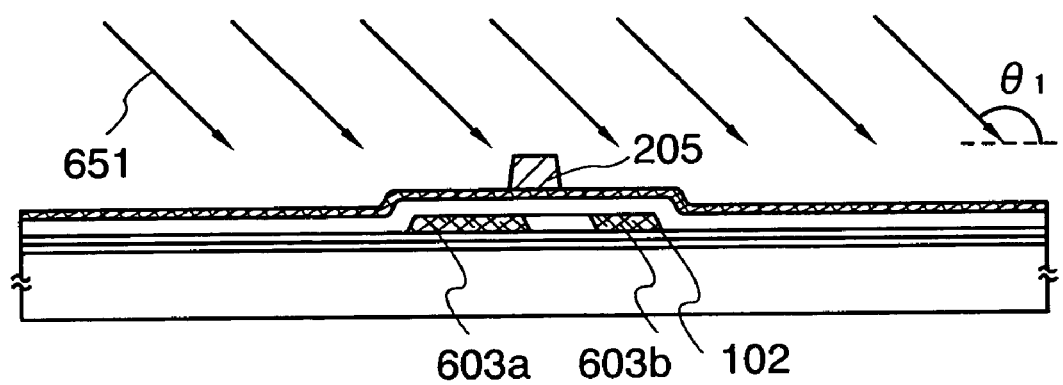
FIGS. 29A and 29B are diagrams for describing a manufacturing method of a semiconductor device of the invention.

In Embodiment Mode 1, the incident angle θ1 of the impurity element added to a semiconductor layer is set at 30° to 90°. In this embodiment mode, the incident angle θ1 is set at 90° to 150°. The semiconductor layer is obliquely doped with an impurity element 651 for imparting p-type, to the surface thereof Therefore, a region covered with the first gate electrode layer 205 in the semiconductor layer 102 is also doped, thereby forming a first p-type impurity region 603a (FIG. 29A). However, some impurity elements for imparting p-type are blocked by the first gate electrode layer 205; therefore, the first p-type impurity region 603b is not formed in the region covered with the first gate electrode layer 205. In other words, a p-type impurity region is selectively formed in the semiconductor layer 102, thereby forming the first p-type impurity region 603a and the first p-type impurity region 603b (FIG. 29A). The doping is conducted so that the first p-type impurity region 603a and the first p-type impurity region 603b include the impurity elements for imparting p-type to be a concentration of approximately $5\times10^{17}$ to $5\times10^{18}/cm^3$. In addition, the concentration thereof may be set at approximately $5\times10^{16}$ to $5\times10^{17}/cm^3$. In this embodiment mode, boron (B) is used as the impurity element for imparting p-type.

Figure 29B:
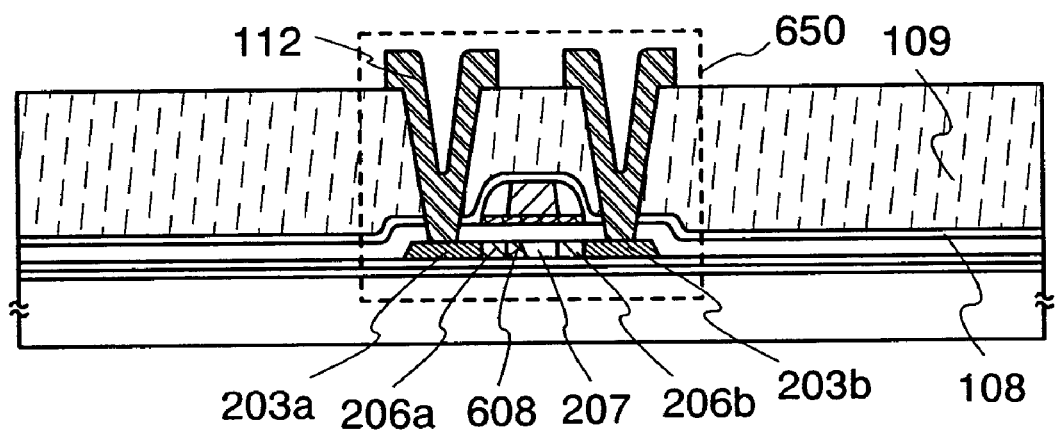

FIG. 29B shows a thin film transistor 650 manufactured in this embodiment mode. In this embodiment mode, the incident angle θ1 of the impurity element 651 for imparting p-type is set at 90° to 150°; therefore, a second p-type impurity region 608 which is a low concentration p-type impurity region is formed between a third n-type impurity region 206a and a channel formation region 207. As described above, controlling the incident angle θ to the semiconductor layer enables a thin film transistor which has a different structure of the impurity region to be manufactured and electrical characteristics of the thin film transistor to be controlled.

According to the invention, a semiconductor layer is provided with impurity regions having impurity elements for imparting different conductivity types; therefore, properties of a thin film transistor can be minutely controlled. This enables a thin film transistor having required functions to be formed by brief steps and a semiconductor device with high reliability and better electrical characteristics to be manufactured at a low cost. In this embodiment mode, a thin film transistor is an n-channel thin film transistor having a low concentration p-type impurity region; therefore, a semiconductor device capable of high speed operation and reducing power consumption can be formed.

Embodiment Mode 3

An embodiment mode of the invention is described with reference to FIGS. 4A to 4D and 5A to 5D. This embodiment mode describes a case where structures in a gate electrode layer and an impurity region in a semiconductor layer of a thin film transistor 150 are different from those of the semiconductor device manufactured in Embodiment Mode 1. Then, repeated descriptions of the same portion and the portion having the same function are omitted.

Figure 4A:
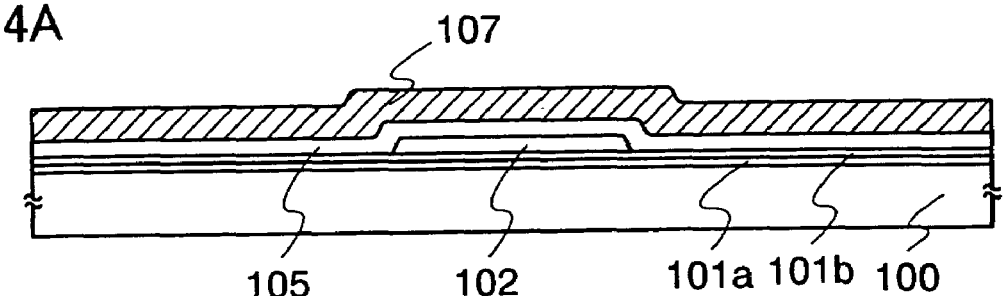
FIGS. 4A to 4D are diagrams for describing a manufacturing method of a semiconductor device of the invention.

As in Embodiment Mode 1, a base film 101a and a base film 101b are stacked as a base film over a substrate 100 and then a semiconductor layer 102 is formed. An amorphous semiconductor film is irradiated with laser light to be crystallized, and then a formed crystalline semiconductor film is patterned to form the semiconductor layer 102. A gate insulating layer 105 is formed over the semiconductor layer 102 and a second conductive film 107 is formed (FIG. 4A). In Embodiment Mode, a first conductive film 106 is formed so that a gate electrode layer has a lamination structure; however, in this embodiment mode, only the second conductive film 107 is formed so that the gate electrode layer has a single layer structure.

Figure 4B:
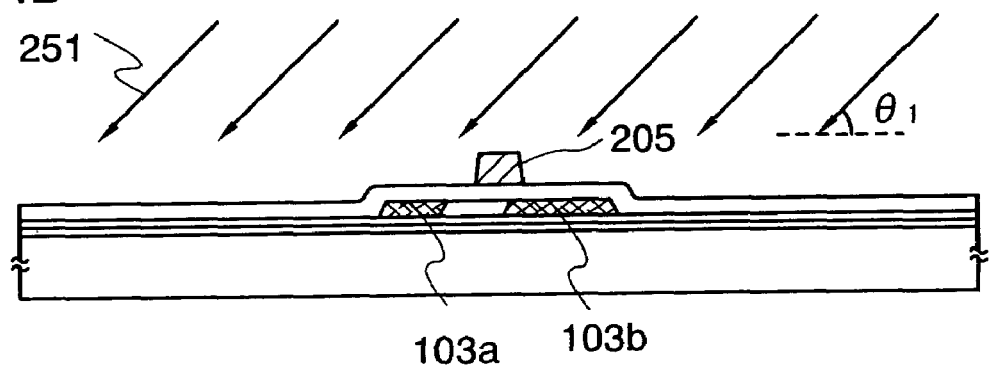

The second conductive film 107 is etched to be a thin line as shown in FIGS. 3A to 3F, thereby forming a first gate electrode layer 205. The semiconductor layer 102 is doped with an impurity element 251 for imparting p-type obliquely to the surface thereof at the incident angle θ1 of 30° to 90° or 90° to 150°, using the first gate electrode layer 205 as a mask, thereby forming a first p-type impurity region 103a and a first p-type impurity region 103b (FIG. 4B). The semiconductor layer is doped obliquely with the impurity element 251 for imparting p-type. Therefore, the first p-type impurity region 103b is also formed in a portion covered with the first gate electrode layer 205 in the semiconductor layer 102. However, some of the impurity elements 251 for imparting p-type are blocked by the first gate electrode layer 205 which functions as a mask; therefore, the first p-type impurity region 103a is not formed in a region under the first gate electrode layer 205 in the semiconductor layer.

Figure 4C:
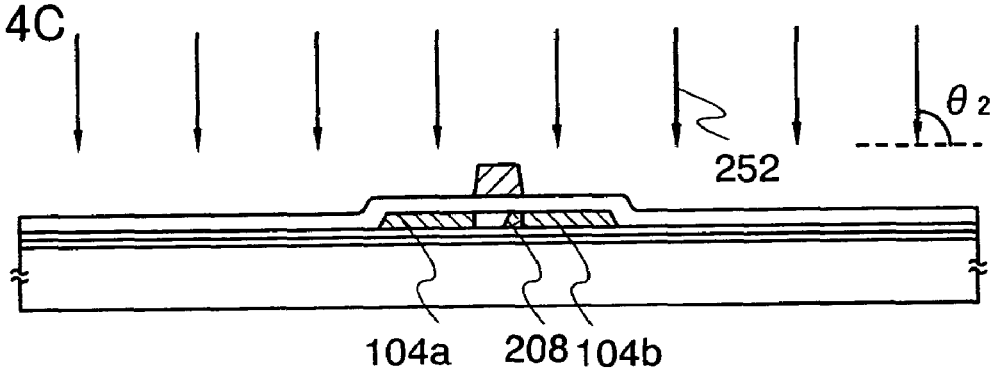

Next, the semiconductor layer 102 is doped with an impurity element for imparting n-type at the incident angle θ2 to the surface thereof, using the first gate electrode layer 205 as a mask, thereby forming a first n-type impurity region 104a and a first n-type impurity region 104b (FIG. 4C). The angular difference between the angle θ2 and the angle θ1 is set at 5° or more. Regions to be the first n-type impurity region 104a and the first n-type impurity region 104b have been doped with the impurity element for imparting p-type; therefore, they are required to be doped with an impurity element for imparting n-type in order to be changed into n-type impurity regions. A portion to be covered with the first gate electrode layer in the semiconductor layer is not doped with an impurity element 252 for imparting n-type. The reason is that the impurity element 252 is blocked by the first gate electrode layer 205 since the impurity element 252 is added nearly vertically. Therefore, a part of the first p-type impurity region formed in a portion of a semiconductor layer covered the first gate electrode 205 is left, and becomes a second p-type impurity region 208.

Figure 4D:
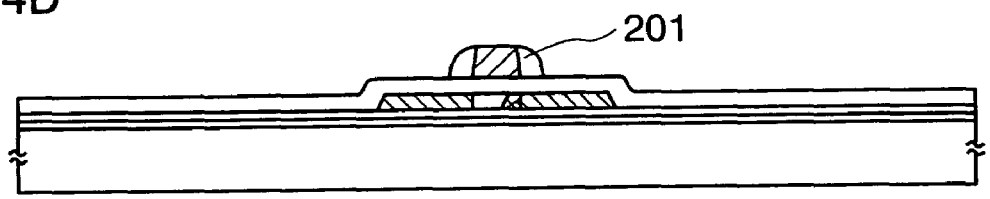
Figure 5A:
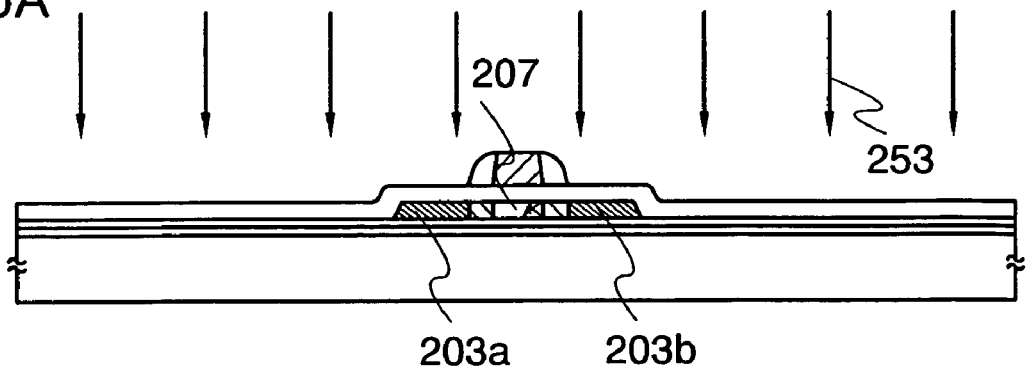
FIGS. 5A to 5D are diagrams for describing a manufacturing method of a semiconductor device of the invention.

A sidewall 201 is formed on a side surface of the first gate electrode layer 205 by forming an insulating layer over the gate insulating layer 105 and the first gate electrode layer 205 and conducting anisotropic etching (FIG. 4D). The semiconductor layer 102 is doped with an impurity element 253 for imparting n-type to have about the same incident angle as the incident angle θ2 to the surface thereof, using the sidewall 201 and the first gate electrode layer 205 as a mask, to form a second n-type impurity region 203a and a second n-type impurity region 203b (FIG. 5A). Portions covered with the sidewalls are not doped with the impurity elements 253 for imparting n-type, and becomes a third n-type impurity region 206a and a third n-type impurity region 206b which are low concentration n-type regions. Note that a channel formation region 207 is formed in the semiconductor layer 102. The second n-type impurity region 203a and the second n-type impurity region 203b function as a source region or a drain region, since they are high concentration impurity regions. In Embodiment Mode 1 where the gate electrode layer has a lamination structure, the third n-type impurity region 206a and the third n-type impurity region 206b are Lov regions, since they are covered with a second gate electrode 202 with the gate insulating layer 105 therebetween. In this embodiment mode, the third n-type impurity region 206a and the third n-type impurity region 206b are Loff regions, since the second gate electrode layer 202 is not formed thereover. As described above, changing the structure of the gate electrode layer enables to control the structure of the formed impurity regions. Then, the properties of the thin film transistor can be set to have a degree of freedom.

Figure 5B:
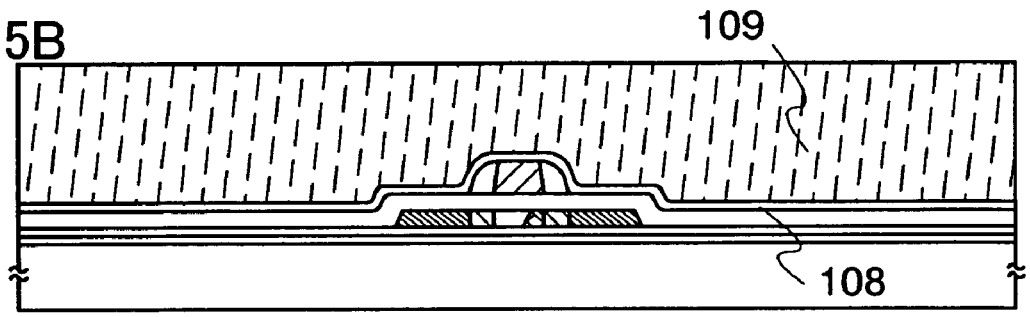

An insulating film 108 for hydrogenation is appropriately formed by heat treatment, laser irradiation, or the like for activating an impurity element. Hydrogenation is conducted by heat treatment, and then an insulating layer 109 is formed (FIG. 5B). The heat treatment for activating an impurity element may be conducted in conjunction with the heat treatment for hydrogenation; therefore, steps can be simplified.

Figure 5C:
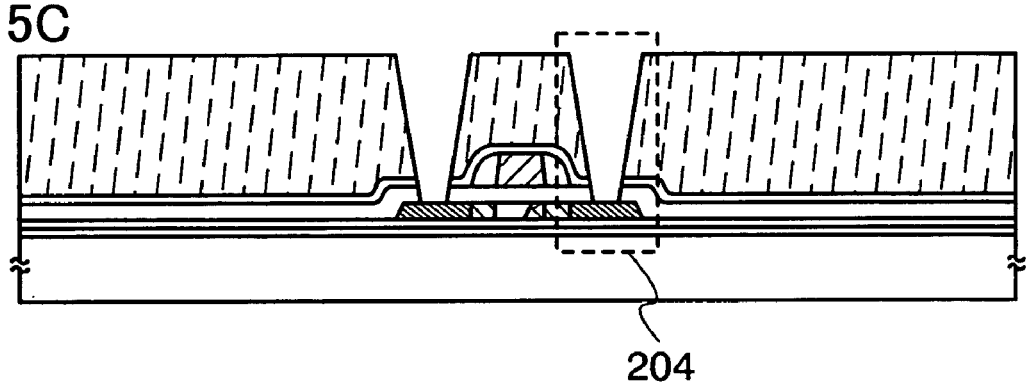
Figure 5D:
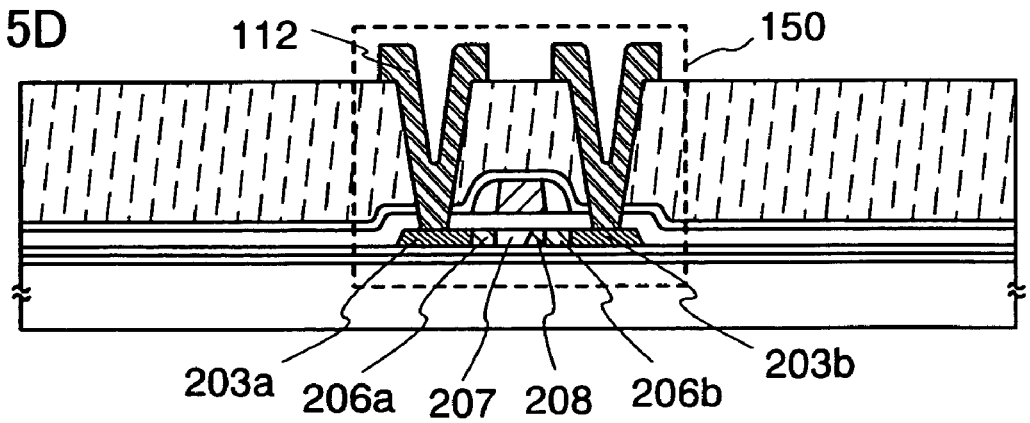

An opening portion (contact hole) 204 reaching a source region and a drain region is formed in the insulating layer 109, the insulating film 108, and the gate insulating layer 105 (FIG. 5C). A source or drain electrode layer 112 being in contact with a source region or a drain region is formed in the opening portion 204. Then, a thin film transistor 150 is formed in this embodiment mode (FIG. 5D).

According to the invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. In this embodiment mode, a thin film transistor is an n-channel thin film transistor having a low concentration p-type impurity region; therefore, a semiconductor device capable of high speed operation and reducing power consumption can be formed.

This embodiment mode can be implemented in combination with each of Embodiment Modes 1 and 2.

Embodiment Mode 4

An embodiment mode of the invention is described with reference to FIGS. 6A to 6D, 7A to 7D, 15A, and 15B. This embodiment mode describes an example where a processor such as a CPU is manufactured as a semiconductor device provided with the thin film transistor 150 formed in Embodiment Mode 1, an n-channel thin film transistor, and a p-channel thin film transistor over the same substrate. Then, repeated descriptions of the same portion and the portion having the same function are omitted.

As shown in Embodiment Mode 1, a base film 301a and a base film 301b are stacked as a base film over a substrate 300 and a semiconductor layer 302, a semiconductor layer 303, and a semiconductor layer 304 are formed. An amorphous semiconductor film is irradiated with laser light to be crystallized, and then a formed crystalline semiconductor film is patterned to form the semiconductor layer 302, the semiconductor layer 303, and the semiconductor layer 304. In this embodiment mode, a semiconductor layer comprises silicon, and a crystalline silicon film having a crystal grain continuously grown is formed by irradiating an amorphous silicon film with laser light.

Figure 15A:
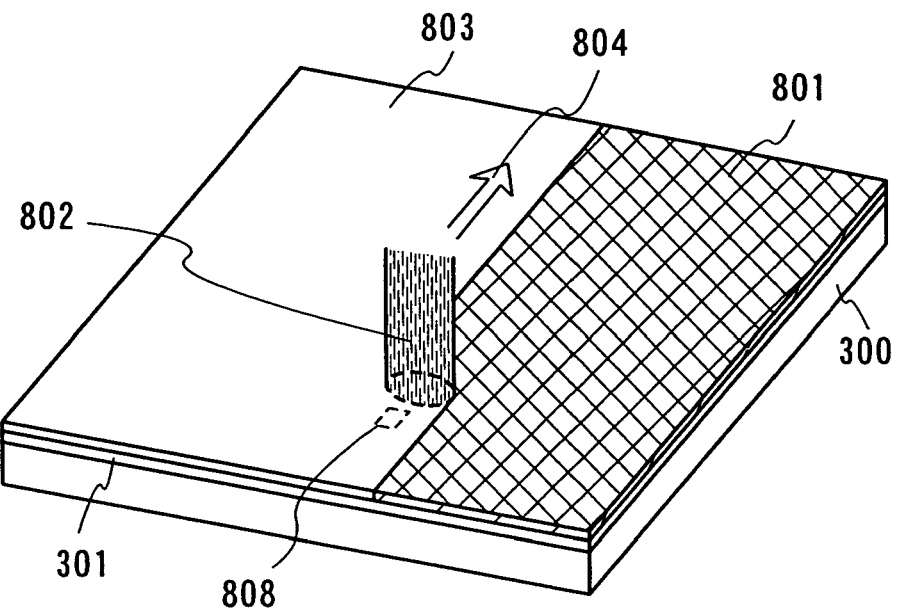
FIGS. 15A and 15B are diagrams for describing a manufacturing method of a semiconductor device of the invention.
Figure 15B:
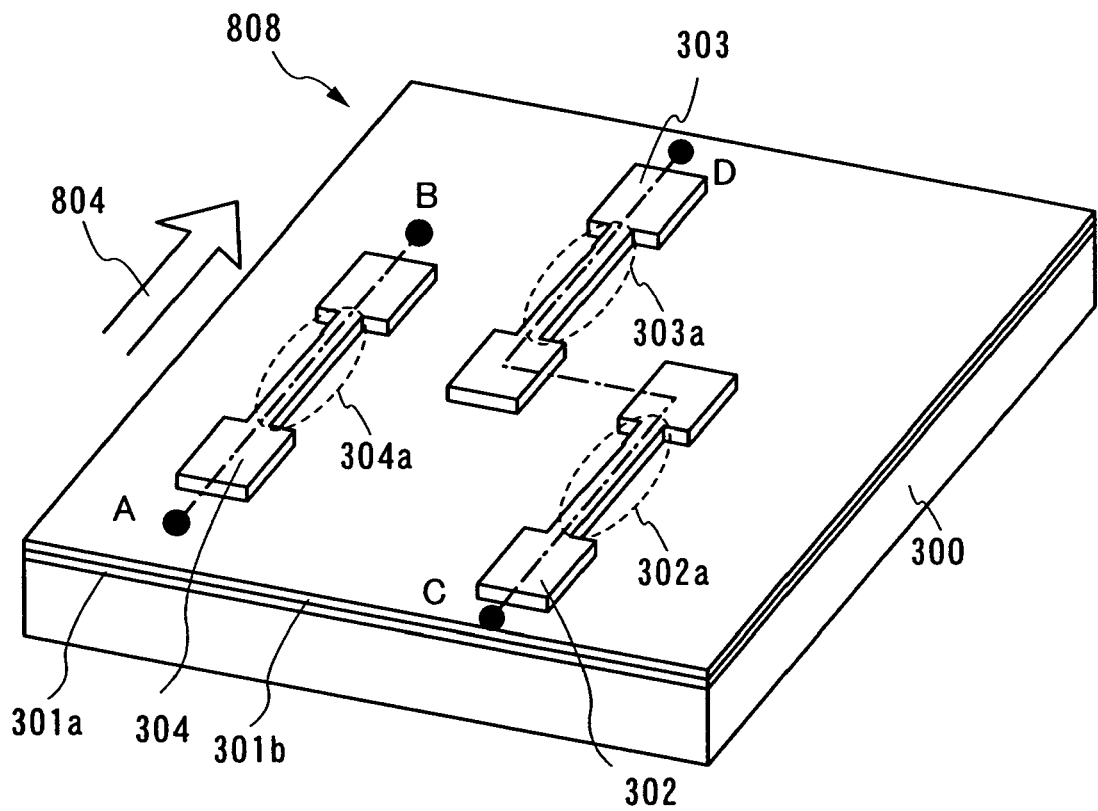

A crystallization method of a semiconductor layer in this embodiment mode is described with reference to FIGS. 15A and 15B. FIG. 15A is a perspective view of a substrate provided with a semiconductor layer in this embodiment mode, and FIG. 15B is an enlarged view of a region 808 which is a part of a crystalline semiconductor film in FIG. 15A. The semiconductor layer 302, the semiconductor layer 303, and the semiconductor layer 304 in FIG. 15B correspond to semiconductor layers of a thin film transistor in FIGS. 6A to 6D and 7A to 7D. FIGS. 6A to 6D and 7A to 7D are cross sectional views in lines A-B and C-D in FIG. 15B.

The base film 301a and the case film 301b are firmed over the substrate 300, and an amorphous semiconductor film 801 is formed over the base film. In FIG. 15A, the base film 301a and the base film 301b are referred to as a base film 301 collectively. An amorphous semiconductor film 801 is irradiated with laser light 802 to form a crystalline semiconductor film 803. In this embodiment mode, as shown in FIG. 15A, the amorphous semiconductor film 801 is irradiated with pulsed laser light at a repetition rate of 80 MHz, thereby forming the crystalline semiconductor film 803 having crystalline grains continuously grown toward a scanning direction 804 shown in an arrow. A crystal grain of a single crystal which is long extended along a scanning direction is formed, thereby becoming it possible to form a semiconductor film having little crystal grain boundary at least which prevents a carrier of a thin film transistor from moving.

Next, as shown in FIG. 6A, a mask is formed over the crystalline semiconductor film by a photolithography method and a part of the crystalline semiconductor film is etched using the mask, thereby forming the semiconductor layer 302, the semiconductor layer 303, and the semiconductor layer 304. Note that the etching is conducted to the semiconductor layer 302, the semiconductor layer 303, and the semiconductor layer 304 so that a channel formation region of a subsequently formed thin film transistor is formed parallel to the scanning direction 804 of the laser light 802.

As shown in FIG. 15B, a channel formation region 302a, and a channel formation region 303a, and a channel formation region 304a of the semiconductor layer 302, the semiconductor layer 303, and the semiconductor layer 304 are respectively parallel to the scanning direction 804 of the laser light. The semiconductor layer 302 functions as an active region of a subsequently formed p-channel thin film transistor 330; the semiconductor layer 303 functions as an active region a subsequently formed n-channel thin film transistor 331; and the semiconductor layer 304 functions as an active region of a subsequently formed n-channel thin film transistor having a low concentration p-type impurity region.

A gate insulating layer 395, a first conductive film 396, and a second conductive film 397 are formed over the semiconductor layer 302, the semiconductor layer 303, and the semiconductor layer 304 (FIG. 6A). In this embodiment mode, a thin silicon oxide film of 2 to 5 nm thick is formed as a first insulating film over the semiconductor layer 302, the semiconductor layer 303, and the semiconductor layer 304 by a GRTA (gas rapid thermal anneal) method. A silicon nitride film, a silicon oxide film, and a silicon nitride film are stacked over the first insulating film and used as a gate insulating layer 395. The first conductive film 396 comprises TaN and the second conductive film 397 comprises W, by a sputtering method.

The second conductive film 397 is etched to be a thin line as shown in FIGS. 3A to 3F, thereby forming a first gate electrode layer 305, a first gate electrode layer 306, and a first gate electrode layer 307. A mask 361 comprising a resist is formed so as to cover the semiconductor layer 302 and the semiconductor layer 303.

The semiconductor layer 304 is doped with an impurity element 351 for imparting p-type obliquely at the incident angle θ1 of 30° to 90° or 90° to 150° to the surface thereof, using the first gate electrode layer 307 as a mask, thereby forming a first p-type impurity region 308a and a first p-type impurity region 308b (FIG. 6B). Since the semiconductor layer is doped obliquely with the impurity element 351 for imparting p-type, the first p-type impurity region 308b is also formed in a portion covered with the first gate electrode layer 307 in the semiconductor layer 304. However, the impurity element 351 for imparting p-type is blocked by the first gate electrode layer 307 which functions as a mask; therefore, the first p-type impurity region 308a is not formed in a region under the first gate electrode layer 307 in the semiconductor layer 304. The doping is conducted so that the first p-type impurity region 308a and the first p-type impurity region 308b include the impurity elements for imparting p-type at a concentration of approximately $5\times10^{17}$ to $5\times10^{18}/cm^3$. In addition, the concentration thereof may be set at approximately $5\times10^{16}$ to $1\times10^{17}/cm^3$. In this embodiment mode, boron (B) is used as the impurity element for imparting p-type.

Next, the mask 361 is removed and a mask 362 comprising a resist is formed to cover the semiconductor layer 302. The mask 362 may be newly formed or may be formed by processing the mask 361. The semiconductor layer 303 and the semiconductor layer 304 are doped with an impurity element for imparting n-type, using the first gate electrode layer 306 and the first gate electrode layer 307 as masks in an incident angle θ2 to the surfaces thereof which is set at almost 90°, thereby forming a first n-type impurity region 309a, a first n-type impurity region 309b, a first n-type impurity region 310a, and a first n-type impurity region 310b (FIG. 6C). The angular difference between the angle θ2 and the angle θ1 is set at 5° or more. The first p-type impurity region 308a and the first p-type impurity region 308b have been doped with the impurity element for imparting p-type; therefore, they are required to be doped with an impurity element for imparting n-type in order to be changed into an n-type impurity region. The first n-type impurity region 309a, the first n-type impurity region 309b, the first n-type impurity region 310a, and the first n-type impurity region 310b include the impurity elements for imparting n-type in a concentration of $1 \times 10^{17}$ to $5 \times 10^{18}/cm^3$. In this embodiment mode, phosphorous (P) is used as the impurity elements for imparting n-type. Regions covered with the first gate electrode layer 306 and the first gate electrode layer 307 in the semiconductor layer 303 and the semiconductor layer 304 are not doped with the impurity element 352. The reason is that the impurity element 352 is blocked by the first gate electrode layer 306 and the first gate electrode layer 307, since the impurity element 352 is added nearly vertically. Therefore, a part of the first p-type impurity region under the first gate electrode layer 307 is left, and becomes a second p-type impurity region 324. The second p-type impurity region 324 is formed as an Lov region.

The mask 362 is removed by etching or the like. An insulating layer is formed over the first conductive film 396, the first gate electrode layer 305, the first gate electrode layer 306, and the first gate electrode layer 307, and anisotropic etching is conducted. Then, a sidewall 311, a sidewall 312, and a sidewall 313 are formed on side surfaces of the first gate electrode layer 305, the first gate electrode layer 306, and the first gate electrode layer 307. In this embodiment mode, silicon oxide film is used as an insulating layer for forming a sidewall. Next, the first conductive film 396 is etched using the first gate electrode layer 305, the first gate electrode layer 306, the first gate electrode layer 307, the side wall 311, the side wall 312, and the side wall 313 as a mask, thereby forming a second gate electrode layer 380, a second gate electrode layer 381, and a second gate electrode layer 382 (FIG. 6D). In this embodiment mode, materials which have high etching selectivity between the first conductive film 396 and the second conductive film 397 is used; therefore, the first gate electrode layer 305, the first gate electrode layer 306, and the first gate electrode layer 307 can be used as masks when the first conductive film 396 is etched. In the case of using materials which do not have high etching selectivity between the first conductive film 396 and the second conductive film 397, when the sidewall 311, the sidewall 312, and the sidewall 313 are formed, it may be preferable that the insulating layer is left over the first gate electrode layer 305, the first gate electrode layer 306, and the first gate electrode layer 307, that a protective film is formed over the gate electrode layers, or that masks comprising a resist are formed over the first gate electrode layer 305, the first gate electrode layer 306, and the first gate electrode layer 307. Protecting the first gate electrode layer 305, the first gate electrode layer 306, and the first gate electrode layer 307 can prevent the first gate electrode layer 305, the first gate electrode layer 306, and the first gate electrode layer 307 from being reduced, when the first conductive film 396 is etched.

Figure 7A:
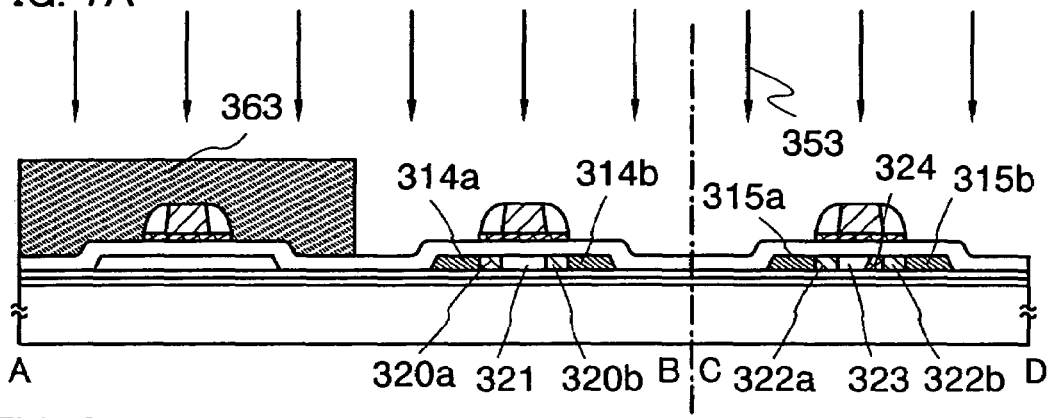
FIGS. 7A to 7D are diagrams for describing a manufacturing method of a semiconductor device of the invention.

A mask 363 comprising a resist is formed to cover the semiconductor layer 302. The semiconductor layer 303 and the semiconductor layer 304 are doped with an impurity element 353 for imparting n-type to have a near-vertical incident angle to the surfaces thereof, using the sidewall 312, the sidewall 313, the first gate electrode layer 306, and the first gate electrode layer 307 as masks, thereby forming a second n-type impurity region 314a, a second n-type impurity region 314b, a second n-type impurity region 315a, and a second n-type impurity region 315b (FIG. 7A). Portions of the semiconductor layers which are covered with the sidewalls are not doped with the impurity element 353 for imparting n-type; therefore, they become a third n-type impurity region 320a, a third n-type impurity region 320b, a third n-type impurity region 322a, and a third n-type impurity region 322b as low concentration n-type impurity regions. Also, a channel formation region 321 and a channel formation region 323 are formed in the semiconductor layer 303 and the semiconductor layer 304. The second n-type impurity region 314a, the second n-type impurity region 314b, the second n-type impurity region 315a, and the second n-type impurity region 315b are high concentration impurity regions; therefore, they function as a source region or a drain region. Here, the second n-type impurity region 314a, the second n-type impurity region 314b, the second n-type impurity region 315a, and the second n-type impurity region 315b include the impurity elements for imparting n-type in a concentration of approximately $5 \times 10^{19}$ to $5 \times 10^{20}/cm^3$. In this embodiment mode, phosphorous (P) is used as the impurity element for imparting n-type.

On the other hand, the third n-type impurity region 320a, the third n-type impurity region 320b, the third n-type impurity region 322a, and the third n-type impurity region 322b which are low concentration impurity regions are Lov regions which are covered with the second gate electrode layer 381 and the second gate electrode layer 382. Therefore, an electric field adjacent to a drain can be relieved and deterioration of on-state current due to hot carriers can be controlled. Hereby, a semiconductor device capable of high speed operation can be formed.

Figure 7B:
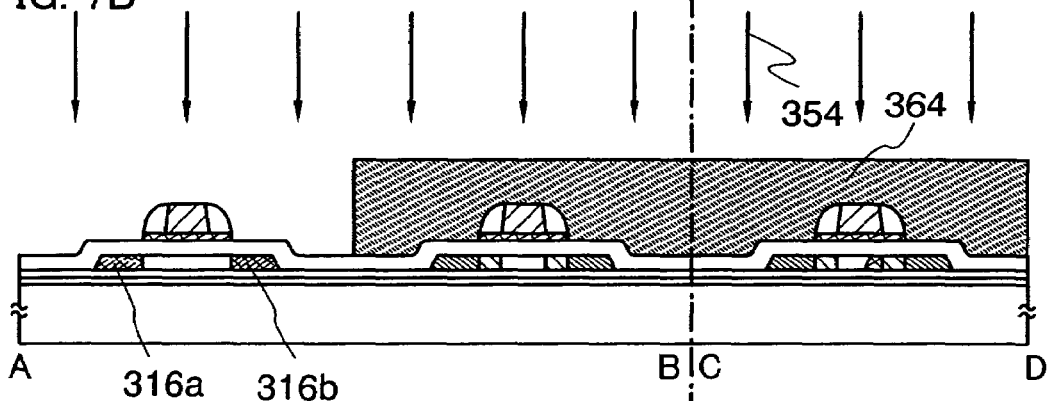

A mask 364 comprising a resist is formed to cover the semiconductor layer 303 and the semiconductor layer 304. The semiconductor layer 302 is doped with an impurity element 354 for imparting p-type at a vertical incident angle to the surface thereof, using the mask 364, the sidewall 311, and the first gate electrode layer 305 as a mask to form a third p-type impurity region 316a and a third p-type impurity region 316b (FIG. 7B). Here, the doping is conducted so that the third p-type impurity region 316a and the third p-type impurity region 316b include the impurity elements for imparting p-type at a concentration of approximately $1 \times 10^{20}$ to $5 \times 10^{21}/cm^3$. In this embodiment mode, boron (B) is used as the impurity element for imparting p-type.

A portion of the second gate electrode layer 380 which is exposed by removing the sidewall 311 is etched using the first gate electrode layer 305 as a mask. Then, a second gate electrode layer 383 having appropriately the same width as the first gate electrode layer 305 is formed. When the gate insulating layer 395 is formed of the same material as the side wall 311 in this etching step, a mask for covering the gate insulating layer 395 except for the sidewall 311 and the first gate electrode layer 305 may be formed.

Figure 7C:
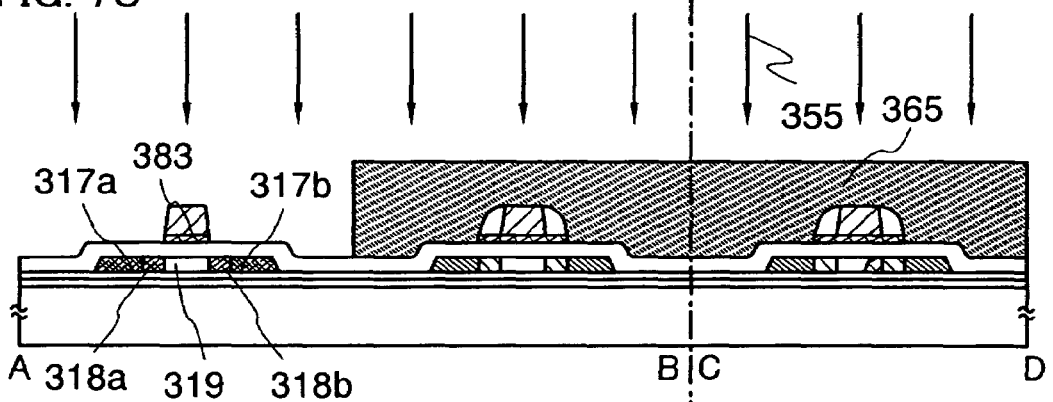

A mask 365 comprising a resist is formed to cover the semiconductor layer 303 and the semiconductor layer 304. The mask 365 may be formed using the mask 364 without removing it, may be formed by processing the mask 364, or may be formed newly, of course. The semiconductor layer 302 is doped with an impurity element 355 for imparting p-type at a vertical incident angle to the surface thereof, using the mask 365 and the first gate electrode layer 305 as a mask, thereby forming a fourth p-type impurity region 317a, a fourth p-type impurity region 317b, a fifth p-type impurity region 318a, and a fifth p-type impurity region 318b (FIG. 7C). Here, the doping is conducted so that the fourth p-type impurity region 317a and the fourth p-type impurity region 317b include the impurity elements for imparting p-type to be a concentration of approximately $1 \times 10^{20}$ to $5 \times 10^{21}/cm^3$. And the doping is conducted so that the fifth p-type impurity region 318a and the fifth p-type impurity region 318b include the impurity elements for imparting p-type to be a concentration of approximately $5 \times 10^{18}$ to $5 \times 10^{19}/cm^3$. In this embodiment mode, boron (B) is used as the impurity element for imparting p-type. Note that a channel formation region 319 is formed in the semiconductor layer 302.

The fourth p-type impurity region 317a and the fourth p-type impurity region 317b are high concentration impurity regions; therefore, they function as a source region or a drain region. On the other hand, the fifth p-type impurity region 318a and the fifth p-type impurity region 318b which are low concentration impurity regions are Loff regions which are not covered with the gate electrode layer. Therefore, an electric field adjacent to a drain can be relieved and deterioration due to hot carrier injection can be prevented, and additionally, off-state current can be reduced. Hereby, a semiconductor device with high reliability and low power consumption can be formed.

Heat treatment, laser irradiation, or the like is performed for activating an impurity element and then an insulating film 325 for hydrogenation is formed. Hydrogenation is conducted by heat treatment to form an insulating layer 326. The heat treatment for activating an impurity element may be conducted in the heat treatment for hydrogenation; therefore, steps can be simplified.

Figure 7D:
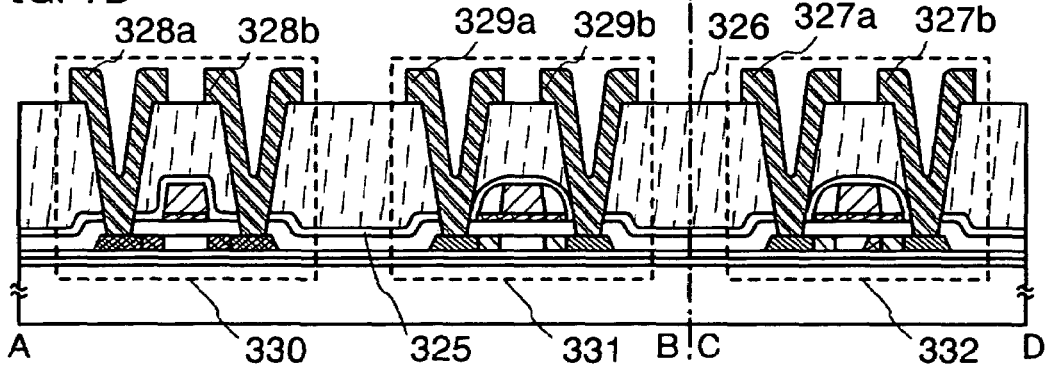

Opening portions (contact holes) reaching a source region and a drain region are formed in the insulating layer 326, the insulating film 325, and the gate insulating layer 395. A source or drain electrode layer 328a, a source or drain electrode layer 328b, a source or drain electrode layer 329a, a source or drain electrode layer 329b, a source or drain electrode layer 327a, and a source or drain electrode layer 327b each of which is in contact with a source region or a drain region are formed in the opening portion (FIG. 7D). Then, a p-channel thin film transistor 330, an n-channel thin film transistor 331, and an n-channel thin film transistor having a p-type impurity region 332 are formed and a semiconductor device using them is formed. In this embodiment mode, a processor (system processor) having a CMOS circuit and a thin film transistor whose properties are controlled over the same substrate is manufactured.

According to the invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. That is, a functional circuit or the like which emphasizes a high speed operation, such as a CPU (processor), a DRAM, an image processing circuit, or an audio processing circuit and a driver circuit or the like which emphasizes high pressure resistance, such as a buffer circuit, a shift register circuit, a level shifter circuit, and a sampling circuit can be formed over the same substrate. Thus, a semiconductor device such as a system LSI, having an element of various functions and structures can be manufactured over the same substrate. In this embodiment mode, a thin film transistor is an n-channel thin film transistor having a low concentration p-type impurity region; therefore, a semiconductor device capable of high speed operation and reducing power consumption can be formed.

This embodiment mode can be implemented in combination with each of Embodiment Modes 1 to 3.

Embodiment Mode 5

An embodiment mode of the invention is described with reference to FIGS. 8A to 8C, 9A to 9C, and 10A and 10B. This embodiment mode describes an example where two n-channel thin film transistors each having low concentration p-type impurity regions are formed in the semiconductor device manufactured in Embodiment Mode 3. Then, repeated descriptions of the same portion and the portion having the same function are omitted.

As shown in Embodiment Mode 3, a base film 301a and a base film 301b are stacked as a base film over a substrate 300 and a semiconductor layer 302, a semiconductor layer 303, a semiconductor layer 304, and a semiconductor layer 370 are formed. An amorphous semiconductor film is irradiated with laser light to be crystallized, and then a formed crystalline semiconductor film is patterned to form the semiconductor layer 302, the semiconductor layer 303, the semiconductor layer 304, and the semiconductor layer 370. In this embodiment mode, a semiconductor layer comprises silicon, and a crystalline silicon film having crystal grains continuously grown is formed by irradiating an amorphous silicon film with laser light. Note that the semiconductor layer 302, the semiconductor layer 303, and the semiconductor layer 304, and the semiconductor layer 370 are formed so that channel formation regions of a subsequently formed thin film transistors are formed parallel to the scanning direction of the laser light.

A gate insulating layer 395 is formed over the semiconductor layer 302, the semiconductor layer 303, the semiconductor layer 304, and the semiconductor layer 370 to form a first conductive film 396 and a second conductive film 397 (FIG. 8A). In this embodiment mode, a thin silicon oxide film of 2 to 5 nm thick is formed as a first insulating film over the semiconductor layer 302, the semiconductor layer 303, the semiconductor layer 304, and the semiconductor layer 370 by a GRTA (gas rapid thermal anneal) method. A silicon nitride film, a silicon oxide film, and a silicon nitride film are stacked over the first insulating film to be used as a gate insulating layer 395. The first conductive film 396 comprises TaN and the second conductive film 397 comprises W, by a sputtering method.

The second conductive film 397 is etched to be a thin line as shown in FIGS. 3A to 3F, thereby forming a first gate electrode layer 305, a first gate electrode layer 306, a first gate electrode layer 307, and a first gate electrode layer 371. A mask 361 comprising a resist is formed so as to cover the semiconductor layer 302 and the semiconductor layer 303.

The semiconductor layer 304 and the semiconductor layer 370 are doped with an impurity element 351 for imparting p-type obliquely at the incident angle θ1 of 30° to 90° or 90° to 150° to the surfaces thereof, using the first gate electrode layers 307 and 371 as masks, thereby forming a first p-type impurity region 308a, a first p-type impurity region 308b, a first p-type impurity region 385a, and a first p-type impurity region 385b (FIG. 8B). Since the semiconductor layers are doped obliquely with the impurity element 351 for imparting p-type, the first p-type impurity region 308b and the first p-type impurity region 385b are also formed in portions covered with the first gate electrode layer 307 and the first gate electrode layer 371 in the semiconductor layer 304 and the semiconductor layer 370. However, the impurity element 351 for imparting p-type is blocked by the first gate electrode layer 307 and the first gate electrode layer 371 which function as masks; therefore, the first p-type impurity region 308a and the first p-type impurity region 385a are not formed in portions of the semiconductor layer 304 and semiconductor layer 370 under the first gate electrode layer 307 and the first gate electrode layer 371. The doping is conducted so that the first p-type impurity region 308a, the first p-type impurity region 308b, the first p-type impurity region 385a, and the first p-type impurity region 385b include the impurity elements for imparting p-type to be a concentration of approximately $5\times10^{17}$ to $5\times10^{18}/cm^3$. In addition, the concentration thereof may be set at approximately $5\times10^{16}$ to $1\times10^{17}/cm^3$. In this embodiment mode, boron (B) is used as the impurity element for imparting p-type.

In this embodiment mode, in a thin film transistor having the semiconductor layer 304, a region in the first p-type impurity region 308b a drain region; and in a thin film transistor having the semiconductor layer 370a, a region in the first p-type impurity region 385b is a source region. When a channel formation region of the semiconductor layer is arranged parallel to the scanning direction of the laser light and the semiconductor layer is doped with an impurity element obliquely from one direction, using the gate electrode layer as a mask, an impurity region having one conductivity different from the conductivity of the thin film transistor can be formed between the channel formation region and only one of the source region and the drain region. According to the invention, a thin film transistor having the different one conductive impurity region having the different one conductive type between a channel formation region and a source region and a thin film transistor having the one conductive impurity region having the different one conductive type between a channel formation region and a drain region can be formed by the same step. It is freely configured which of the high concentration impurity regions is formed as a source region or a drain region by a wiring to be connected or the like, and the invention can be adapted to any circuit adequately. Thus, it can control properties of a more minute thin film transistor and to manufacture varied thin film transistors. Therefore, a high-accuracy semiconductor device which needs a plurality of circuits having different functions can be manufactured with high reliability.

Next, the mask 361 is removed and a mask 362 comprising a resist is formed to cover the semiconductor layer 302. The mask 362 may be newly formed or may be formed by processing the mask 361. The semiconductor layer 303, the semiconductor layer 304, and the semiconductor layer 370 are doped with an impurity element for imparting n-type, using the first gate electrode layer 306, the first gate electrode layer 307, and the first gate electrode layer 371 as masks at an incident angle θ2 to the surfaces thereof, thereby forming a first n-type impurity region 309a, a first n-type impurity region 309b, a first n-type impurity region 310a, a first n-type impurity region 310b, a first n-type impurity region 372a, and a first n-type impurity region 372b (FIG. 8C). The angular difference between the angle θ2 and the angle θ1 is set at 5° or more. The first p-type impurity region 308a, the first p-type impurity region 308b, the first p-type impurity region 385a, and the first p-type impurity region 385b have been doped with the impurity element for imparting p-type; therefore, they are required to be doped with an impurity element for imparting n-type in order to be changed into n-type impurity regions. The first n-type impurity region 309a, the first n-type impurity region 309b, the first n-type impurity region 310a, the first n-type impurity region 310b, the first n-type impurity region 372a, and the first n-type impurity region 372b are formed to include the impurity elements for imparting n-type in a concentration of $1\times10^{17}$ to $5\times10^{18}/cm^3$. In this embodiment mode, phosphorous (P) is used as the impurity elements for imparting n-type. Regions covered with the first gate electrode layer 306, the first gate electrode layer 307, and the first gate electrode layer 371 in the semiconductor layer 303, the semiconductor layer 304, and the semiconductor layer 370 are not doped with the impurity element 352. The reason is that the impurity element 352 is blocked by the first gate electrode layer 306, the first gate electrode layer 307, and the first gate electrode layer 371 since the impurity element 352 is added nearly vertically. Therefore, parts of the first p-type impurity regions under the first gate electrode layer 307 and the first gate electrode layer 371 are left, and become a second p-type impurity region 324 and a second p-type impurity region 377. The second p-type impurity region 324 and the second p-type impurity region 377 are formed as an Lov region.

The mask 362 is removed by etching or the like. An insulating layer is formed over the first conductive film 396, the first gate electrode layer 305, the first gate electrode layer 306, the first gate electrode layer 307, and the first gate electrode layer 371, and then anisotropic etching is conducted. Then, a sidewall 311, a sidewall 312, a sidewall 313, and a sidewall 373 are formed on side surfaces of the first gate electrode layer 305, the first gate electrode layer 306, the first gate electrode layer 307, and the first gate electrode layer 371. In this embodiment mode, silicon oxide film is used as an insulating layer for forming the sidewalls. Next, the first conductive film 396 is etched using the first gate electrode layer 305, the first gate electrode layer 306, the first gate electrode layer 307, the first gate electrode layer 371, the side wall 311, the side wall 312, the side wall 313, and the side wall 373 as masks, thereby forming a second gate electrode layer 380, a second gate electrode layer 381, a second gate electrode layer 382, and a second gate electrode layer 379 (FIG. 9A). In this embodiment mode, materials which have high etching selectivity between the first conductive film 396 and the second conductive film 397 are used; therefore, the first gate electrode layer 305, the first gate electrode layer 306, the first gate electrode layer 307, and the first gate electrode layer 371 can be used as masks when the first conductive film 396 is etched. In the case of using materials which do not have high etching selectivity between the first conductive film 396 and the second conductive film 397, when the sidewall 311, the sidewall 312, the sidewall 313, and the sidewall 373 are formed, it is preferable that the insulating layer is left over the first gate electrode layer 305, the first gate electrode layer 306, the first gate electrode layer 307, and the first gate electrode layer 371; a protective film is formed over a gate electrode layer; or a mask comprising a resist is formed over the first gate electrode layer 305, the first gate electrode layer 306, the first gate electrode layer 307, and the first gate electrode layer 371. Protecting the first gate electrode layer 305, the first gate electrode layer 306, the first gate electrode layer 307, and the first gate electrode layer 371 can prevent the first gate electrode layers from being reduced, when the first conductive film 396 is etched.

A mask 363 comprising a resist is formed to cover the semiconductor layer 302. The semiconductor layer 303, the semiconductor layer 304, and the semiconductor layer 370 are doped with an impurity element 353 for imparting n-type at a near-vertical incident angle to the surfaces of the semiconductor layers, using the sidewall 312, the sidewall 313, the sidewall 373, the first gate electrode layer 306, the first gate electrode layer 307, and the first gate electrode layer 371 as masks, thereby forming a second n-type impurity region 314a, a second n-type impurity region 314b, a second n-type impurity region 315a, a second n-type impurity region 315b, a second n-type impurity region 374b, and a second n-type impurity region 374b (FIG. 9B). Portions of the semiconductor layers which are covered with the side walls are not doped with the impurity element 353 for imparting n-type; therefore, they become a third n-type impurity region 320a, a third n-type impurity region 320b, a third n-type impurity region 322a, a third n-type impurity region 322b, a third n-type impurity region 375a, and a third n-type impurity region 375b. Note that a channel formation region 321, a channel formation region 323, and a channel formation region 376 are formed in the semiconductor layer 303, the semiconductor layer 304, and the semiconductor layer 370, respectively. The second n-type impurity region 314a, the second n-type impurity region 314b, the second n-type impurity region 315a, the second n-type impurity region 315b, the second n-type impurity region 374a, and the second n-type impurity region 374b are high concentration impurity regions; therefore, they function as a source region or a drain region. In this embodiment mode, the second n-type impurity region 315b on the side where the second p-type impurity region 324 is formed is a drain region, and the second n-type impurity region 374b on the side where the second p-type impurity region 377 is formed is a source region. Therefore, the second n-type impurity region 315a functions as a source region and the second n-type impurity region 374a functions as a drain region. Here, the second n-type impurity region 314a, the second n-type impurity region 314b, the second n-type impurity region 315a, the second n-type impurity region 315b, the second n-type impurity region 374a, and the second n-type impurity region 374b are formed to include the impurity elements for imparting n-type in a concentration of approximately $5 \times 10^{19}$ to $5 \times 10^{20}$/cm$^3$. In this embodiment mode, phosphorous (P) is used as the impurity element for imparting n-type.

On the other hand, the third n-type impurity region 320a, the third n-type impurity region 320b, the third n-type impurity region 322a, the third n-type impurity region 322b, the third n-type impurity region 375a, and the third n-type impurity region 375b which are low concentration impurity regions are Lov regions which are covered with the second gate electrode layer 381, the second gate electrode layer 382, and the second gate electrode layer 379. Therefore, an electric field adjacent to a drain can be relieved and deterioration of on-state current due to hot carriers can be controlled. Hereby, a semiconductor device capable of high speed operation can be formed.

A mask 364 comprising a resist is formed to cover the semiconductor layer 303, the semiconductor layer 304, and the semiconductor layer 370. The semiconductor layer 302 is doped with an impurity element 354 for imparting p-type at a near-vertical incident angle to the surface of the semiconductor layer 302, using the mask 364, the sidewall 311, and the first gate electrode layer 305 as masks to form a third p-type impurity region 316a and a third p-type impurity region 316b (FIG. 9C). Here, the doping is conducted so that the third p-type impurity region 316a and the third p-type impurity region 316b include the impurity elements for imparting p-type to be a concentration of approximately $1 \times 10^{20}$ to $5 \times 10^{21}$/cm$^3$. In this embodiment mode, boron (B) is used as the impurity element for imparting p-type.

Portions of the second gate electrode layer 380 is exposed by removing the side wall 311 and etched using the first gate electrode layer 305 as a mask. Then, a second gate electrode layer 383 having appropriately the same width as the first gate electrode layer 305 is formed. When the gate insulating layer 395 is formed of the same material as the side wall 311 in this etching step, a mask for covering the gate insulating layer 395 except for the sidewall 311 and the first gate electrode layer 305 may be formed.

A mask 365 comprising a resist is formed to cover the semiconductor layer 303, the semiconductor layer 304, and the semiconductor layer 370. The mask 365 may be formed using the mask 364 without removing the mask 364, may be formed by processing the mask 364, or may be formed newly, of course. The semiconductor layer 302 is doped with an impurity element 355 for imparting p-type at a near-vertical incident angle to the surface thereof, using the mask 365 and the first gate electrode layer 305 as masks, thereby forming a fourth p-type impurity region 317a, a fourth p-type impurity region 317b, a fifth p-type impurity region 318a, and a fifth p-type impurity region 318b (FIG. 10A). Here, the doping is conducted so that the fourth p-type impurity region 317a and the fourth p-type impurity region 317b include the impurity elements for imparting p-type to be a concentration of approximately $1 \times 10^{20}$ to $5 \times 10^{21}$/cm$^3$. And the doping is conducted so that the fifth p-type impurity region 318a and the fifth p-type impurity region 318b include the impurity elements for imparting p-type to be a concentration of approximately $5 \times 10^{18}$ to $5 \times 10^{19}$/cm$^3$. In this embodiment mode, boron (B) is used as the impurity element for imparting p-type. Note that a channel formation region 319 is formed in the semiconductor layer 302.

The fourth p-type impurity region 317a and the fourth p-type impurity region 317b are high concentration impurity regions; therefore, each of them functions as a source region or a drain region. On the other hand, the fifth p-type impurity region 318a and the fifth p-type impurity region 318b which are low concentration impurity regions are Loff regions which are not covered with the gate electrode layer. Therefore, an electric field adjacent to a drain can be relieved and deterioration due to hot carrier injection can be prevented, and additionally, off-state current can be reduced. Hereby, a semiconductor device with high reliability and low power consumption can be formed.

Heat treatment, laser irradiation, or the like is performed for activating impurity elements and then an insulating film 325 for hydrogenation is formed. Hydrogenation is conducted by heat treatment and an insulating layer 326 is formed. The heat treatment for activating the impurity elements may be conducted in the heat treatment for hydrogenation; therefore, steps can be simplified.

Opening portions (contact holes) reaching a source region and a drain region are formed in the insulating layer 326, the insulating film 325, and the gate insulating layer 395. A source or drain electrode layer 328a, a source or drain electrode layer 328b, a source or drain electrode layer 329a, a source or drain electrode layer 329b, a source or drain electrode layer 327a, a source or drain electrode layer 327b, a source or drain electrode layer 398a, and a source or drain electrode layer 398b which are in contact with a source region or a drain region are formed in the opening portions (FIG. 10B). In this embodiment mode, the source or drain electrode layer 327a becomes a source electrode layer, and the source or drain electrode layer 327b becomes a drain electrode layer. On the other hand, the source or drain electrode layer 398a becomes a drain electrode layer, and the source or drain electrode layer 398b becomes a source electrode layer. Accordingly, a p-channel thin film transistor 330, an n-channel thin film transistor 331, an n-channel thin film transistor 332 having a low concentration p-type impurity region between a channel formation region and a drain region, and an n-channel thin film transistor 378 having a low concentration p-type impurity region between a channel formation region and a source region are formed and a semiconductor device using them is formed. In this embodiment mode, a processor having a CMOS circuit and a thin film transistor controlling the properties on the same substrate is manufactured.

According to the invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. That is, a functional circuit or the like which has a high speed operation, such as a processor, a DRAM, an image processing circuit, or an audio processing circuit and a driver circuit or the like which has high voltage resistance, such as a buffer circuit, a shift register circuit, a level shifter circuit, and a sampling circuit can be formed over the same substrate. Thus, a semiconductor device such as a system LSI, having an element of various functions and structures can be manufactured over the same substrate. In this embodiment mode, a thin film transistor is an n-channel thin film transistor having a low concentration p-type impurity region; therefore, a semiconductor device capable of high speed operation and reducing power consumption can be formed.

This embodiment mode can be implemented in combination with each of Embodiment Modes 1 to 4.

Embodiment Mode 6

An embodiment mode of the invention is described with reference to FIGS. 8A to 8C, 9A to 9C, 10A to 10B, and 30A to 30C. This embodiment mode describes an example where two n-channel thin film transistors each having a low concentration p-type impurity region are formed in the semiconductor device manufactured using Embodiment Mode 3. Then, repeated descriptions of the same portion and the portion having the same function are omitted.

In Embodiment Mode 5, the thin film transistors each having the impurity region of the same structure are made different in a source region or a drain region, thereby manufacturing the two n-channel thin film transistors each having a low concentration p-type impurity region which are different in the properties. In this embodiment mode, an incident angle in adding an impurity element is controlled and impurity regions are formed to have different structures, thereby manufacturing two n-channel thin film transistors each having low concentration p-type impurity regions which are different in the properties.

In Embodiment Mode 5, as shown in FIG. 8B, the semiconductor layers are doped with an impurity element for imparting p-type at the incident angle θ1 of 30° to 90°, when a first p-type impurity region 308a, a first p-type impurity region 308b, a first p-type impurity region 385a, and a first p-type impurity region 385b are formed. In this embodiment mode, a semiconductor layer 304 and a semiconductor layer 370 are doped with an impurity element for imparting p-type in different incident angles by different steps.

As shown in FIG. 30A, first, masks 361a and 361b are formed to cover the semiconductor layers 302, 303, and 370. The semiconductor layer 304 is doped with an impurity element 951 for imparting p-type at the incident angle θ1 to the surface thereof. The semiconductor layer 304 is doped with the impurity element 951 for imparting p-type obliquely at the incident angle θ1 of 30° to 90° to the surface thereof, using the first gate electrode layer 307 as a mask, thereby forming a first p-type impurity region 308a and a first p-type impurity region 308b (FIG. 30A). Since the semiconductor layer is doped obliquely with the impurity element 951 for imparting p-type, the first p-type impurity region 308b is also formed in a portion covered with the first gate electrode layer 307 in the semiconductor layer 304. However, the impurity element 351 for imparting p-type is blocked by the first gate electrode layer 307 which functions as a mask; therefore, the first p-type impurity region 308a is not formed in a portion of the semiconductor layer 304 under the first gate electrode layer 307.

Next, the mask 361b is removed, and a mask 366 is formed to cover the semiconductor layer 302, the semiconductor layer 303, and the semiconductor layer 304. The semiconductor layer 370 is doped with an impurity element 356 in an incident angle θ3 to the surface thereof. The semiconductor layer 370 is doped with the impurity element 356 for imparting p-type obliquely at the incident angle θ3 of 90° to 150° to the surface thereof, using the first gate electrode layer 371 as a mask, thereby forming a first p-type impurity region 985a and a first p-type impurity region 985b (FIG. 30B). Since the semiconductor layer is doped obliquely with the impurity element 356 for imparting p-type, the first p-type impurity region 985a is also formed in a portion covered with the first gate electrode layer 371 in the semiconductor layer 370. However, the impurity element 356 for imparting p-type is blocked by the first gate electrode layer 371 which functions as a mask; therefore, the first p-type impurity region 985b is not formed in a portion of the bottom semiconductor layer 370 covered with the first gate electrode layer 371.

Here, the doping is conducted so that the first p-type impurity region 308a, the first p-type impurity region 308b, the first p-type impurity region 985a and the first p-type impurity region 985b include the impurity elements for imparting p-type at a concentration of approximately $5 \times 10^{17}$ to $5 \times 10^{18}$/cm$^3$. In addition, the concentration thereof may be set at approximately $5 \times 10^{16}$ to $1 \times 10^{17}$/cm$^3$. In this embodiment mode, boron (B) is used as the impurity element for imparting p-type.

Thus, by changing the incident angle θ in adding the impurity element for imparting p-type, portions where the first p-type impurity regions are formed in the semiconductor layer 304 and the semiconductor layer 370 can be varied.

FIG. 30C shows a semiconductor device manufactured in this embodiment mode. In this embodiment mode, a p-channel tin film transistor 330, an n-channel thin film transistor 331, an n-channel thin film transistor having a p-type impurity region 332, and an n-channel thin film transistor having a p-type impurity region 978 are formed and a semiconductor device using them is formed.

The thin film transistor 332 manufactured in this embodiment mode has a second p-type impurity region 324 which is a low concentration p-type impurity region between a channel formation region 323 and a third n-type impurity region 322b. On the other hand, a thin film transistor 978 manufactured in this embodiment mode has a second p-type impurity region 977 which is a low concentration p-type impurity region between a channel formation region 376 and a third n-type impurity region 375a.

When a channel formation region of a semiconductor layer is arranged parallel to a scanning direction of laser light and the semiconductor layer is doped with an impurity element obliquely from one direction at angles which are different in each step, using a gate electrode layer as a mask, an impurity region having one conductivity different from the conductivity of the thin film transistor can be formed beside only one of a source region and a drain region. According to the invention, a thin film transistor having the different one conductive impurity region having the different one conductive type beside a source region and a thin film transistor having the one conductive impurity region having the different one conductive type beside a drain region can be formed over the same substrate. Thus, it becomes possible to control properties of a more minute thin film transistor and to manufacture varied thin film transistors. Therefore, a high-accuracy semiconductor device which needs a plurality of circuits having different functions can be manufactured with high reliability.

This embodiment mode can be implemented in combination with each of Embodiment Modes 1 to 5.

Embodiment Mode 7

An embodiment mode of the invention is described with reference to FIGS. 11A to 11D, 12A to 12C, 13A and 13B, and 14A and 14B. This embodiment mode describes an example where a semiconductor nonvolatile memory element (hereinafter, referred to as a memory-transistor) is formed in a semiconductor device manufactured in Embodiment Mode 4. Then, repeated descriptions of the same portion and the portion having the same function are omitted.

As in Embodiment Mode 4, a base film 401a and a base film 401b are stacked as a base film over a substrate 400 and then a semiconductor layer 402, a semiconductor layer 403, a semiconductor layer 404, and a semiconductor layer 405 are formed. An amorphous semiconductor film is irradiated with laser light to be crystallized, and then a formed crystalline semiconductor film is patterned to form the semiconductor layer 402, the semiconductor layer 403, the semiconductor layer 404, and the semiconductor layer 405. In this embodiment mode, a semiconductor layer comprises silicon, and a crystalline silicon film having a crystal grain continuously grown is formed by irradiating an amorphous silicon film. Note that the semiconductor layer 402, the semiconductor layer 403, the semiconductor layer 404, and the semiconductor layer 405 are formed so that a channel formation region of a subsequently formed thin film transistor is formed parallel to the scanning direction of the laser light. In this embodiment mode, pulsed laser light at a repetition rate of 80 MHz is used as a laser light. A crystal grain of a single crystal which is long extended along a scanning direction of the laser light is formed, thereby becoming it possible to form a semiconductor film having little crystal grain boundary at least which prevents a carrier of a thin film transistor from moving.

An insulating film 480, an insulating film 481, an insulating film 482, and an insulating film 483 are formed over the semiconductor layer 402, the semiconductor layer 403, the semiconductor layer 404, the semiconductor layer 405, and the substrate 400, and then an insulating film 406 is formed thereon. The lamination of the insulating film 480, the insulating film 481, the insulating film 482, the insulating film 483, and the insulating film 406 formed thereon is preferably formed to have a thickness of 1 to 100 nm, more preferably, 1 to 10 nm, further more preferably, 2 to 5 nm. The insulating film 480, the insulating film 481, the insulating film 482, the insulating film 483, and the insulating film 406 formed thereon serve as a tunnel oxide film in a memory transistor and as a part of a gate insulating film in a thin film transistor. Accordingly, a tunnel current is easier to flow when thicknesses of the insulating film 480, the insulating film 481, the insulating film 482, the insulating film 483, and the insulating film 406 formed thereon are thinner, and so high speed operation becomes possible. The thinner the thickness of the insulating film 480, the insulating film 481, the insulating film 482, the insulating film 483, and the insulating film 406 formed thereon is, the lower the voltage required to store charges in the floating gate electrode. As a result, power consumption of a semiconductor device that is formed afterwards can be reduced.

As a method for forming the insulating film 480, the insulating film 481, the insulating film 482, and the insulating film 483 formed thereon, a GRTA method, an LRTA method, or the like is used to oxidize a surface of the semiconductor region to form a thermal oxide film, and so an insulating film having a thin thickness can be formed. Alternatively, a CVD method, a coating method, or the like can be used. As the insulating film 406, a silicon oxide film, a silicon nitride film, a silicon oxynitride film, or a silicon nitride oxide can be used. Further, the insulating film 406 may be formed to have a lamination structure formed by stacking a silicon oxide film and a silicon nitride film over the substrate 400, or stacking a silicon oxide film, a silicon nitride film, and a silicon oxide film over a substrate 400.

In this embodiment mode, silicon oxide films are formed as the insulating film 480, the insulating film 481, the insulating film 482, and the insulating film 483, and a silicon nitride film is formed as the insulating film 406. After removing natural oxidation films formed on the surface of the semiconductor layer 402, the semiconductor layer 403, the semiconductor layer 404, and the semiconductor layer 405, the semiconductor layers 402 to 405 are exposed to ozone water containing hydroxyl radical for several ten seconds to several minutes and silicon oxide films are formed on the surfaces of the semiconductor layer 402, the semiconductor layer 403, the semiconductor layer 404, the semiconductor layer 405. Then, silicon oxide films are made minute by a GRTA method and an insulating film 480, an insulating film 481, an insulating film 482, and an insulating film 483 are formed to each have a film thickness of 1 to 20 nm. The method enables the process to be conducted for short time and at high heat; therefore, a minute and thin film transistor can be formed without expanding and contracting the substrate. Next, a silicon nitro oxide film is formed to have a film thickness of 1 to 5 nm over the silicon oxide film as an insulating film 406.

Conductive particles or semiconductor particles (hereinafter, disperse particles) 407 that are dispersed over the insulating film 406 (FIG. 11A). As a manufacturing method for the disperse particles, a known method such as a sputtering method, a plasma CVD method, a LPCVD method, a vapor deposition method, or a droplet discharging method can be used. Since the insulating film 406 can be buffered when the insulating film 406 is formed by forming the disperse particles by a plasma CVD method, a LPCVD method, a vapor deposition method, or a droplet discharging method, defects of the insulating film 406 can be prevented from generating. As a result, a semiconductor device having high reliability can be manufactured. The disperse particles can be formed after forming a conductive film or a semiconductor film by the foregoing method to be etched into a desired shape. The size of each disperse particle is 0.1 to 10 nm, preferably, 2 to 5 nm. As a material for conductive particles, gold, silver, copper, palladium, platinum, cobalt, tungsten, nickel, and the like can be used. As a material for semiconductor particles, silicon (Si), germanium (Ge), or silicon germanium alloy, and the like can be used. In this embodiment mode, here, silicon microcrystal is formed as the disperse particles 407 by a plasma CVD method (FIG. 11A).

An insulating film is formed over the disperse particles 407 and the insulating film 406. As the insulating film, a silicon nitride film or a silicon nitride oxide film is formed to have a film thickness of 10 to 20 nm by a plasma CVD method.

Next, a mask is formed on the disperse particles 407 over the semiconductor layer 402 to be a memory transistor.

A part of the disperse particles 407 and the insulating film are etched using the mask. As a method of removing the insulating film and the disperse particles 407, a known etching method such as a dry etching method or a wet etching method can be used. In this embodiment mode, the insulating film is removed by a dry etching method to expose the disperse particles 407. When a dry etching is used in the case that the thickness of the insulating film 406 provided with the disperse particles 407 is thin, there is a possibility of generating defects in the insulating film 406 by plasma bombardment. Accordingly, the disperse particles 407 are preferably removed by a wet etching method. Here, silicon microcrystals that are the disperse particles are removed by a wet etching method using $NMD_3$ solution (water solution containing 0.2 to 0.5% of tetramethyl ammonium hydrooxide). Then, an insulating film 408 having a floating gate electrode 410 is formed The floating gate electrode comprises dispersed particles. Accordingly, in the case that defects are occurred in the insulating film 406 serving as a tunnel oxide film, all charges stored in the floating gate electrode can be prevented from flowing out form the defects to the semiconductor region. As a result, a semiconductor memory transistor having high reliability can be manufactured.

After removing the mask, the insulating film 409 is formed over the insulating film 406 and the insulating film 408 in contact with a floating gate electrode 410 is formed (FIG. 11B). The insulating film 409 is preferably formed to have a thickness of 1 to 100 nm, more preferably, 10 to 70 nm, and further more preferably 10 to 30 nm. The insulating film 409 is required to keep isolating from the floating gate electrode 410 and a gate electrode layer that is formed afterwards in the memory transistor Accordingly, the insulating film 409 is preferably formed to have a thickness that does not allow a leak current is not increased between the floating gate electrode 410 and the gate electrode layer. The insulating film 409 can be formed by a silicon oxide film, a silicon nitride film, a silicon oxynitride film, or a silicon nitride oxide film as with the insulating film 406. Alternatively, the insulating film 409 may be formed to have a lamination layer structure formed by stacking a silicon oxide film and a silicon nitride film over the substrate 400, or stacking a silicon oxide film, a silicon nitride film, and a silicon oxide film over the substrate 400. The silicon oxide film is preferably formed on the semiconductor region since an interface state between the gate insulating film and the semiconductor region is lowered. Here, a lamination layer structure is formed by stacking a silicon oxide film with a thickness of 10 nm and a silicon nitride film with a thickness of 20 nm as the insulating film 409.

After forming the insulating film 409, a second floating gate electrode can be formed over the disperse particles and the mask pattern that cover the disperse particles. Moreover, a plurality of the floating gate electrode can be stacked by repeating the similar processes.

A conductive film comprising tungsten (W) is formed over the insulating film 409. In this embodiment mode, the tungsten (W) is used as a gate electrode layer. The conductive layer is etched to be a thin line as shown in FIGS. 3A to 3F, thereby forming a gate electrode layer 411, a gate electrode layer 412, a gate electrode 413, and a gate electrode layer 414 (FIG. 11C). Then, a mask 461 comprising a resist is formed to cover the semiconductor layer 402, the semiconductor layer 403, and the semiconductor layer 404.

The semiconductor layer 405 is doped with an impurity element 451 for imparting p-type obliquely at the incident angle θ1 to the surface thereof, which is set at 30° to 90° or 90° to 150°, using the gate electrode layer 414 as a mask, thereby forming a first p-type impurity region 415a and a first p-type impurity region 415b (FIG. 11D). Since the semiconductor layer is obliquely doped with the impurity element 451 for imparting p-type, a portion covered with the gate electrode layer 414 in the semiconductor layer 405 is also doped. However, the impurity element 451 for imparting p-type is blocked by the gate electrode layer 414 which functions as a mask; therefore, the first p-type impurity region 415a is not formed in the portion to be covered with the first gate electrode layer 414 in the semiconductor layer 405. Here, the doping is conducted so that the first p-type impurity region 415a and the first p-type impurity region 415b include the impurity elements for imparting p-type to be a concentration of approximately $5\times10^{17}$ to $5\times10^{18}/cm^3$. In addition, the concentration thereof may be set at approximately $5\times10^{16}$ to $5\times10^{17}/cm^3$. In this embodiment mode, boron (B) is used as the impurity elements for imparting p-type.

The mask 461 is removed and then a mask 462 is formed as a resist to cover the semiconductor layer 403. The mask 462 may be formed newly or formed by processing the mask 461. The semiconductor layer 402, the semiconductor layer 404, and the semiconductor layer 405 are doped with an impurity element for imparting n-type in a near-vertical incident angle θ2 to the surfaces thereof, using the gate electrode layer 411, the gate electrode 413, and the gate electrode layer 414, thereby forming a first n-type impurity region 416a, a first n-type impurity region 416b, a first n-type impurity region 417a, a first n-type impurity region 417b, a first n-type impurity region 418a and a first n-type impurity region 418b (FIG. 12A). The angular difference between the angle θ2 and the angle θ1 is set at 5° or more. Since the first n-type impurity region 415a and the first n-type impurity region 415b have been doped with the impurity element for imparting p-type, portions of them are doped with impurity elements for imparting n-type in order to be changed into an n-type impurity region. The first n-type impurity region 416a, the first n-type impurity region 416b, the first n-type impurity region 417a, the first n-type impurity region 417b, the first n-type impurity region 418a and the first n-type impurity region 418b are formed to include the impurity elements for imparting n-type typically in a concentration of $1\times10^{17}$ to $5\times10^{18}/cm^3$. In this embodiment mode, phosphorous (P) is used as the impurity elements for imparting n-type. Portions covered with the gate electrode layer 411, the gate electrode 413, and the gate electrode layer 414 in the semiconductor layer 402, the semiconductor layer 404, and the semiconductor layer 405 are not doped by being blocked by the gate electrode layers 411, 413, and 414, since the impurity elements 452 is added to near-vertical. Therefore, a part of the first p-type impurity region formed in a semiconductor layer under the gate electrode 414 is left, and becomes a second p-type impurity region 435. The second p-type impurity region 435 is formed as an Lov region.

The mask 462 is removed by etching or the like, and a mask 463a and a mask 463b are formed to cover the semiconductor layer 402, the semiconductor layer 404, and the semiconductor layer 405. The semiconductor layer 403 is doped with an impurity element 453 for imparting p-type in a near-vertical incident angle to the surface thereof, using the mask 463a, the mask 463b, and the gate electrode layer 412 as a mask, thereby forming a third p-type impurity region 420a and a third p-type impurity region 420b (FIG. 12B). Here, the doping is conducted so that the third p-type impurity region 420a and the third p-type impurity region 420b include the impurity elements for imparting p-type to be a concentration of approximately $1 \times 10^{20}$ to $5 \times 10^{21}$/cm$^3$. In this embodiment mode, boron (B) is used as the impurity element for imparting p-type.

The mask 463a and the mask 463b are removed by etching or the like. An insulating layer is formed over the insulating film 409, the gate electrode layer 411, the gate electrode layer 412, and the gate electrode layer 413, and the gate electrode layer 414, and anisotropic etching is conducted, thereby forming a sidewall 421, a sidewall 422, a sidewall 423, and a sidewall 424 on side surfaces of the gate electrode layer 411, the gate electrode layer 412, and the gate electrode layer 413, and the gate electrode layer 414 (FIG. 12C). In this embodiment mode, silicon oxide is used as an insulating layer for forming sidewalls. When the sidewall 421, the sidewall 422, the sidewall 423, and the sidewall 424 are formed, the insulating layer may be left over the gate electrode layer 411, the gate electrode layer 412, the gate electrode layer 413, and the gate electrode layer 414, or a protective film may formed over the gate electrode layers.

A mask 464 comprising a resist is formed to cover the semiconductor layer 403. The semiconductor layer 402, the semiconductor layer 404, and the semiconductor layer 405 are doped with an impurity element 454 for imparting n-type in a near-vertical incident angle to the surfaces thereof, using the sidewall 421, the sidewall 423, the sidewall 424, the gate electrode layer 411, the gate electrode layer 413, and the gate electrode layer 414 as a mask, thereby forming a second n-type impurity region 425a, a second n-type impurity region 425b, a second n-type impurity region 428a, a second n-type impurity region 428b, a second n-type impurity region 431a, and a second n-type impurity region 431b (FIG. 13A). Portions of the semiconductor layers which are covered with the side walls are not doped with the impurity element 454 for imparting n-type; therefore, they become a third n-type impurity region 426a, a third n-type impurity region 426b, a third n-type impurity region 429a, a third n-type impurity region 429b, a third n-type impurity region 432a, and a third n-type impurity region 432b. The second n-type impurity region 425a, the second n-type impurity region 425b, the second n-type impurity region 428a, the second n-type impurity region 428b, the second n-type impurity region 431a, and the second n-type impurity region 431b are high concentration impurity regions; therefore, each of them functions as a source region or a drain region. The second n-type impurity region 425a, the second n-type impurity region 425b, the second n-type impurity region 428a, the second n-type impurity region 428b, the second n-type impurity region 431a, and the second n-type impurity region 431b include the impurity elements for imparting n-type in a concentration of approximately $5 \times 10^{19}$ to $5 \times 10^{20}$/cm$^3$. In this embodiment mode, phosphorous (P) is used as the impurity element for imparting n-type.

On the other hand, the third n-type impurity region 426a, the third n-type impurity region 426b, the third n-type impurity region 429a, the third n-type impurity region 429b, the third n-type impurity region 432a, and the third n-type impurity region 432b which are low concentration impurity regions are Loff regions which are not covered with the gate electrode layer 411, the gate electrode 413, and the gate electrode layer 414. Therefore, an electric field adjacent to a drain can be relieved and deterioration of on-state current due to hot carriers can be controlled. Hereby, a semiconductor device with high reliability and low power consumption can be formed. Note that a channel formation region 427, a channel formation region 430, and a channel formation region 434 are formed in the semiconductor layer 402, the semiconductor layer 404, and the semiconductor layer 405.

A mask 465a and a mask 465b are formed of a resist to cover the semiconductor layer 402, the semiconductor layer 404, and the semiconductor layer 405. The semiconductor layer 403 is doped with an impurity element 455 for imparting p-type in a near-vertical incident angle to the surface thereof, using the mask 465a, the mask 465b, the sidewall 422, and the gate electrode layer 412 as masks, thereby forming a fourth p-type impurity region 436a, a fourth p-type impurity region 436b, a fifth p-type impurity region 437a, and a fifth p-type impurity region 437b (FIG. 13B). Here, the doping is conducted so that the fourth p-type impurity region 436a and the fourth p-type impurity region 436b include the impurity elements for imparting p-type to be a concentration of approximately $1 \times 10^{20}$ to $5 \times 10^{21}$/cm$^3$. And the doping is conducted so that the fifth p-type impurity region 437a and the fifth p-type impurity region 437b include the impurity elements for imparting p-type to be a concentration of approximately $5 \times 10^{18}$ to $5 \times 10^{19}$/cm$^3$. In this embodiment mode, boron (B) is used as the impurity element for imparting p-type. Note that a channel formation region 438 is formed in the semiconductor layer 403.

The fourth p-type impurity region 436a and the fourth p-type impurity region 436b are high concentration impurity regions, and each of them functions as a source region or a drain region. On the other hand, the fifth p-type impurity region 437a and the fifth p-type impurity region 437b are low concentration p-type impurity regions formed as Loff regions which are not covered with a gate electrode layer 412. An electric field adjacent to a drain can be relieved and deterioration due to hot carrier injection can be prevented, and additionally, off-state current can be reduced, since the fifth p-type impurity region 437a and the fifth p-type impurity region 437b are not cover with the gate electrode layer 412. Hereby, a semiconductor device with high reliability and low power consumption can be formed.

Heat treatment, laser irradiation, or the like is performed for activating an impurity element and an insulating film 443 for hydrogenation is formed. Hydrogenation is conducted by heat treatment and an insulating layer 446 is formed. The heat treatment for activating an impurity element may be conducted in conjunction with the heat treatment for hydrogenation; therefore, steps can be simplified. In this embodiment mode, silicon nitride oxide film and a silicon oxynitride film are stacked in order as the insulating layer 446 to have a lamination structure.

Opening portions (contact holes) reaching a source region and a drain region are formed in the insulating layer 446, the insulating film 443, the insulating film 409, the insulating film 480, the insulating film 481, the insulating film 482, and the insulating film 483. A source or drain electrode layer 440a, a source or drain electrode layer 440b, a source or drain electrode layer 441a, a source or drain electrode layer 441b, a source or drain electrode layer 442a, a source or drain electrode layer 442b, a source or drain electrode layer 439a, and a source or drain electrode layer 439b which are in contact with a source region or a drain region are formed in the opening portion. In this embodiment mode, aluminum (Al), titanium (Ti), and aluminum (Al) stacked as a source electrode layer or a drain electrode layer.

In addition, as shown in FIG. 14B, an insulating layer 444 having an opening portion may be formed to reach a source electrode layer or a drain electrode layer it and a wiring layer 445 may be formed in the opening portion. In this embodiment mode, an insulating layer containing siloxane polymer is used for the insulating layer 444, and a lamination of aluminum (Al) and titanium (Ti) is used for the wiring layer 445.

A semiconductor device providing the same substrate with a layer memory transistor 470, a p-channel thin film transistor 471, an n-channel thin film transistor 472, and an n-channel thin film transistor 473 having a low concentration p-type impurity region can be formed. Each of the memory transistor and the thin film transistors of a semiconductor device in this embodiment mode is formed using a semiconductor region having little crystal grain boundary in a channel direction; therefore, high speed operation can be performed. Additionally, the semiconductor device has the n-channel thin film transistor having a low concentration p-type impurity region; therefore, a semiconductor device such as a ID chip or the like capable of high speed operation and reducing power consumption can be formed.

In addition, the p-channel thin film transistor 471, the n-channel thin film transistor 472, and the n-channel thin film transistor having a low concentration p-type impurity region 473 are formed using a lamination of the insulating film 481, the insulating film 482, and the insulating film 483 which are formed over the surfaces of the semiconductor layers, the insulating layer 406, and the insulating layer 409 which are formed thereon, as a gate insulating layer. Therefore, a thin film transistor can have high pressure resistance. Alternately, when the insulating film 409 is removed, and the gate insulating layer is formed of a lamination of the insulating film 481, the insulating film 482, and the insulating film 483 and the insulating film 406 which is formed thereof, a thin film transistor capable of high speed operation can be formed. In this way, a thin film transistor having properties capable of responding to required functions can be formed and a semiconductor device can be manufactured.

According to the invention, a semiconductor layer is provided with an impurity region having an impurity element for imparting a different conductivity type; therefore, properties of a thin film transistor can be minutely controlled. This enables a thin film transistor having required functions to be formed by brief steps and a semiconductor device with high reliability and better electrical characteristics to be manufactured at a low cost. That is, a functional circuit or the like which emphasizes a high speed operation, such as a processor, a DRAM, an image processing circuit, or an audio processing circuit and a driver circuit or the like which emphasizes high pressure resistance, such as a buffer circuit, a shift register circuit, a level shifter circuit, and a sampling circuit can be formed over the same substrate. Thus, a semiconductor device such as a system LSI, having an element of various functions and structures can be manufactured over the same substrate.

This embodiment mode can be implemented in combination with each of Embodiment Modes 1 to 6.

Embodiment Mode 8

One of semiconductor devices which can be manufactured according to a manufacturing method of the invention is an ID chip. An ID chip is a semiconductor device which can wirelessly transmit/receive data such as identifying information, and is developed for practical use. An ID chip is also referred to as a wireless tag, an RFID (radio frequency identification) tag, an IC tag, or the like. Further, an ID chip using a glass substrate can be referred to as an IDG chip (identification glass chip), and an ID chip using a flexible substrate can be referred to as an IDF (identification flexible chip). The present invention can be applied to either of them.

Figure 16:
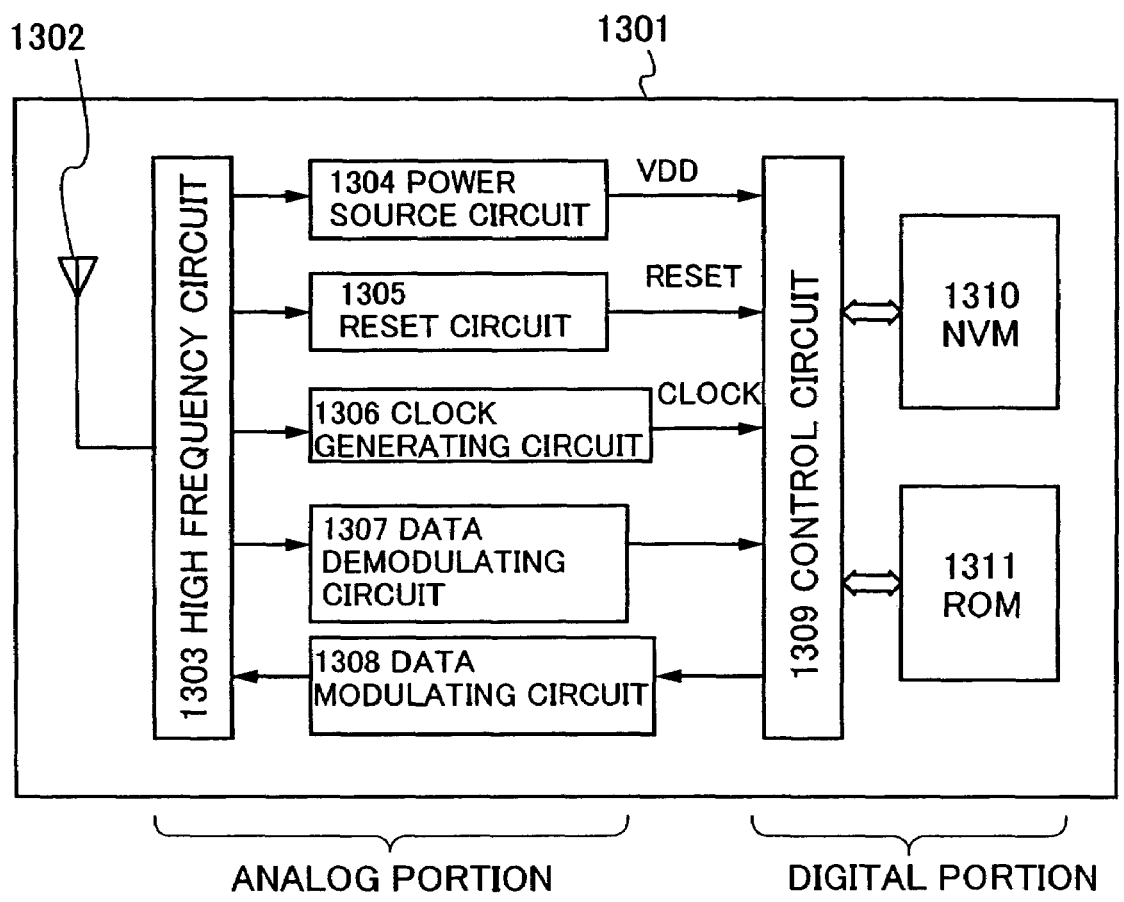
FIG. 16 is a block diagram showing a structure of the semiconductor device of the invention.

FIG. 16 is a typical block diagram of a non-contact RFID (Radio Frequency Identification) tag and an ID tag typified by a wireless tag or the like which are a typical example of the semiconductor device of the invention. FIG. 16 shows a configuration having a simple function to read out fixed data such as authentication data. In FIG. 16, an ID chip 1301 includes an antenna 1302, a high frequency circuit 1303, a power source circuit 1304, a reset circuit 1305, a clock generating circuit 1306, a data demodulating circuit 1307, a data modulating circuit 1308, a controlling circuit 1309, a nonvolatile memory (referred to as NVM) 1310, and a ROM 1311.

In this embodiment, a memory transistor formed as the nonvolatile memory 1310 in Embodiment Mode 5 and a thin film transistor in which electric properties are controlled is appropriately according to functions required for the circuits are used. When transistors capable of high speed operation are required for the high frequency circuit 1303, the reset circuit 1305, the clock generating circuit 1306, the data demodulating circuit 1307, the data modulating circuit 1308, the controlling circuit 1309, and the ROM 1311, the transistors capable of high speed operation can be also manufactured by the same step. When a high voltage resistant transistor is required for the power source circuit 1304, it can be manufactured at the same time as the memory transistor. In this manner, an RFID tag can be manufactured efficiently over the same substrate. Further, the ID chip 1301 that realizes cost reduction and downsizing can be provided.

The circuits shown in FIG. 16 are all formed on a glass substrate, a flexible substrate, or a semiconductor substrate. The antenna 1302 may be formed on the glass substrate, the flexible substrate, or the semiconductor substrate, however, it may be provided outside the substrate and be connected to a semiconductor integrated circuit inside the substrate.

The high frequency circuit 1303 receives an analog signal from the antenna 1302 and outputs an analog signal received from the data modulating circuit 1308 from the antenna 1302. The power source circuit 1304 generates a constant power source from the received signals; the reset circuit 1305 generates a reset signal; the clock generating circuit 1306 generates a clock signal; the data demodulating circuit 1307 extracts data from the received signals; and the data modulating circuit 1308 generates an analog signal to be outputted to the antenna or changes antenna characteristics based on a digital signal received from the controlling circuit. An analog portion comprises the aforementioned circuits.

On the other hand, the controlling circuit 1309 reads data by receiving data extracted from the received signal. In specific, the controlling circuit 1309 generates an address signal of the nonvolatile memory (NVM) 1310 and the ROM 1311, reads data, and transmits the read data to the data modulating circuit. A digital portion comprises the aforementioned circuits.

In this manner, an ID chip having a high reliability and high functions can be manufactured, according to the invention. This embodiment mode can be implemented in combination with Embodiment Modes 1 to 7.

Embodiment Mode 9

Figure 17A:
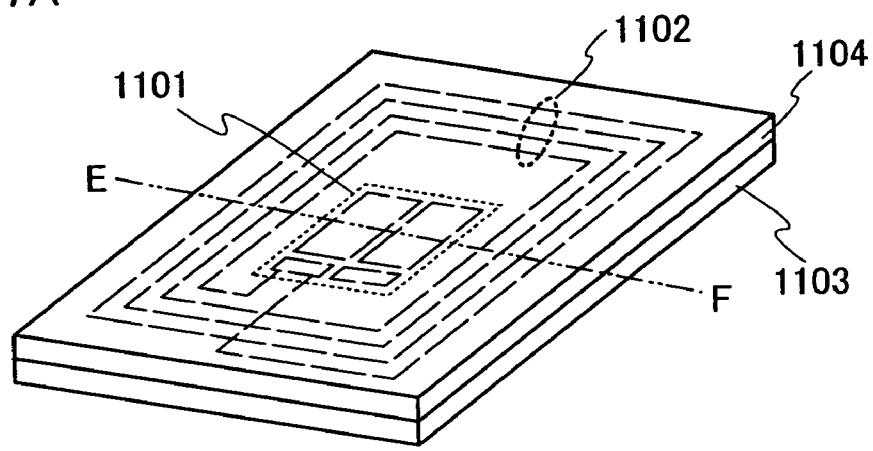
FIGS. 17A and 17B are perspective views showing a semiconductor device of the invention.

FIG. 17A is a perspective view showing one mode of an ID chip that is one of the semiconductor devices of the invention. A processor which is an aggregate having various signal processing functions and a system processor having a processor as a system can be used as an integrated circuit. Reference numeral 1101 denotes an integrated circuit, and 1102 denotes an antenna that is connected to the integrated circuit 1101. Reference numeral 1103 denotes a support which also functions as a cover material and 1104 denotes a cover material. The integrated circuit 1101 and the antenna 1102 are formed over the support 1103, and the cover material 1104 overlaps the support 1103 so as to cover the integrated circuit 1101 and the antenna 1102. The cover material 1104 is not necessarily used, though the mechanical strength of the ID chip can be increased by covering the integrated circuit 1101 and the antenna 1102 with the cover material 1104.

Figure 17B:
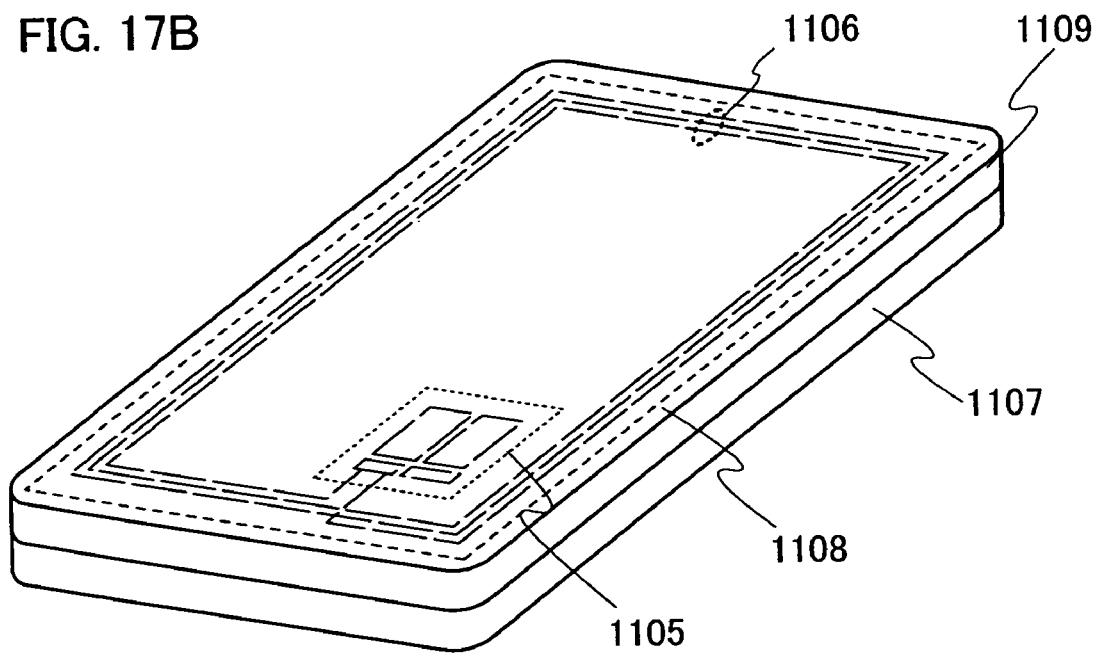

FIG. 17B is a perspective view showing one mode of an IC card that is one of the semiconductor devices of the invention. Reference numeral 1105 denotes an integrated circuit, and 1106 denotes an antenna that is connected to the integrated circuit 1105. Reference numeral 1108 denotes a substrate functioning as an inlet sheet and 1107 and 1109 denote cover materials. The integrated circuit 1105 and the antenna 1106 are formed over the substrate 1108, and the substrate 1108 is sandwiched between the two cover materials 1107 and 1109. The IC card of the invention may have a display device connected to the integrated circuit 1105.

Figure 18A:
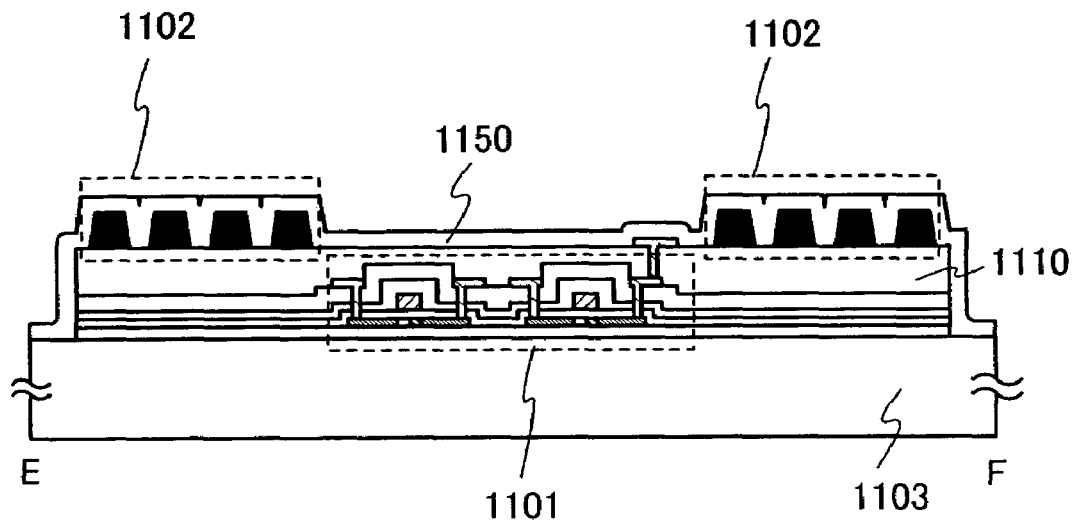
FIGS. 18A and 18B are cross sectional views of the semiconductor device of the invention.
Figure 18B:
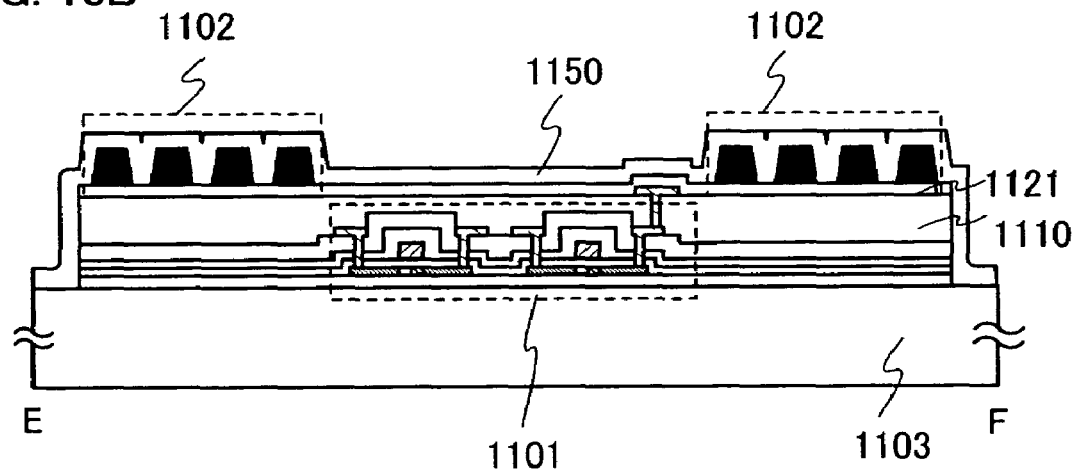

Next, FIGS. 18A and 18B shows cross sectional views in a line E-F of an ID chip shown in FIG. 17A. FIGS. 18A and 18B shows an example where a thinner cover film 1150 is used instead of the cover material 1104 and the integrated circuit 1101 is directly formed on the support. Of course, the cover material 1104 may be formed over the cover film 1150. The ID chip is sealed with the support 1103 which also function as a cover material and the cover film 1150, and has the integrated circuit 1101 and an antenna 1102 connected thereto.

The integrated circuit 1101 can be formed using an integrated circuit shown in any one of Embodiment Modes 1 to 8. Additionally, a semiconductor element used for the integrated circuit 1101 is not limited to this. For example, a memory element, a diode, a photoelectric conversion element, a resistance element, a coil, a capacitor element, an inductor, and the like as well as a thin film transistor can be used As shown in FIG. 18A, an interlayer insulating film 1110 is formed over a thin film transistor of the integrated circuit, and the antenna 1102 is formed over the interlayer insulating film 1110, and they are covered with the cover film 1150 which functions as a protective film.

On the other hand, as shown in FIG. 18B, a barrier film 1121 comprising silicon nitride film or the like may be formed over the interlayer insulating film 1110 and then the antenna 1102 may be formed thereon.

Providing the barrier film enables an ID chip having an improved reliability to be provided without contaminating the integrated circuit 1101. In FIGS. 18A and 18B, a base film comprising a silicon nitride film or the like is formed between the integrated circuit 1101 and the support 1103 and the integrated circuit is covered with a film having a barrier function, such as a silicon nitride film or the like; therefore it becomes possible further to eliminate pollution of moisture or the like and to improve the reliability.

The antenna 1102 is preferably formed of gold, silver, copper, aluminum or a metal plated with them.

In this embodiment mode, an example where an integrated circuit and a lamination body having an antenna formed over an interlayer insulating film on the integrated circuit are adhered by a cover film is shown; however, it is not limited to this, the integrated circuit may be adhered to a cover film provided with an antenna by using an adhesive. In this time, an integrated circuit is adhered to an antenna by conducting UV treatment or ultrasonication by using an aerotropic conductive adhesive or an aerotropic electrical conduction film; however, the present invention can use various methods without being limited by this method. Additionally, an antenna does not have to be always equal with the size of an ID chip, and it may be bigger or may be smaller and may be set suitably. In addition, in transmitting or receiving a signal can use electromagnetic wave of radio, light, or the like.

In this embodiment mode, an integrated circuit is directly formed on a support and a dense film of silicon nitride or the like is used as a cover film 1150; however, an integrated circuit may be formed by a separation process and then adhered to the support and the cover film. A support and a cover film can be formed of a material having flexibility of plastic, an organic resin, a paper, a fiber, carbon graphite, or the like. By using a biodegradable resin for a cover material, it is disassembled by bacteria, and it is returned to soil. Also, since the Integrated circuit of this embodiment mode comprises silicon, aluminum, oxygen, nitrogen, or the like, a nonpolluting ID chip can be formed. Additionally, a used ID chip can be burnt up or cut by using a cover film comprising an incineration nonpolluting material such as paper, fiber, carbon paper graphite. In addition, an ID chip using these materials is nonpolluting, since it does not generate a poisonous gas either even when it is burnt up.

When the integrated circuit formed by an peeling process is adhered between the support and the cover material, it is preferably formed to have a thickness of 5 μm or less, more preferably, 0.1 to 3 μm. Additionally, when the total thickness of the support and the cover material is denoted by d, each thickness of the support and the cover material is preferably (d/2)±30 μm, more preferably, (d/2)±10 μm. Further, the support 1103 and the second cover material are preferably formed to have thicknesses of 10 to 200 μm. Moreover, the area of the integrated circuit 1101 is 5 mm square (25 mm$^2$) or less, preferably, 0.3 to 4 mm square (0.09 to 16 mm$^2$) Since the support 1103 and the cover material are made from organic resin materials, they have a high property with respect to bending. The integrated circuit formed by a peeling process has a high property with respect to bending compared to a single crystalline semiconductor. Since the integrated circuit, the support, and the cover material can be adhered together with no space between them, the complete ID chip itself has a high property with respect to bending. The integrated circuit surrounded by the support and the cover material may be placed over the surface or interior of another material or embedded in a paper.

This embodiment mode can be implemented in combination with each of Embodiment Modes 1 to 8 freely.

Embodiment Mode 10

Figure 19:
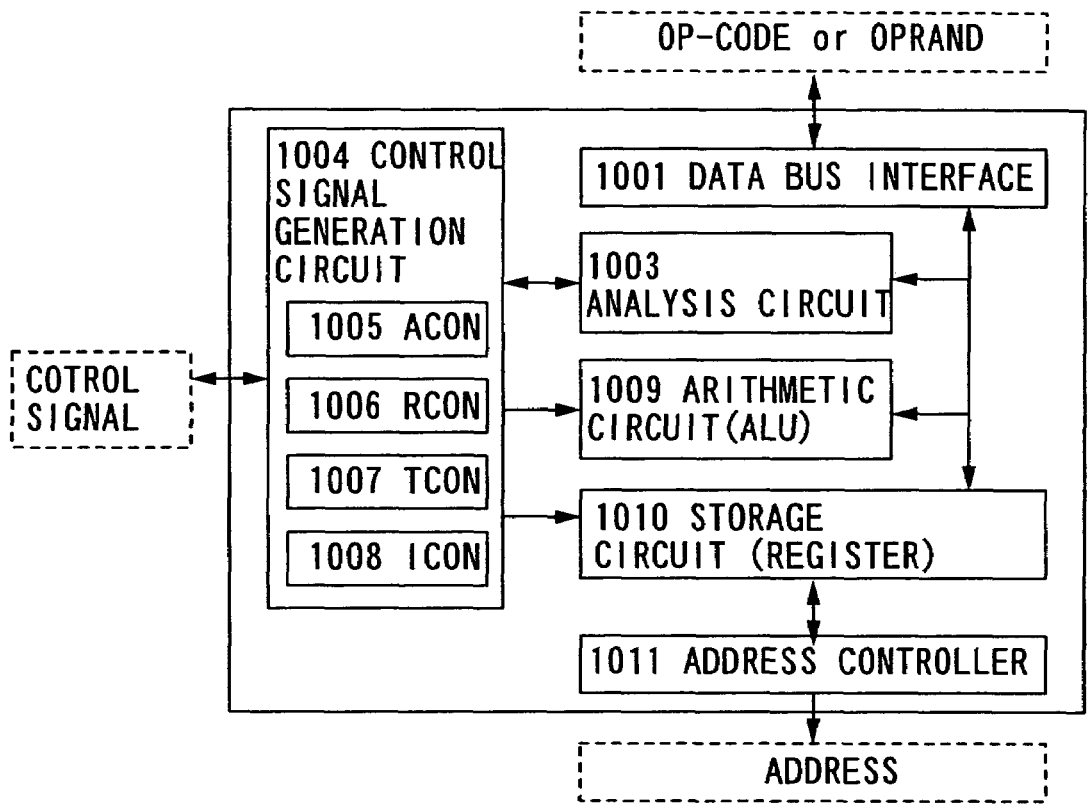
FIG. 19 is a block diagram showing a structure of the semiconductor device of the invention.

This embodiment mode is described with reference to FIG. 19 which is a block diagram showing a chip of a processor (a CPU or the like) which is a typical example of a semiconductor device of the invention.

Upon inputting an op-code to a data bus interface 1001, the code is decoded by an analysis circuit 1003 (also referred to as Instruction Decoder), and a signal is inputted to a control signal generation circuit 1004 (CPU Timing Control). Upon inputting the signal to the control signal generation circuit 1004, a control signal is outputted from the control signal generation circuit 1004 to an arithmetic circuit 1009 (ALU) and to a storage circuit 1010 (Register).

The control signal generation circuit 1004 comprises an ALU controller 1005 ACON) for controlling the ALU 1009, a circuit 1006 (RCON) for controlling the register 1010, a timing controller 1007 (TCON) for controlling timing, and an interruption controller 1008 (ICON) for controlling interruption.

Upon inputting an operand to the data bus interface 1001, the operand is outputted to the ALU 1009 and the Register

1010. Then, a process based on a control signal inputted from the control signal generation circuit 1004, for example, memory read cycle, memory write cycle, I/O read cycle, I/O write cycle, or the like, is carried out.

In addition, the Register 1010 comprises a general register, a stack pointer (SP), a program counter (PC), and the like.

Further, an address controller 1011 (hereinafter, ADRC) outputs 16-bit address.

The configuration of the processor described in this embodiment is one example of a processor included in a semiconductor chip according to the present invention, and does not limit the configuration according to the invention. Therefore a semiconductor chip according to the invention can be completed by using a known processor having other than configuration which is described in this embodiment.

This embodiment mode can be implemented in combined with each of Embodiment Modes 1 to 9.

Embodiment Mode 11

A case where the invention is applied to a system LSI which is an example of a semiconductor device is described with reference to FIG. 20.

Note that the system LSI is an LSI that is incorporated in a device having a specific application and constitutes a system for controlling the device and processing data. The application ranges widely, such as a portable phone, a PDA, a DSC, a television, a printer, a FAX, a game machine, a navigation system, a DVD player, and the like.

Figure 20:
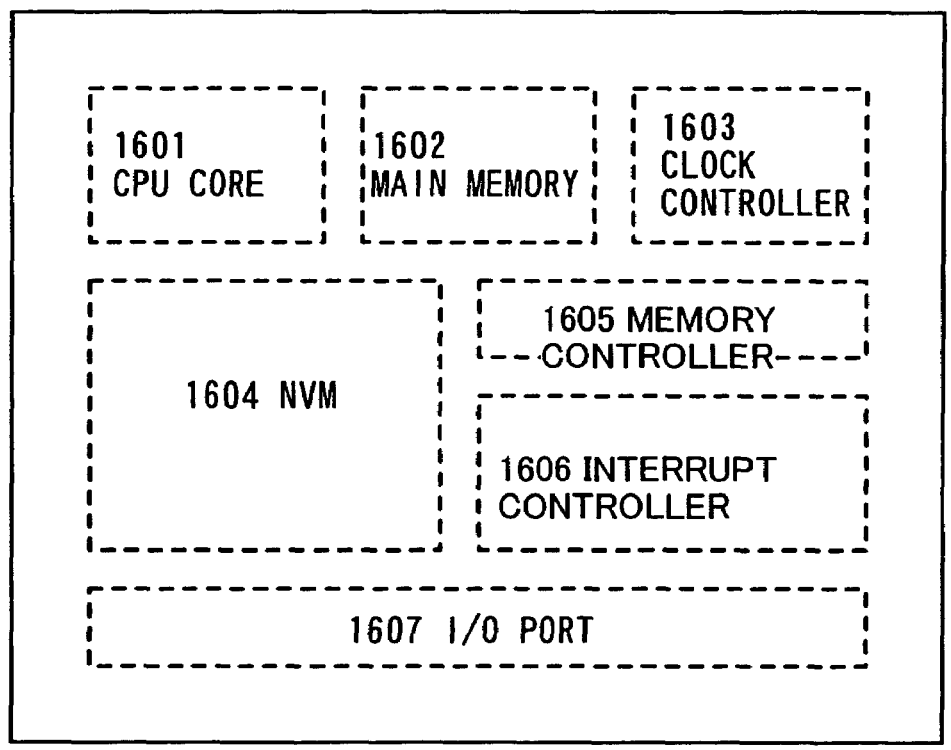
FIG. 20 is a block diagram showing a structure of the semiconductor device of the invention.

FIG. 20 shows an example of the system LSI. The system LSI typically includes a processor (CPU) core 1601, a non-volatile memory (NVM) 1604, a clock controller 1603, a main memory 1602, a memory controller 1605, an interrupt controller 1606, an I/O port 1607, and the like. It is needless to say that the system LSI shown in FIG. 20 is only a simplified example and a wide variety of circuit designs are laid out according to the application of an actual system LSI.

A memory transistor manufactured in Embodiment Mode 7 can be applied to the NVM 1604.

A transistor capable of high speed operation, that is manufactured according to the invention can be used as a transistor which includes the processor core 1601, the clock controller 1603, the main memory 1602, the memory controller 1605, the interrupt controller 1606, and the I/O port 1607. This enables various circuits to be manufactured over the same substrate.

This embodiment mode can be implemented in combination with each of Embodiment Modes 1 to 10.

Embodiment Mode 12

A semiconductor device of the invention is used for various purposes. For example, an ID chip which is one mode of the semiconductor device of the invention can be used by being mounted on bills, coins, securities, documents, bearer bonds, packing cases, books, a recording medium, personal belongings, vehicles, foods, clothes, health items, livingwares, medicals, electronics devices, or the like. In addition, a processor chip can also be used instead of an ID chip.

The bills and the coins mean currency in the market and include a thing that is used in the same way as a currency in a specific area (a cash voucher), memorial coins, and the like. The securities mean a check, a stock certificate, a promissory note, and the like and can be provided with an ID chip 20 (FIG. 21A). The certificates mean a driver's license, a resident card, and the like and can be provided with an ID chip 21 (FIG. 21B). The bearer bonds mean a stamp, a coupon for rice, various gift coupons, and the like. The packing cases mean a wrapping paper for a lunch box or the like, a plastic bottle, and the like and can be provided with an ID chip 23 (FIG. 21D). The books mean a book, a volume, and the like and can be provided with an ID chip 24 (FIG. 21E). The recording medium means DVD software, a video tape, and the like and can be provided with an ID chip 25 (FIG. 21F). The vehicles mean a wheeled vehicle such as a bicycle, a vessel, and the like and can be provided with an ID chip 27 (FIG. 21G). The personal items mean a bag, glasses, and the like and can be provided with an ID chip 26 (FIG. 21H). The foods mean eatables, beverages, and the like. The clothes mean wear, footwear, and the like. The health items mean medical devices, health appliances, and the like. The livingwares mean furniture, a lighting apparatus, and the like. The medicals mean medicines, agricultural chemicals, and the like. The electronic devices mean a liquid crystal display device, an EL display device, a television apparatus (a TV set and a thin television set), a cellular phone, and the like.

When an ID chip is mounted on the bills, the coins, the securities, the documents, the bearer bonds, and the like, counterfeiting thereof can be prevented. When an ID chip is mounted on the packing cases, the books, the recording medium, the personal belongings, the foods, the livingwares, the electronic devices, and the like, the efficiency of the inspection system, the rental system, and the like can be improved. When an ID chip is mounted on the vehicles, the health items, the medicals, and the like, counterfeiting and theft thereof can be prevented and the medicines can be prevented from being taken in the wrong manner. The ID chip may be attached to a surface of a product or mounted inside a product. For example, the ID chip may be mounted inside a page of a book, or mounted inside an organic resin of a package.

A processor chip can be used as a device for measuring evaluation on biological reaction of beings (a biological signal (a brain wave, electrocardiogram, electromyogram, blood pressure, or the like)), thus, it can be used in a medical field. FIG. 21C shows an example where a brain wave is measured by mounting a plurality of processor chips on a human body. The brain wave is measured by analyzing information obtained from a processor chip 22a, a processor chip 22b, and a processor chip 22c which are mounted on a human body. A physical health condition and a mental condition can be known by information obtained from the brain wave and the processor chip. Additionally, a processor chip is small size and lightweight; therefore, it can cut down on a burden of an examinee.

Figure 22A:
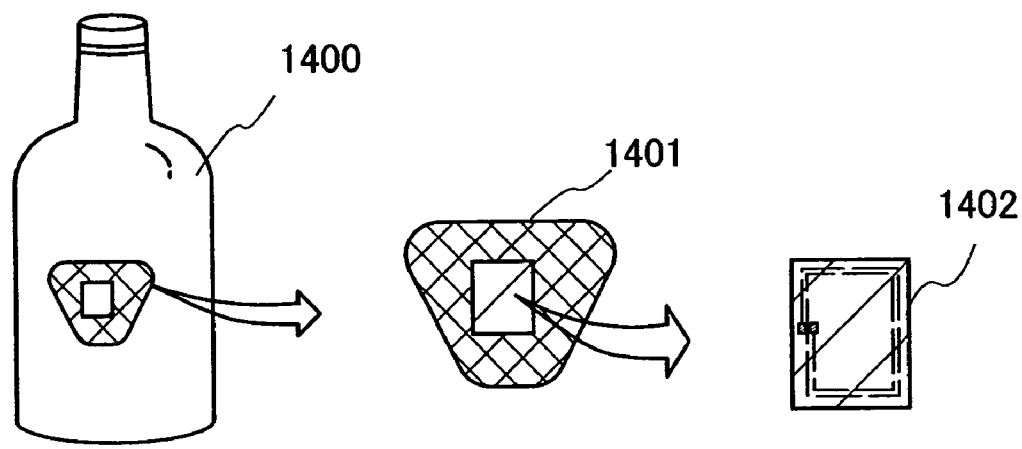
FIGS. 22A and 22B are diagrams showing applications using a semiconductor device of the invention.
Figure 22B:
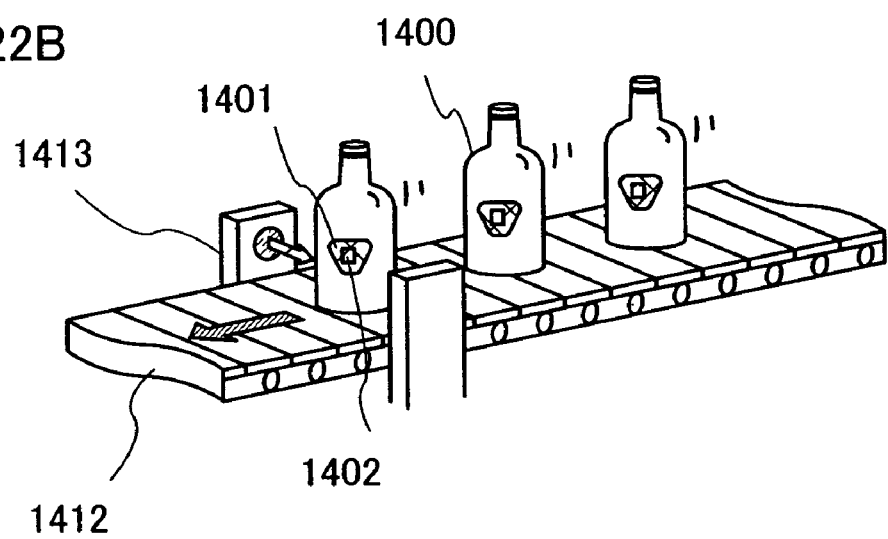

An example where the processor chip can be applied to material management and a distribution system is described with reference to FIGS. 22A and 22B. Here, a case where an ID chip (processor chip) is mounted on merchandise. As shown in FIG. 22A, an ID chip 1402 is mounted on a label 1401 of a beer bottle 1400.

The ID chip 1402 stores basic points such as date manufactured, a manufacturing place, and a material thereof. Such basic points are not required to be rewritten, thus, it is preferable to use a memory medium which is not capable of being rewritten, such as a mask ROM or a memory transistor in this invention to store them. In addition, the ID chip stores individual points such as a delivery address, delivery date and time, or the like of the beer bottle. For example, as shown in FIG. 22B, the delivery address and the delivery date and time can be stored, when a beer bottle 1400 passes through a writer device 1413 with a flow of a belt conveyor 1412. Such individual points may be stored in a memory medium which is capable of being rewritten and cleared, such as an EEROM.

In addition, a system may be preferably built so that when data on the merchandise purchased is sent from a shop to a physical distribution management center through network, a writer device, a personal computer for controlling the writer device, or the like calculates a delivery address and delivery date and time to store in the ID chip.

Note that a beer bottle is delivered per case. In view of this, it is possible that an ID chip is mounted per case or per a plurality of cases to store an individual point.

As for such merchandize as is set several delivery addresses, time required for inputting manually can be suppressed, thereby input miss due to the manual procedures can be reduced, by mounting an ID chip. In addition to this, manpower cost that is the most expensive in the field of the physical distribution management can be reduced. Accordingly, physical distribution management can be conducted with less miss at low cost by mounting an ID chip.

In addition, applied points such as grocery matched with a beer and a recipe using beer can be stored by a receiver. Then, advertisements of the grocery and the like can be carried out at the same time, which drives the consumers to buy. Such an applied point may be preferably stored in a memory medium which is capable of being rewritten and cleared, such as an EEROM. By mounting an ID chip as described above, the volume of information for being provided for a consumer can be increased, so that the consumer can purchase the merchandise without anxiety.

Embodiment 1

In this embodiment mode, an effect of the invention is described based on an experimental result.

An experiment about a current-voltage (I-V) characteristic of a thin film transistor manufactured according to the invention is conducted by a simulation. Thin film transistors which are measured are a total of ten-types which are an n-channel thin film transistor (Structure A), four types (Structures B, C, D, and E) of n-channel thin film transistors each having a low concentration p-type impurity region, a p-channel thin film transistor (Structure F), and four types (Structures G, H, I, and J) of p-channel thin film transistors each having a low concentration n-type impurity region. Each structure of the thin film transistors is illustrated in FIGS. 23B, 24B, 25B, and 26B.

Figure 23A:
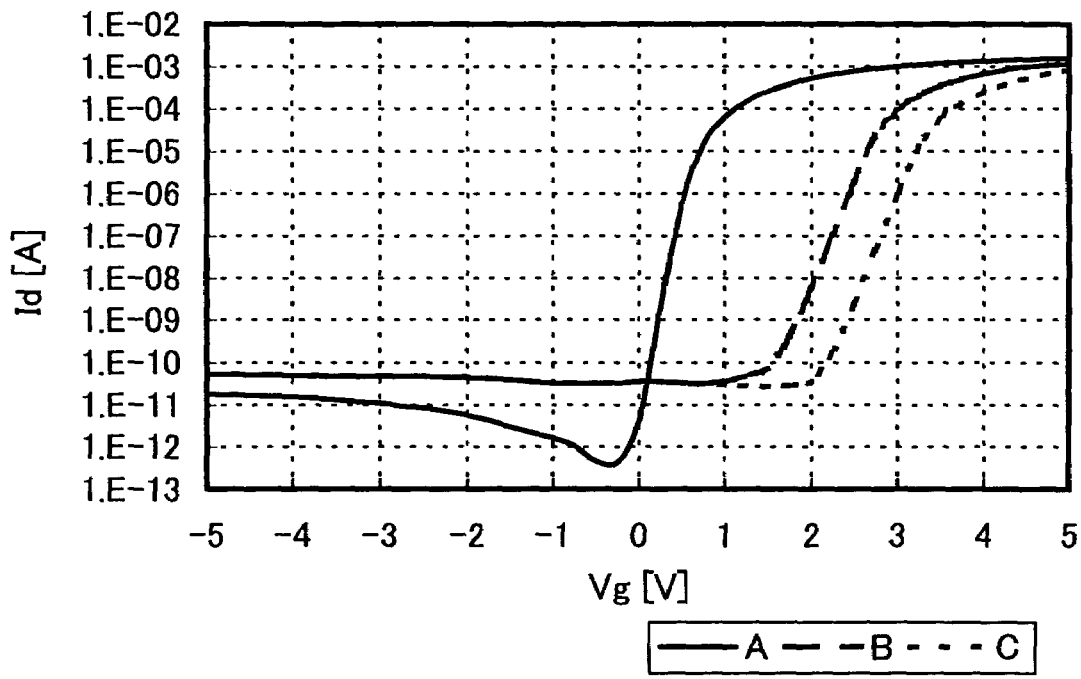
FIGS. 23A and 23B are model diagrams used for simulation and the result thereof.

A simulation result of a current-voltage (I-V) characteristic of the n-channel thin film transistor having the light doped p-type impurity region is explained with reference to FIGS. 23A to 24B. FIG. 23A shows an I-V characteristic of the n-channel thin film transistor in which the low concentration p-type impurity region (hereinafter, $p^-$) is provided to a standard n-channel thin film transistor and a drain side by assuming a model diagram of a thin film transistor illustrated in FIG. 23B.

Figure 23B:
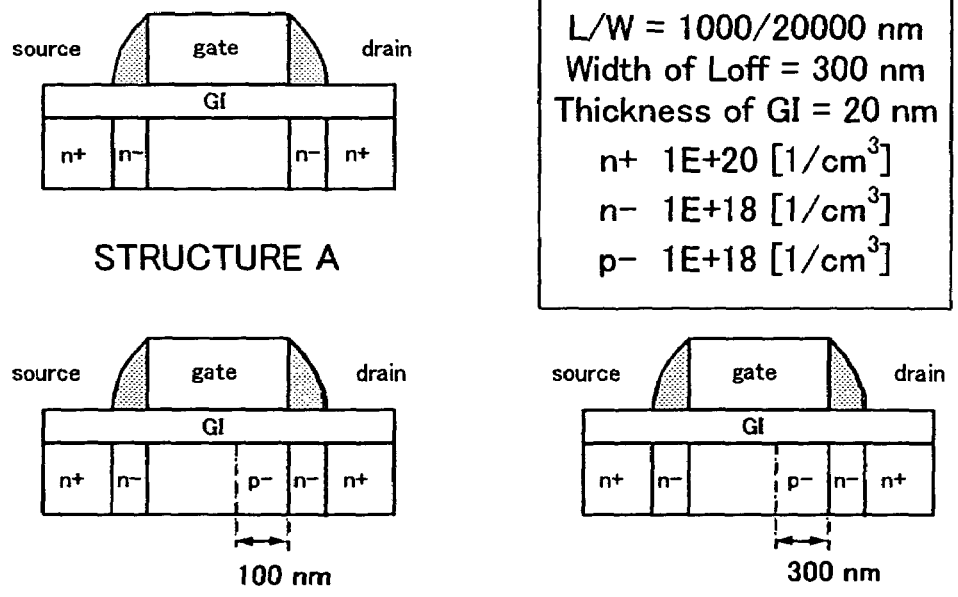

FIG. 23B shows structures of the thin film transistors. Structure A is a standard n-channel thin film transistor having Loff, Structure B is an n-channel thin film transistor having a $p^-$ with a width of 100 nm, and Structure C is an n-channel thin film transistor having a $p^-$ with a width of 300 nm. Simulation of an I-V characteristic is performed in the conditions in each thin film transistor, that is, L/W is 1000/20000 nm, an Loff region width is 300 nm, a gate insulating film thickness is 20 nm, impurity concentration in source and drain regions (denoted by $n^+$) is $1 \times 10^{20}$ cm$^{-3}$, and impurity concentration of $p^-$ is $1 \times 10^{18}$ cm$^{-3}$.

In FIG. 23A, a full line indicates the I-V characteristic of Structure A and a broken line indicates the I-V characteristics of Structure B and Structure C having $p^-$. Since Structure B and C have the $p^-$, it is found that a threshold value is shifted to a positive side. Further, it can be found that the threshold value is shifter as the width of the $p^-$ is increased (that is, the threshold value of Structure C is more shifted than that of Structure B).

FIGS. 24A and 24B show a simulation result of an I-V characteristic of a thin film transistor provided with a $p^-$ at its source side. FIG. 24B shows an I-V characteristic of an n-channel thin film transistor provided with a standard n-channel thin film transistor and a low concentration p-type impurity region (hereinafter, $p^-$) at its source side assuming a model diagram of a thin film transistor illustrated in FIG. 24B.

FIG. 24B shows structures of thin film transistors. In FIG. 24B, Structure A is the same as the standard n-channel thin film transistor illustrated in FIG. 23B, Structure D is an n-channel thin film transistor having a $p^-$ with a width of 100 nm, and Structure E is an n-channel thin film transistor having a $p^-$ with a width of 300 nm. The level of the L/W, the Loff region width, the gate insulating film thickness, and $n^+$ concentration are the same as those in FIGS. 23A and 23B.

In FIG. 24A, full line indicates the I-V characteristic of Structure A and broken line indicates the I-V characteristics of Structure D and Structure E having $p^-$. Since Structure D and E have the $p^-$, it is found that a threshold value is shifted to a positive side. Further, it can be found that the threshold value is shifter as the width of the $p^-$ is increased (that is, the threshold value of Structure E is more shifted than that of Structure E). Moreover, a cutoff current (Icut) is lowered than that of the standard n-channel thin film transistor. The cutoff current (Icut) is the value of a drain current Id at gate voltage Vg of 0 V in an Id-Vg characteristic.

As noted above, by using an n-channel thin film transistor having a p-type low concentration impurity region covered by a gate electrode and located between a channel formation region and either a source or a drain region, a threshold value is shifted and a cutoff current is reduced. Conventionally, a thin film transistor that is required to operate at high speed such as a processor, a DRAM, an image processing circuit, or an audio processing circuit has a short channel structure; however, there is a problem that a short channel length causes the reduction of a threshold value and the increase of a cutoff current. A thin film transistor according to this example can reduce a cutoff current despite of having a short channel structure. By using such the thin film transistor in all important positions in a semiconductor device, power consumption of the entire semiconductor device can be reduced. For instance, such the thin film transistor connected between a thin film transistor for logic and a power source to turn on in operating and turn off in nonoperating, power consumption in a standby state can be reduced. Alternatively, by forming a logic by the thin film transistor in a block that does not require high speed operation, power consumption of the entire semiconductor device can be reduced.

Figure 25A:
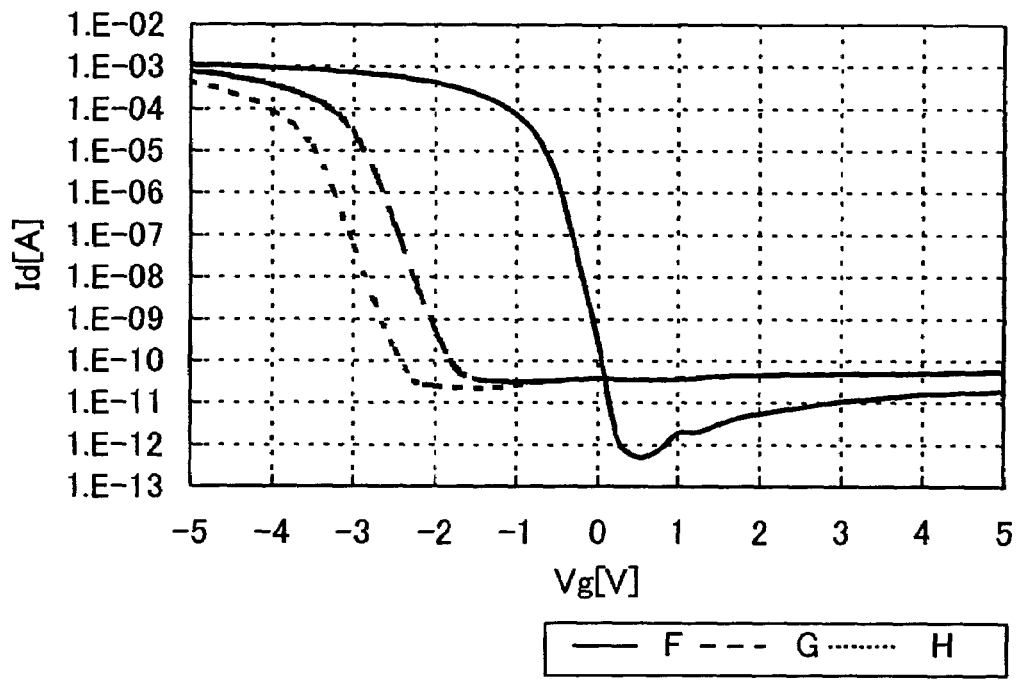
FIGS. 25A and 25B are model diagrams used for simulation and the result thereof.

A simulation result of a current-voltage (I-V) characteristic of the p-channel thin film transistor having the low concentration n-type impurity region is explained with reference to FIGS. 25A to 26B. FIG. 25A shows an I-V characteristic of the p-channel thin film transistor in which the low concentration n-type impurity region (hereinafter, $n^-$) is provided to a standard p-channel thin film transistor and a drain side by assuming a model diagram illustrated in FIG. 23B.

Figure 25B:
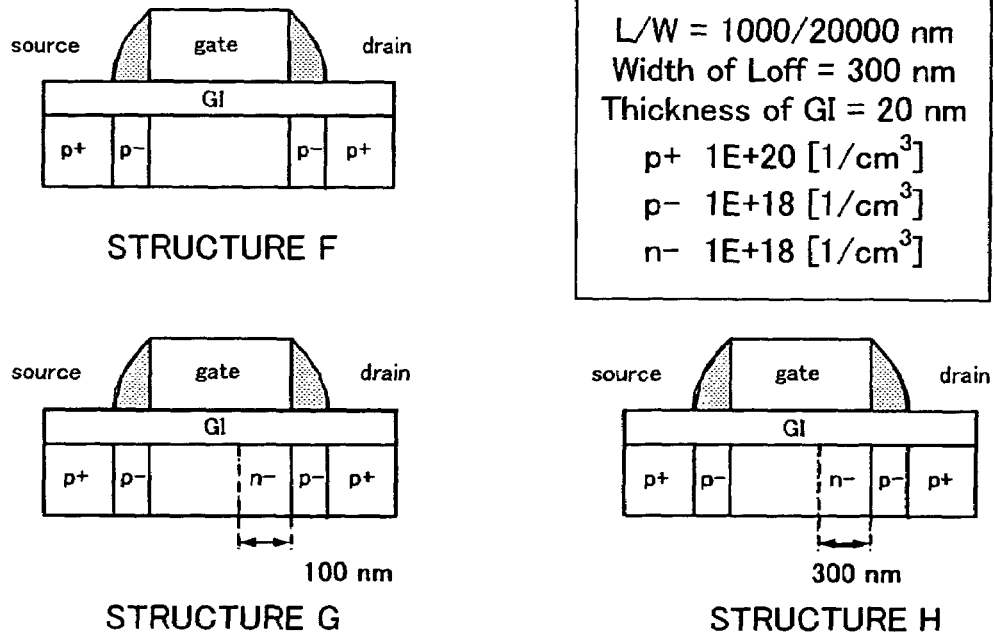

FIG. 25B shows structures of the thin film transistors. Structure F is a standard p-channel thin film transistor having Loff, Structure G is a p-channel thin film transistor having an $n^-$ with a width of 100 nm, and Structure H is a p-channel thin film transistor having an $n^-$ with a width of 300 nm. Simulation of an I-V characteristic is performed in the conditions in each thin film transistor, that is, L/W is 1000/20000 nm, an Loff region width is 300 nm, a gate insulating film thickness is 20 nm, impurity concentration in source and drain regions (denoted by $p^+$) is $1\times10^{20}$ cm$^{-3}$, and impurity concentration of $p^-$ is $1\times10^{18}$ cm$^{-3}$.

In FIG. 25A, a full line indicates the I-V characteristic of Structure F and a broken line indicates the I-V characteristics of Structure G and Structure H having $n^-$. Since Structure G and H have the $n^-$, it is found that a threshold value is shifted to a negative side. Further, it can be found that the threshold value is shifter as the width of the $n^-$ is increased (that is, the threshold value of Structure H is more shifted than that of Structure G).

Figure 26A:
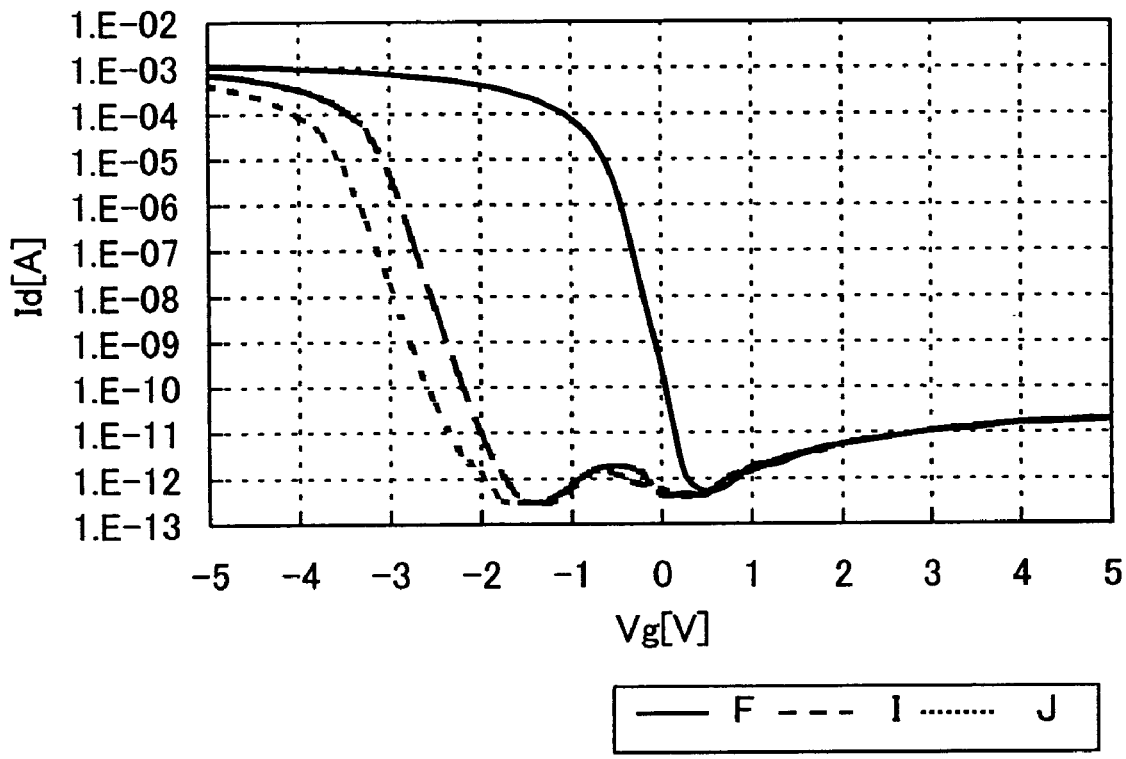
FIGS. 26A and 26B are model diagrams used for simulation and the result thereof.
Figure 26B:
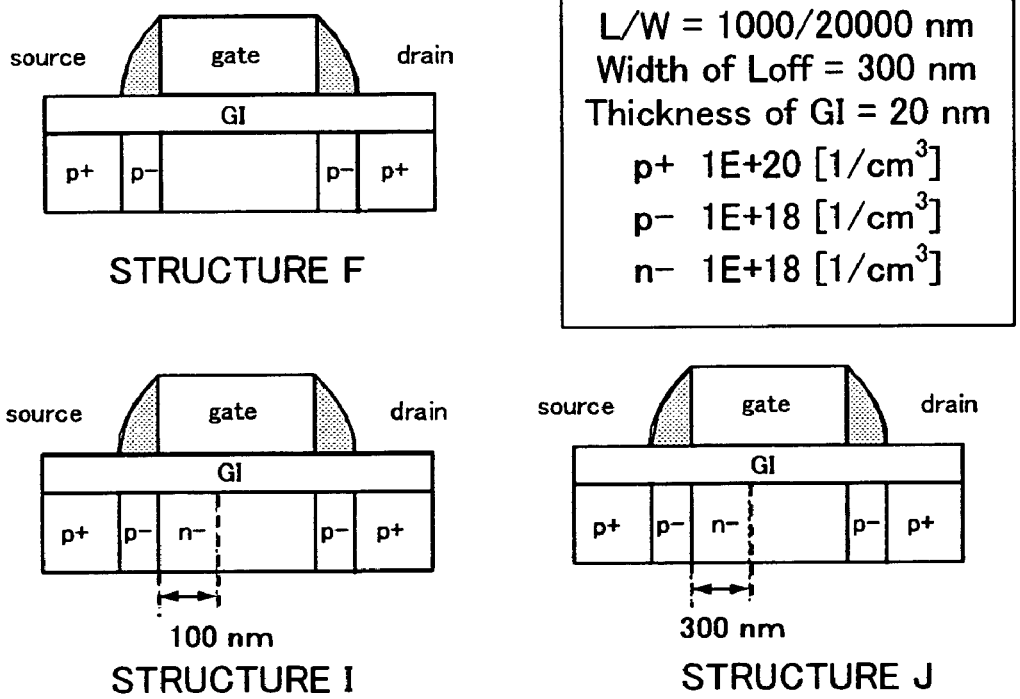

FIGS. 26A and 26B show a simulation result of an I-V characteristic of a p-channel thin film transistor provided with an $n^-$ at its source side. FIG. 26A shows an I-V characteristic of a p-channel thin film transistor provided with a standard p-channel thin film transistor and a low concentration n-type impurity region (hereinafter, $n^-$) at its source side assuming a model diagram illustrated in FIG. 26B.

FIG. 26B shows structures of thin film transistors. Structure F is the same as the standard p-channel thin film transistor illustrated in FIG. 26B, Structure I is a p-channel thin film transistor having an $n^-$ with a width of 100 nm, and Structure J is a p-channel thin film transistor having an $n^-$ with a width of 300 nm. The level of the L/W, the Loff region width, the gate insulating layer thickness, and $p^+$ concentration are the same as those in FIGS. 26A and 26B.

In FIG. 26A, a full line indicates the I-V characteristic of Structure F and a broken line indicates the I-V characteristics of Structure I and Structure J having $n^-$. Since Structure I and J have the $n^-$, it is found that a threshold value is shifted to a negative side. Further, it can be found that the threshold value is shifter as the width of the $n^-$ is increased (that is, the threshold value of Structure J is more shifted than that of Structure I). Moreover, a cutoff current (Icut) is lowered than that of the standard p-channel thin film transistor. That is, high speed operation and reducing power consumption are possible and the same as the n-channel thin film transistor.

What is claimed is:

1. A method of manufacturing a semiconductor device, comprising the steps of:
    forming an amorphous semiconductor film over an insulating surface;
    forming a crystalline semiconductor film by irradiating the amorphous semiconductor film with laser light;
    forming a semiconductor layer by patterning the crystalline semiconductor film;
    forming a gate insulating layer over the semiconductor layer;
    forming a first conductive layer over the gate insulating layer;
    forming a second conductive layer over the first conductive layer;
    etching the second conductive layer to form a first gate layer;
    forming first impurity regions by doping the semiconductor layer from one direction obliquely to the surface thereof with a first impurity element for imparting first one conductive type, using the first gate layer as a mask, wherein a portion of one of the first impurity regions is covered with the first gate layer;
    forming a third impurity region and a fourth impurity region by doping the semiconductor layer perpendicularly to the surface thereof with a second impurity element for imparting second one conductive type, using the first gate layer as a mask, thereby defining a channel forming region and a second impurity region between the third and fourth impurity regions, wherein the second impurity region is the portion of the one of the first impurity regions covered with the first gate layer and wherein the third and fourth impurity regions and the first impurity regions are partially overlapped;
    forming an insulating layer on side surfaces of the first gate layer over the first conductive layer;
    etching the first conductive layer to form a second gate layer using the insulating layer and the first gate layer as a mask; and
    forming source and drain regions in the third and fourth impurity regions, respectively, by doping the semiconductor layer perpendicularly to the surface thereof with a third impurity element for imparting the second one conductive type, using the first and second gate layers and the insulating layer as a mask, thereby defining fifth and sixth impurity regions in the third and fourth impurity regions, respectively, wherein the fifth and sixth impurity regions are adjacent to the source and drain regions and covered with the insulating layer and the second gate layer,
    wherein each concentration of the second and third impurity elements for imparting the second one conductive type in the fifth impurity region and the sixth impurity region is lower than that of the second and third impurity elements for imparting the second one conductive type in the source and drain regions,
    wherein the second impurity region is formed between the channel formation region and the fifth impurity region and covered with the first and second gate layers, and
    wherein the sixth impurity region is formed in contact with the channel formation region.

2. The method according to claim 1, wherein the first impurity element is an impurity element for imparting p-type, and
    wherein the second and third impurity elements are impurity elements for imparting n-type.

3. The method according to claim 1, wherein the first impurity element is an impurity element for imparting n-type, and
    wherein the second and third impurity elements are impurity elements for imparting p-type.

4. The method according to claim 1, further comprising the steps of:
    forming an interlayer insulating layer over the semiconductor layer, the gate insulating layer, and the first and second gate layers;
    forming opening portions reaching the source and drain regions in the interlayer insulating layer and the gate insulating layer; and
    forming source and drain electrode layers being in contact with the source and drain regions in the opening portions.

5. The method according to claim 1, wherein the laser light is continuous-wave laser light.

6. The method according to claim 1, wherein the laser light is pulsed laser light; and a pulse repetition rate of the laser light is 0.5 MHz or more.

7. The method according to claim 1, wherein a width of the second impurity region is 5 nm to 200 nm and a width of each of the fifth and sixth impurity regions is 10 nm to 200 nm.

8. A method of manufacturing a semiconductor device, comprising the steps of:
    forming an amorphous semiconductor film over an insulating surface;

forming a crystalline semiconductor film by irradiating the amorphous semiconductor film with laser light;

forming a semiconductor layer by patterning the crystalline semiconductor film;

forming a gate insulating layer over the semiconductor layer;

forming a first conductive layer over the gate insulating layer;

forming a second conductive layer over the first conductive layer;

etching the second conductive layer to form a first gate layer;

forming first impurity regions by doping the semiconductor layer from one direction obliquely to the surface thereof with a first impurity element for imparting first one conductive type, using the first gate layer as a mask, wherein a portion of one of the first impurity regions is covered with the first gate layer;

forming a third impurity region and a fourth impurity region by doping the semiconductor layer perpendicularly to the surface thereof with a second impurity element for imparting second one conductive type, using the first gate layer as a mask, thereby defining a channel forming region and a second impurity region between the third and fourth impurity regions, wherein the second impurity region is the portion of the one of the first impurity regions covered with the first gate layer and wherein the third and fourth impurity regions and the first impurity regions are partially overlapped;

forming an insulating layer on side surfaces of the first gate layer over the first conductive layer;

etching the first conductive layer to form a second gate layer using the insulating layer and the first gate layer as a mask; and forming source and drain regions in the third and fourth impurity regions, respectively, by doping the semiconductor layer perpendicularly to the surface thereof with a third impurity element for imparting the second one conductive type, using the first and second gate layers and the insulating layer as a mask, thereby defining fifth and sixth impurity regions in the third and fourth impurity regions, respectively, wherein the fifth and sixth impurity regions are adjacent to the source and drain regions and covered with the insulating layer and the second gate layer, wherein each concentration of the second and third impurity elements for imparting the second one conductive type in the fifth impurity region and the sixth impurity region is lower than that of the second and third impurity elements for imparting the second one conductive type in the source and drain regions, wherein the second impurity region is formed between the channel formation region and the sixth impurity region and covered with the first and second gate layers, and wherein the fifth impurity region is formed in contact with the channel formation region.

9. The method according to claim 8, wherein the first impurity element is an impurity element for imparting p-type, and wherein the second and third impurity elements are impurity elements for imparting n-type.

10. The method according to claim 8, wherein the first impurity element is an impurity element for imparting n-type, and wherein the second and third impurity elements are impurity elements for imparting p-type.

11. The method according to claim 8, further comprising the steps of:

forming an interlayer insulating layer over the semiconductor layer, the gate insulating layer, and the first and second gate layers;

forming opening portions reaching the source and drain regions in the interlayer insulating layer and the gate insulating layer; and forming source and drain electrode layers being in contact with the source and drain regions in the opening portions.

12. The method according to claim 8, wherein the laser light is continuous-wave laser light.

13. The method according to claim 8, wherein the laser light is pulsed laser light; and a pulse repetition rate of the laser light is 0.5 MHz or more.

14. The method according to claim 8, wherein a width of the second impurity region is 5 nm to 200 nm and a width of each of the fifth and sixth impurity regions is 10 nm to 200 nm.

15. A method of manufacturing a semiconductor device, comprising the steps of:

forming a semiconductor layer over a substrate having an insulating surface;

forming a gate insulating layer over the semiconductor layer;

forming a first conductive layer over the gate insulating layer;

forming a second conductive layer over the first conductive layer;

etching the second conductive layer to form a first gate layer;

forming first impurity regions by doping the semiconductor layer from one direction obliquely to the surface thereof with a first impurity element for imparting first one conductive type, using the first gate layer as a mask, wherein a portion of one of the first impurity regions is covered with the first gate layer;

forming a third impurity region and a fourth impurity region by doping the semiconductor layer perpendicularly to the surface thereof with a second impurity element for imparting second one conductive type, using the first gate layer as a mask, thereby defining a channel forming region and a second impurity region between the third and fourth impurity regions, wherein the second impurity region is the portion of the one of the first impurity regions covered with the first gate layer and wherein the third and fourth impurity regions and the first impurity regions are partially overlapped;

forming an insulating layer on side surfaces of the first gate layer over the first conductive layer;

etching the first conductive layer to form a second gate layer using the insulating layer and the first gate layer as a mask; and forming source and drain regions in the third and fourth impurity regions, respectively, by doping the semiconductor layer perpendicularly to the surface thereof with a third impurity element for imparting the second one conductive type, using the first and second gate layers and the insulating layer as a mask, thereby defining fifth and sixth impurity regions in the third and fourth impurity regions, respectively, wherein the fifth and sixth impurity regions are adjacent to the source and drain regions and covered with the insulating layer and the second gate layer;

wherein each concentration of the second and third impurity elements for imparting the second one conductive type in the fifth impurity region and the sixth impurity region is lower than that of the second and third impurity elements for imparting the second one conductive type in the source and drain regions;

wherein the second impurity region is formed between the channel formation region and one of the fifth and sixth impurity regions and covered with the first and second gate layers; and wherein the other one of the fifth and sixth impurity regions is formed in contact with the channel formation region.

16. The method according to claim 15, wherein the first impurity element for imparting the first one conductive type is an impurity element for imparting p-type, and wherein each of the second and third impurity elements for imparting the second one conductive type is an impurity element for imparting n-type.

17. The method according to claim 15, wherein the impurity element for imparting the first one conductive type is an impurity element for imparting n-type, and wherein each of the second and third impurity elements for imparting the second one conductive type is an impurity element for imparting p-type.

18. The method according to claim 15, further comprising the steps of:

forming an interlayer insulating layer over the semiconductor layer, the gate insulating layer, and the first and second gate layers;

forming opening portions reaching the source and drain regions in the interlayer insulating layer and the gate insulating layer; and forming source and drain electrode layers being in contact with the source and drain regions in the opening portions.

19. The method according to claim 15, further comprising a step of irradiating the semiconductor layer with continuous-wave laser light.

20. The method according to claim 15, further comprising a step of irradiating the semiconductor layer with pulsed laser light; wherein a pulse repetition rate of the laser light is 0.5 MHz or more.

21. The method according to claim 15, wherein the semiconductor layer comprises a semi-amorphous semiconductor.

22. The method according to claim 15, wherein a width of the second impurity region is 5 nm to 200 nm and a width of each of the fifth and sixth impurity regions is 10 nm to 200 nm.

* * * * *